(12) United States Patent
Ikemoto et al.

(10) Patent No.: US 10,158,157 B2
(45) Date of Patent: Dec. 18, 2018

(54) HIGH-FREQUENCY SIGNAL LINE AND MANUFACTURING METHOD THEREOF

(71) Applicant: Murata Manufacturing Co., Ltd., Nagaokakyo-shi, Kyoto-fu (JP)

(72) Inventors: Nobuo Ikemoto, Nagaokakyo (JP); Yuki Wakabayashi, Nagaokakyo (JP); Shigeru Tago, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/364,899

(22) Filed: Nov. 30, 2016

(65) Prior Publication Data
US 2017/0084976 A1   Mar. 23, 2017

Related U.S. Application Data

(60) Division of application No. 14/537,059, filed on Nov. 10, 2014, now Pat. No. 9,774,070, which is a
(Continued)

(30) Foreign Application Priority Data

Oct. 31, 2012   (JP) ................................ 2012-240091

(51) Int. Cl.
*H01P 3/08* (2006.01)
*H05K 1/02* (2006.01)
(Continued)

(52) U.S. Cl.
CPC ................ *H01P 3/082* (2013.01); *H01P 3/08* (2013.01); *H01P 11/003* (2013.01); *H01R 12/62* (2013.01);
(Continued)

(58) Field of Classification Search
CPC .......... H01P 3/08; H01P 3/082; H01P 11/003; H01R 12/62; H05K 1/115
(Continued)

(56) References Cited

U.S. PATENT DOCUMENTS

| | | | | |
|---|---|---|---|---|
| 2008/0073796 A1* | 3/2008 | Harvey | ............ | H01L 23/49827 257/774 |
| 2009/0015345 A1* | 1/2009 | Kushta | ................ | H05K 1/0251 333/34 |
| 2012/0235764 A1* | 9/2012 | Kang | ...................... | H01P 3/006 333/26 |

OTHER PUBLICATIONS

Ikemoto et al., "High-Frequency Signal Line and Manufacturing Method Thereof", U.S. Appl. No. 14/537,059, filed Nov. 10, 2014.

\* cited by examiner

*Primary Examiner* — Stephen E Jones
*Assistant Examiner* — Scott S Outten
(74) *Attorney, Agent, or Firm* — Keating & Bennett, LLP

(57) ABSTRACT

In a high frequency signal line, a first signal line extends along a first dielectric element assembly, a first reference ground conductor extends along the first signal line, a second signal line is provided in or on the second dielectric element assembly and extends along the second dielectric element assembly, a second reference ground conductor is provided in or on the second dielectric element assembly and extends along the second signal line. A portion of a bottom surface at an end of the first dielectric element assembly and a portion of the top surface at an end of the second dielectric element assembly are joined together such that a joint portion of the first and second dielectric element assemblies includes a corner. The second signal line and the first signal line are electrically coupled together. The first and second reference ground conductors are electrically coupled together.

14 Claims, 39 Drawing Sheets

Related U.S. Application Data continuation of application No. PCT/JP2013/073639, filed on Sep. 3, 2013, and a continuation of application No. PCT/JP2013/070723, filed on Jul. 31, 2013.

(51) Int. Cl.

| | | |
|---|---|---|
| *H05K 1/11* | (2006.01) | |
| *H05K 3/36* | (2006.01) | |
| *H05K 3/46* | (2006.01) | |
| *H01P 11/00* | (2006.01) | |
| *H01R 12/62* | (2011.01) | |
| *H05K 1/14* | (2006.01) | |
| *H05K 3/00* | (2006.01) | |
| H01R 103/00 | (2006.01) | |
| H01R 24/50 | (2011.01) | |

(52) U.S. Cl.
CPC ........... *H05K 1/024* (2013.01); *H05K 1/0242* (2013.01); *H05K 1/0253* (2013.01); *H05K 1/115* (2013.01); *H05K 1/118* (2013.01); *H05K 1/147* (2013.01); *H05K 3/0052* (2013.01); *H05K 3/363* (2013.01); *H05K 3/4623* (2013.01); H01R 24/50 (2013.01); H01R 2103/00 (2013.01); H05K 1/0219 (2013.01); H05K 1/0225 (2013.01); H05K 3/4632 (2013.01); H05K 2201/07 (2013.01); H05K 2201/096 (2013.01); H05K 2201/097 (2013.01); H05K 2201/0919 (2013.01); H05K 2201/09154 (2013.01); H05K 2201/09481 (2013.01); H05K 2201/09527 (2013.01); H05K 2201/09618 (2013.01); H05K 2201/09845 (2013.01); H05K 2201/10037 (2013.01); H05K 2201/10204 (2013.01); Y10T 29/49016 (2015.01)

(58) Field of Classification Search
USPC ........................................................ 333/238
See application file for complete search history.

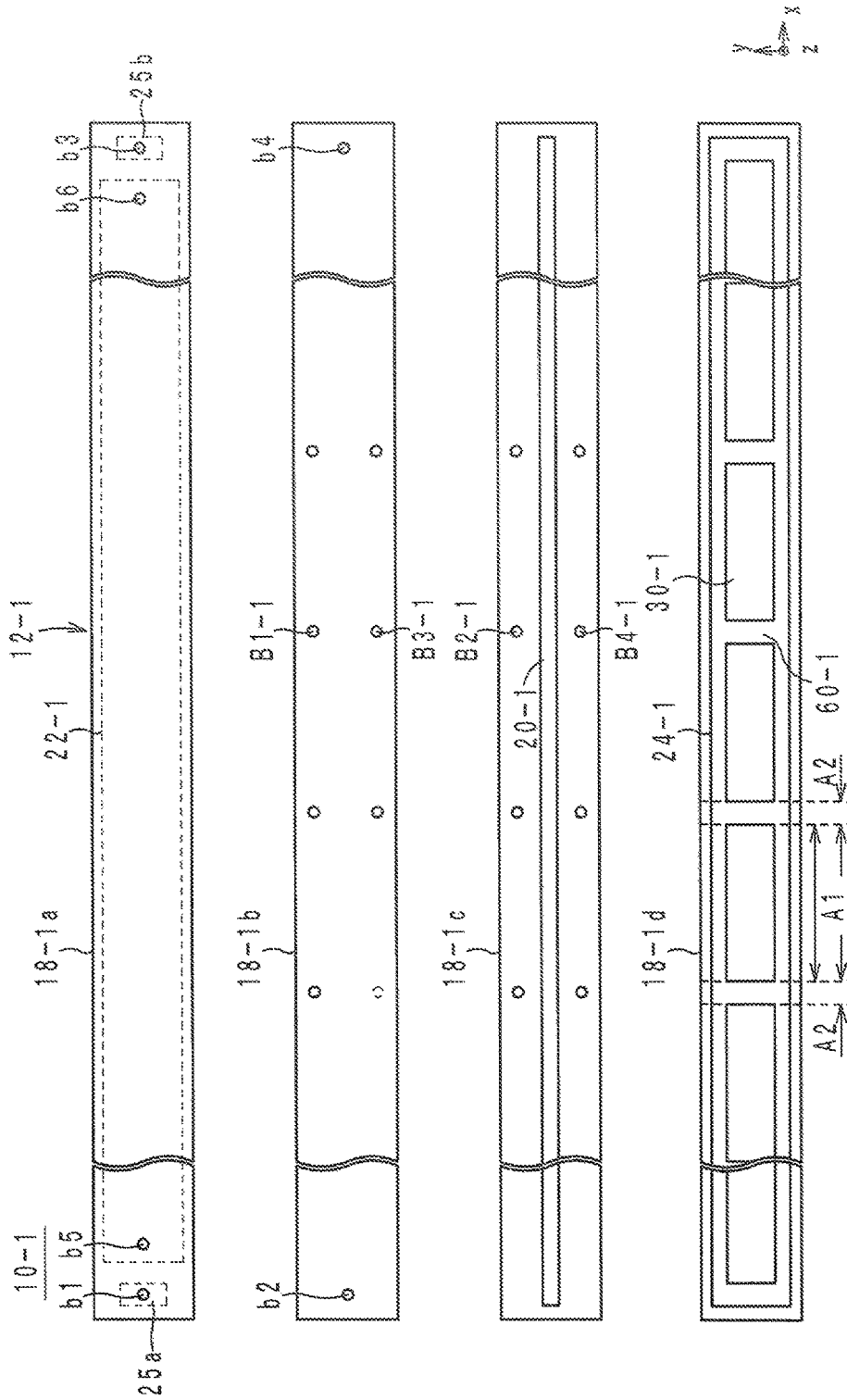

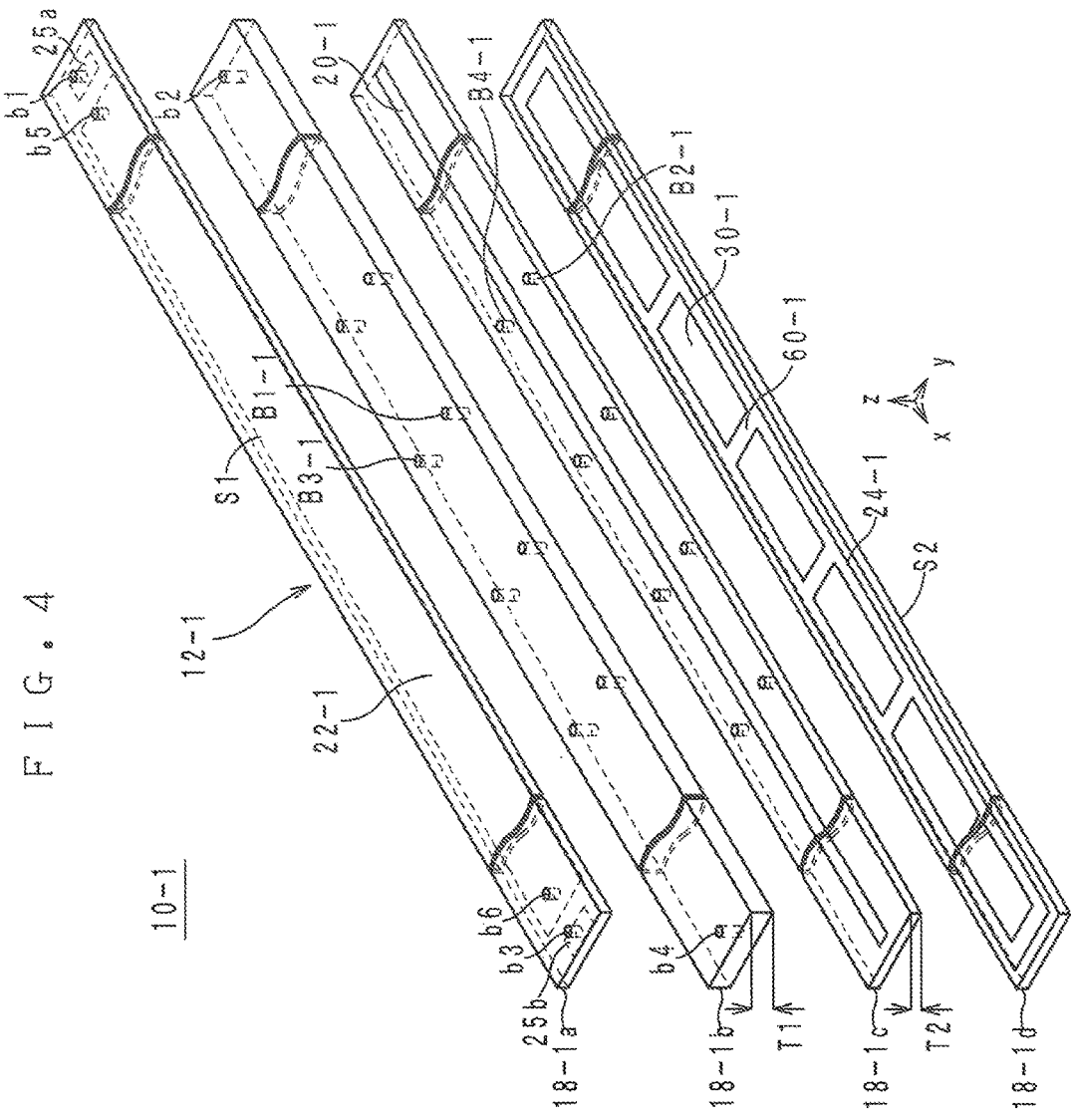

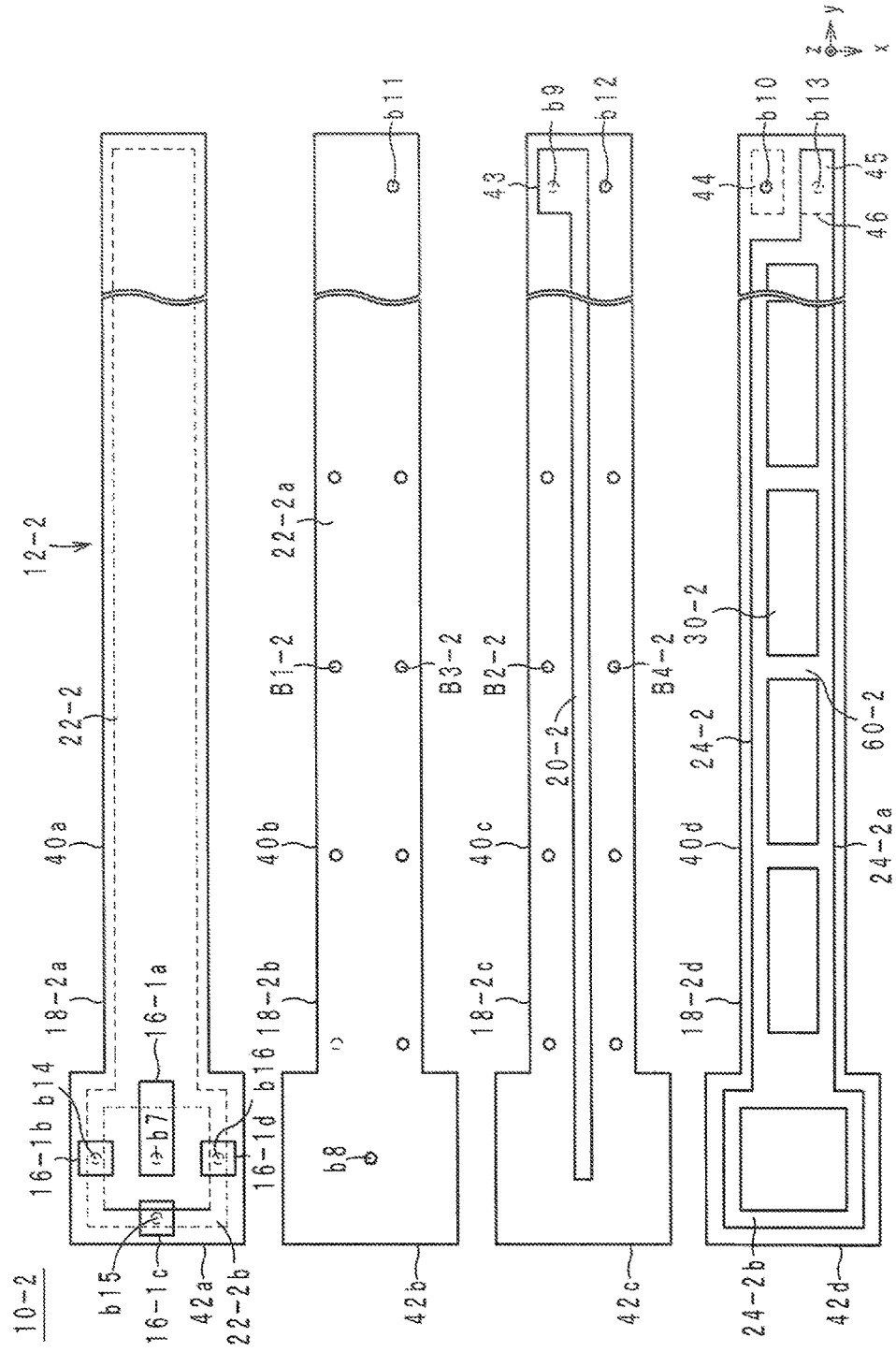

F I G . 1 0
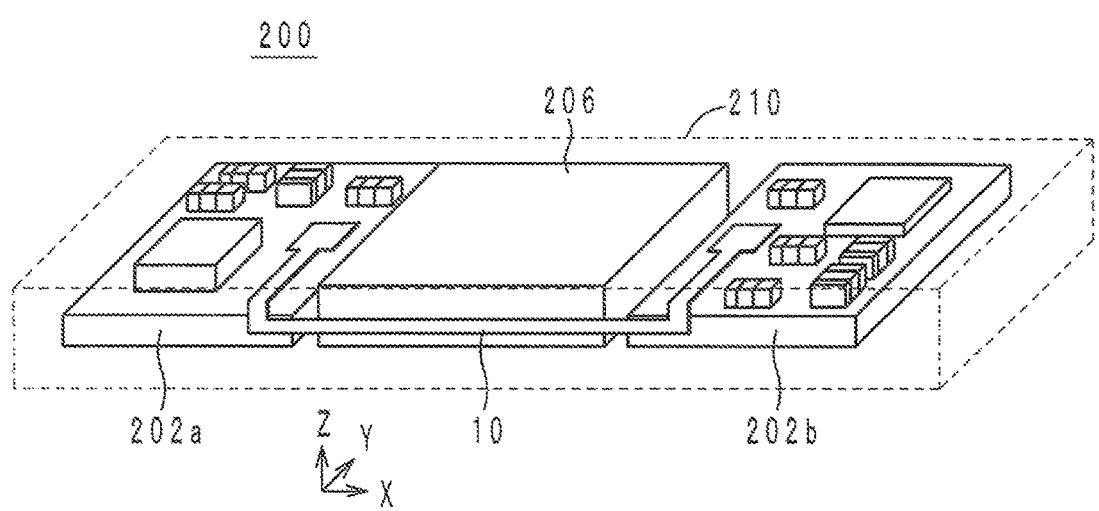

F I G . 1 4
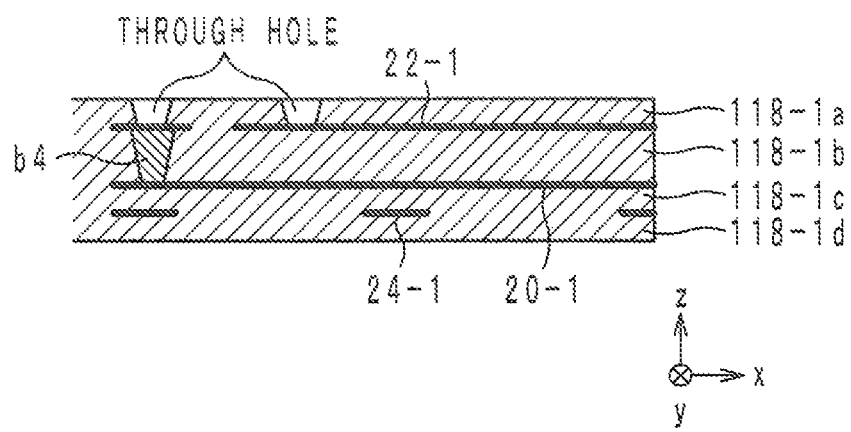
F I G . 1 5
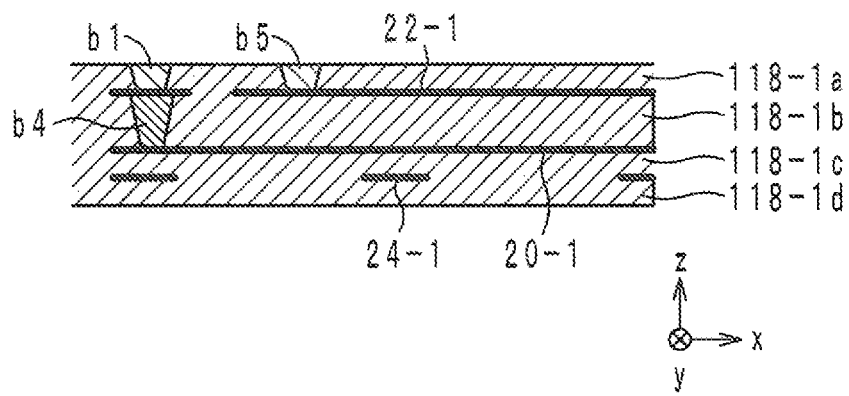

F I G . 1 8
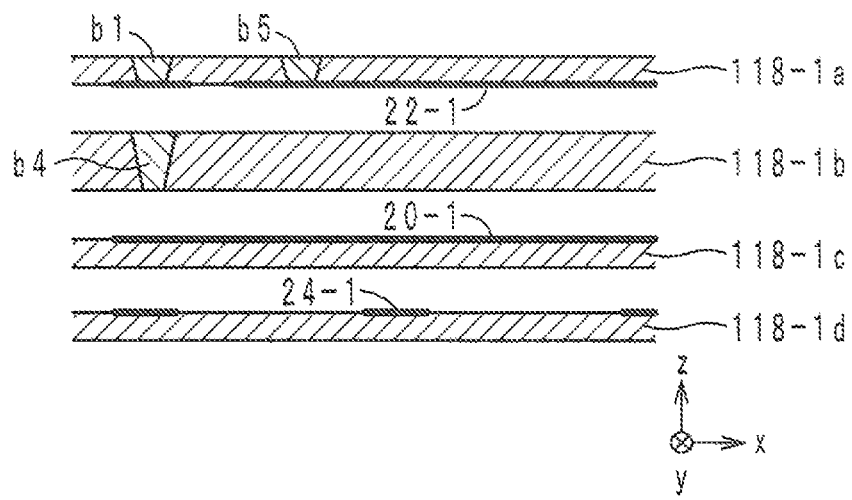
F I G . 1 9
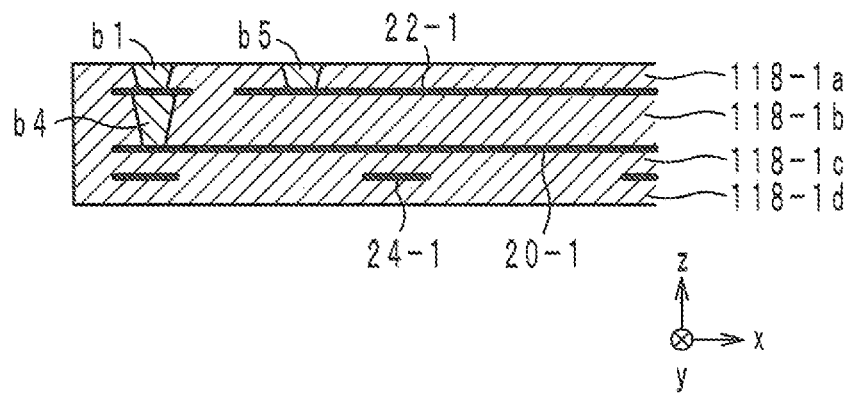

F I G . 2 0
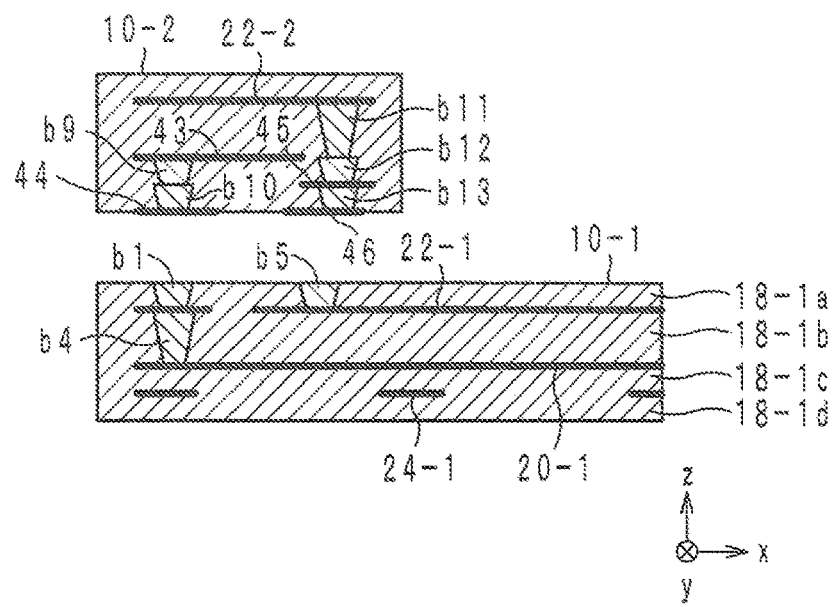
F I G . 2 1
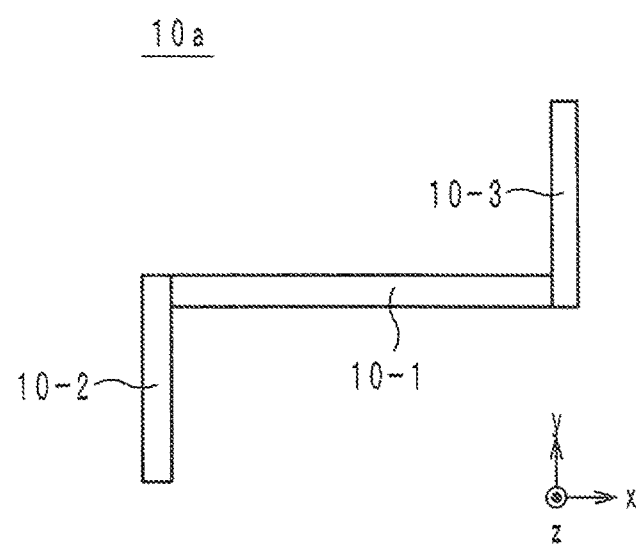

F I G . 2 2
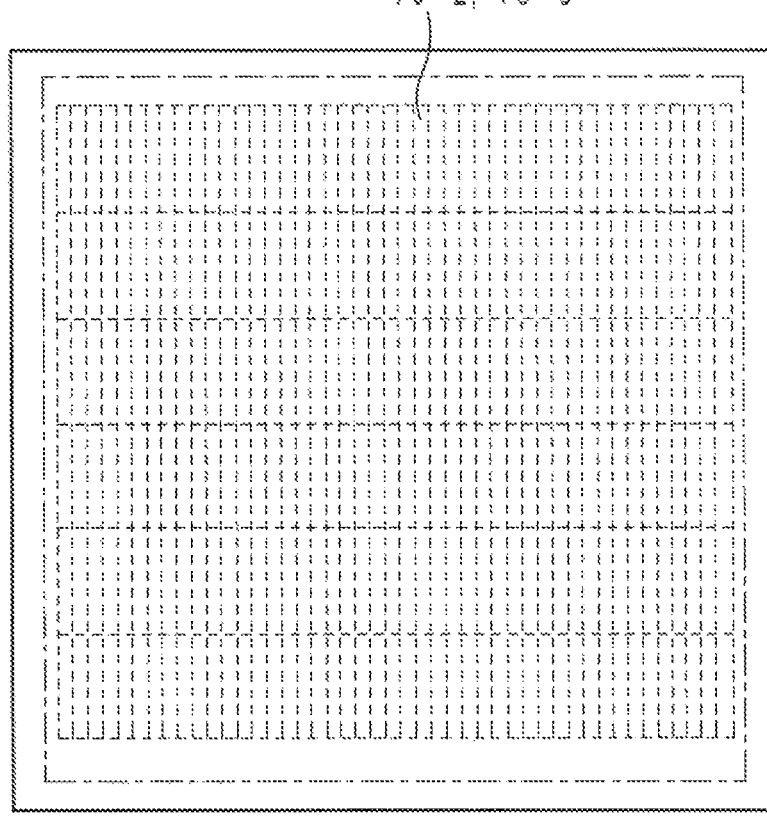

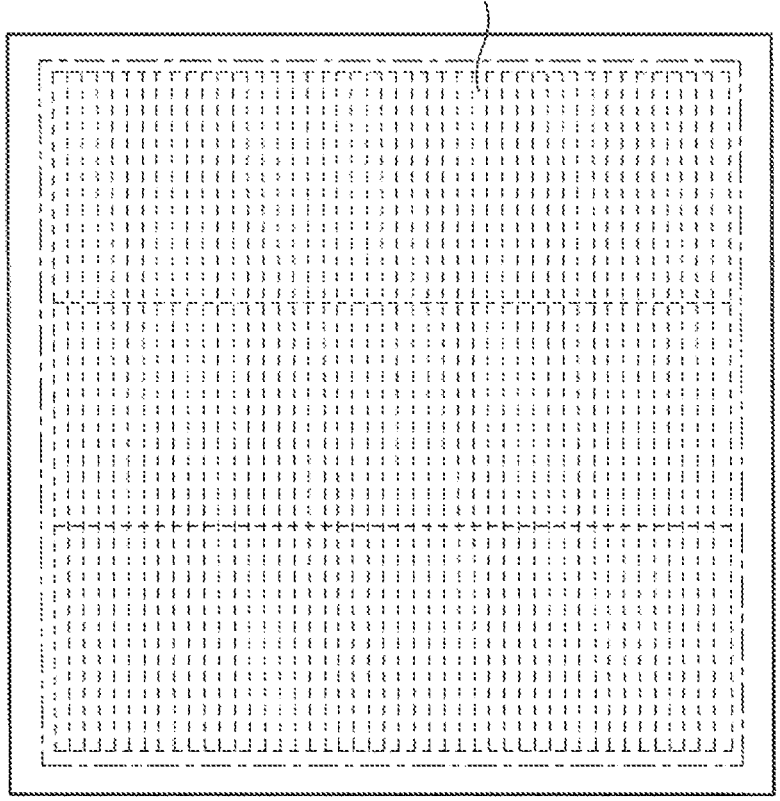

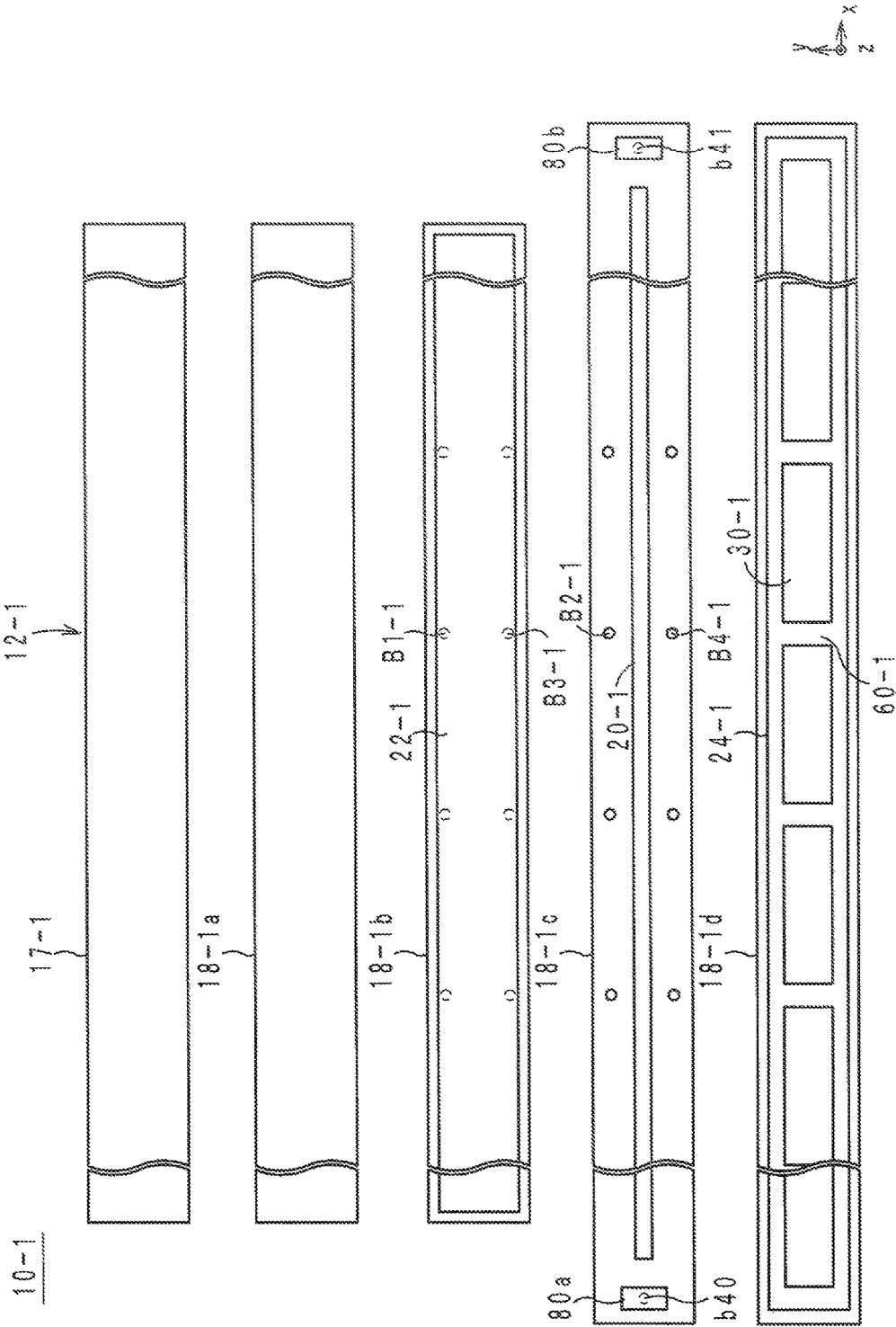

F I G . 3 3 B
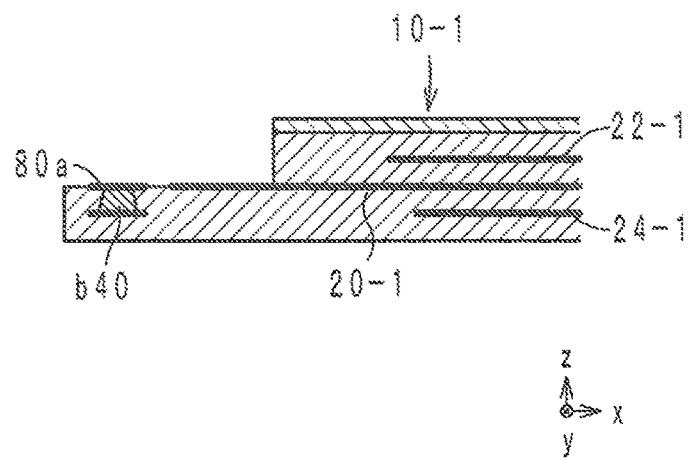
F I G . 3 4
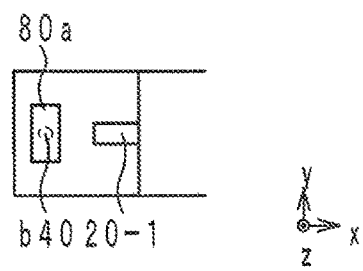

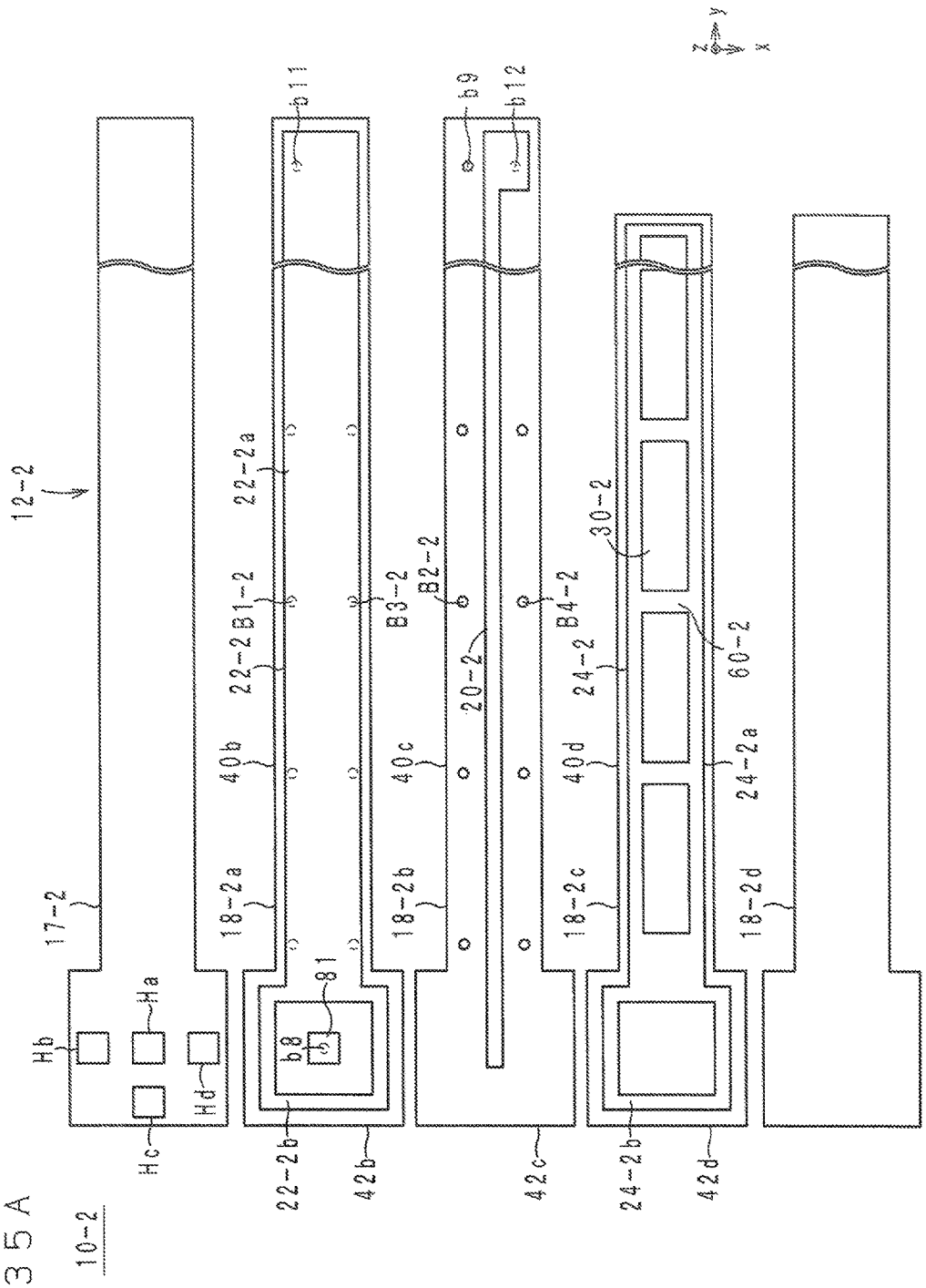

F I G . 3 7
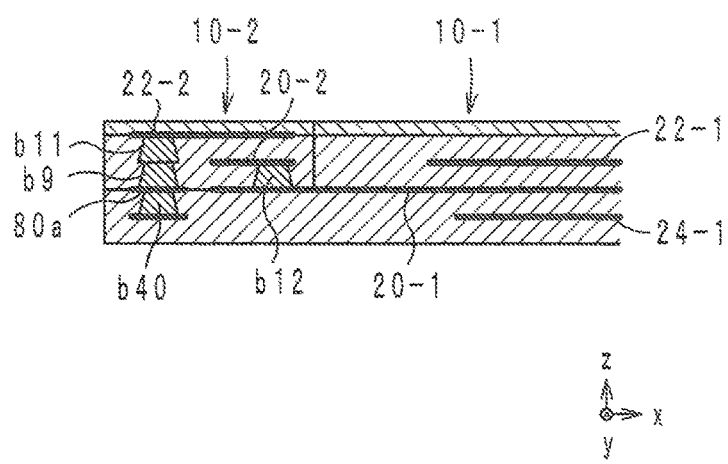
F I G . 3 8
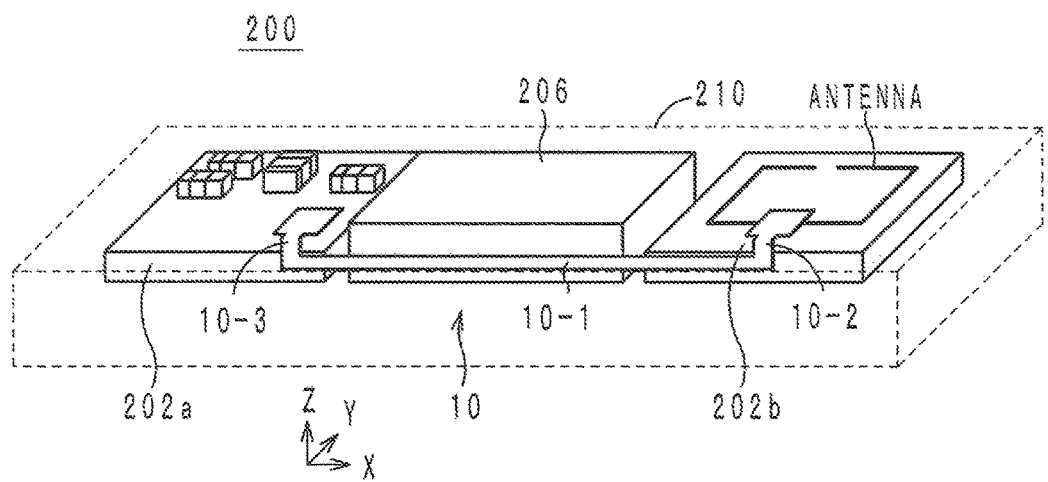

F I G. 4 2
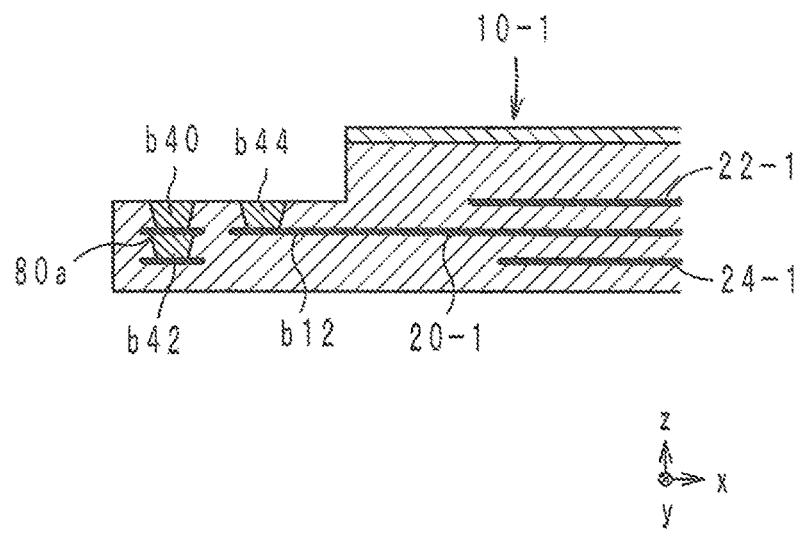
F I G. 4 3
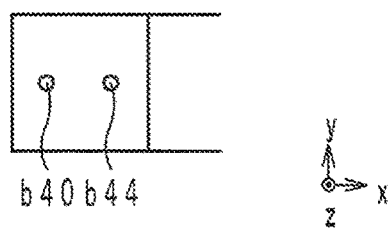

HIGH-FREQUENCY SIGNAL LINE AND MANUFACTURING METHOD THEREOF

This application is based on Japanese Patent Application No. 2012-240091 filed on Oct. 31, 2012, International Application No. PCT/JP2013/070723 filed on Jul. 31, 2013, and International Application No. PCT/JP2013/073639 filed on Sep. 3, 2013, the entire contents of each of which is incorporated herein by reference.

BACKGROUND OF THE INVENTION

1. Field of the Invention

The present invention relates to high-frequency signal lines and manufacturing methods thereof, more particularly to high-frequency signal lines preferably for use in transmission of high-frequency signals and manufacturing methods thereof.

2. Description of the Related Art

One known example of an invention relating to the conventional high-frequency signal lines is a high-frequency signal line disclosed in Japanese Patent Laid-Open Publication No. 2011-071403. This signal line includes a main body, a signal line, and two ground conductors. The main body is formed by laminating a plurality of insulating sheets which are made of a flexible material and linearly extending in a predetermined direction. The signal line is a linear conductor provided on the insulating sheets. The two ground conductors are provided on the insulating sheets. The signal line is provided between the two ground conductors in terms of the direction of the lamination. With this arrangement, the signal line and the two ground conductors form a stripline structure. The high-frequency signal line is used for, for example, connection of two circuit boards included in an electronic device.

In manufacturing the above-described signal line, a signal line and two ground conductors are formed on a plurality of large-sized mother insulating sheets, and the plurality of mother insulating sheets are laminated such that the signal line is provided between the two ground conductors, such that a mother laminate is formed. Then, the mother laminate is stamped (cut) out, such that a plurality of signal lines are simultaneously manufactured. To obtain a larger number of signal lines from a single mother laminate, a plurality of signal lines are arranged in a matrix over the mother laminate with the gap between adjacent signal lines being as small as possible.

For convenience of the layout of circuit boards, a battery pack, a liquid crystal panel, etc., inside electronic devices, it is preferred in some cases that the signal line disclosed in Japanese Patent Laid-Open Publication No. 2011-071403 has a bent configuration, such as L-shape or U-shape, when viewed in plan in the direction of the lamination. When such bent signal lines are arranged over the mother laminate, the gap between adjacent signal lines is large as compared with a case where linear signal lines are arranged over the mother laminate. Accordingly, the number of signal lines obtained from a single mother laminate decreases, and the manufacturing cost of the signal lines increases.

SUMMARY OF THE INVENTION

In view of the foregoing, preferred embodiments of the present invention reduce the manufacturing cost of a high-frequency signal line which has a bent configuration.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is an exploded view of a signal line portion of the high-frequency signal line.

FIG. 4 is an exploded perspective view of the signal line portion of the high-frequency signal line.

FIG. 5 is an exploded view of a signal line portion of the high-frequency signal line.

FIG. 10 is a perspective view of an electronic device including the high-frequency signal line.

FIG. 14 is a cross-sectional view of the high-frequency signal line in a step of compression bonding.

FIG. 15 is a cross-sectional view of the high-frequency signal line in a step of compression bonding.

FIG. 18 is a cross-sectional view of a high-frequency signal line in a step of compression bonding.

FIG. 19 is a cross-sectional view of the high-frequency signal line in a step of compression bonding.

FIG. 20 is a cross-sectional view of the high-frequency signal line in a step of compression bonding.

FIG. 21 is a plan view of a high-frequency signal line according to the first modification when viewed in plan in the z-axis direction.

FIG. 22 is a plan view of a mother laminate.

FIG. 23 is a plan view of a mother laminate.

FIG. 33A is an exploded view of a signal line portion of the high-frequency signal line.

FIG. 33B is a cross-sectional structure view of the signal line portion of the high-frequency signal line.

FIG. 34 is a plan view of an end of the signal line portion on the negative side in the x-axis direction.

FIG. 35A is an exploded view of a signal line portion of the high-frequency signal line.

FIG. 37 is a cross-sectional structure view of the high-frequency signal line of FIG. 32 taken along line A-A.

FIG. 38 is a perspective view of an electronic device including a high-frequency signal line.

FIG. 42 is a cross-sectional structure view of the signal line portion of the high-frequency signal line.

FIG. 43 is a plan view of an end of the signal line portion on the negative side in the x-axis direction.

DETAILED DESCRIPTION OF THE PREFERRED EMBODIMENTS

Hereinafter, high-frequency signal lines and manufacturing methods thereof according to various preferred embodiments of the present invention will be described with reference to the drawings.

Figure 1:
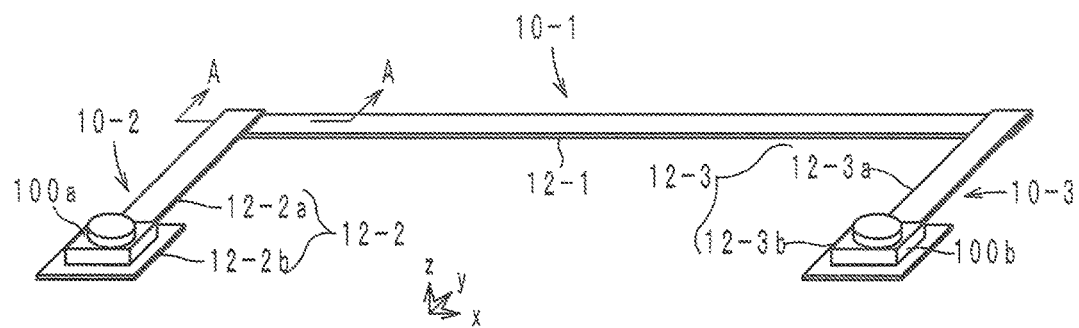
FIG. 1 is an external perspective view of a high-frequency signal line according to a preferred embodiment of the present invention.
Figure 2:
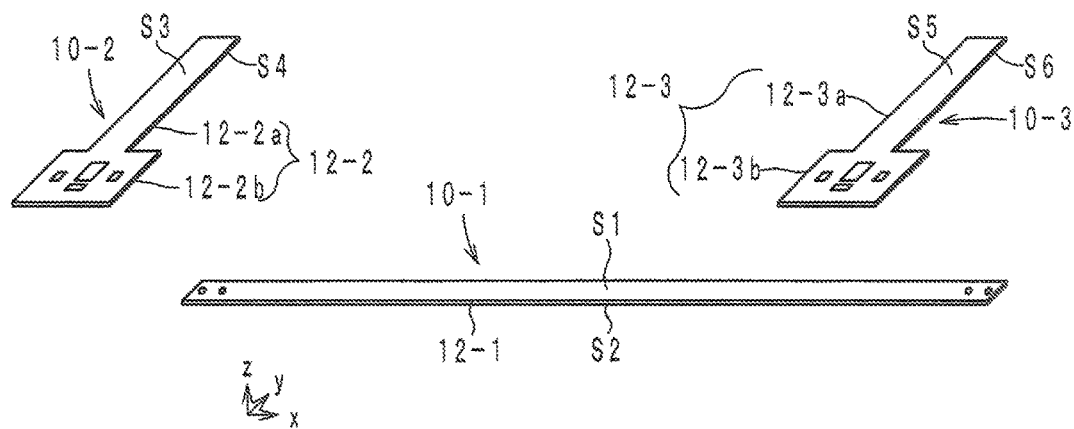
FIG. 2 is an exploded perspective view of the high-frequency signal line of FIG. 1.
Figure 6:
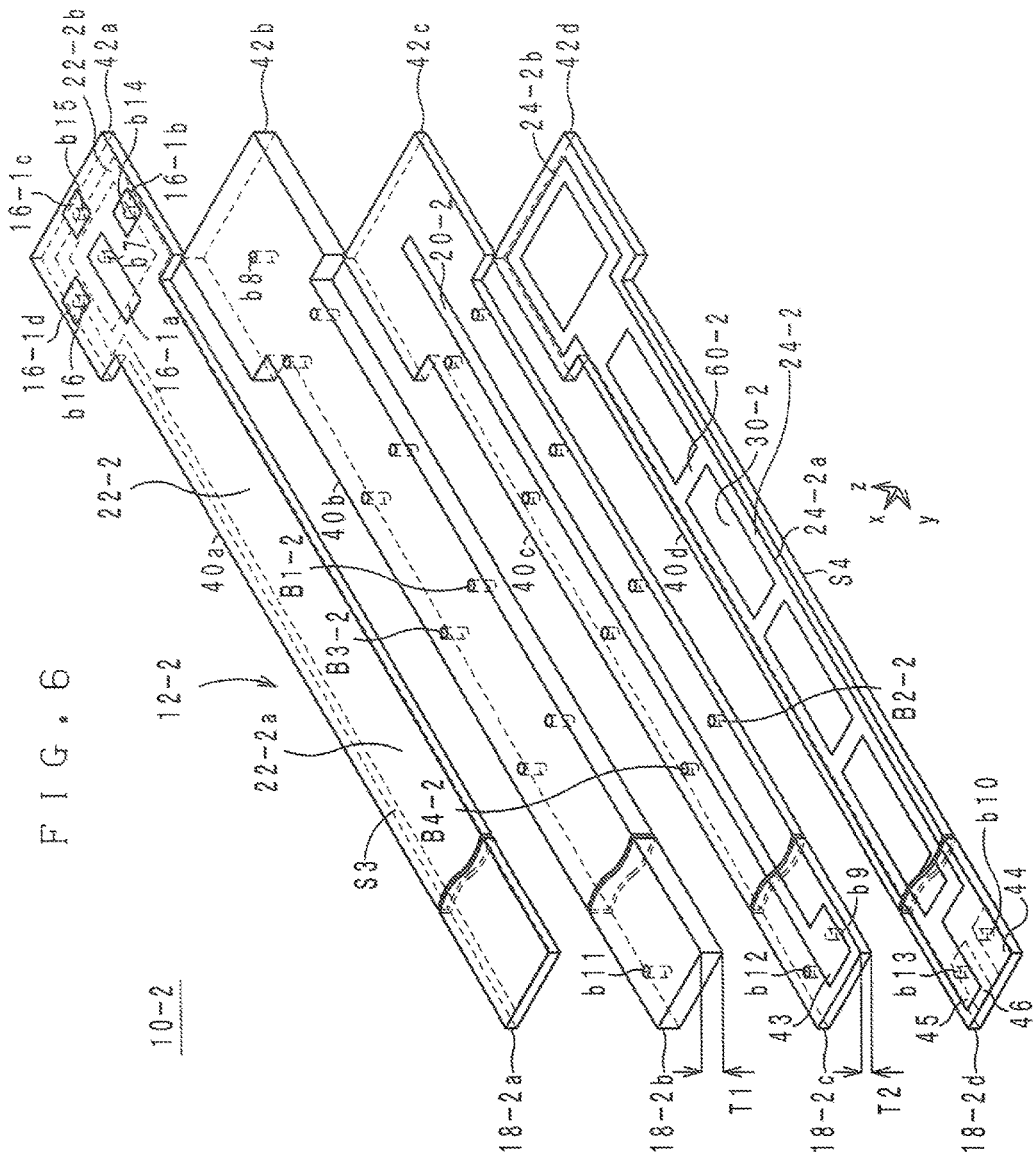
FIG. 6 is an exploded perspective view of the signal line portion of the high-frequency signal line.
Figure 7:
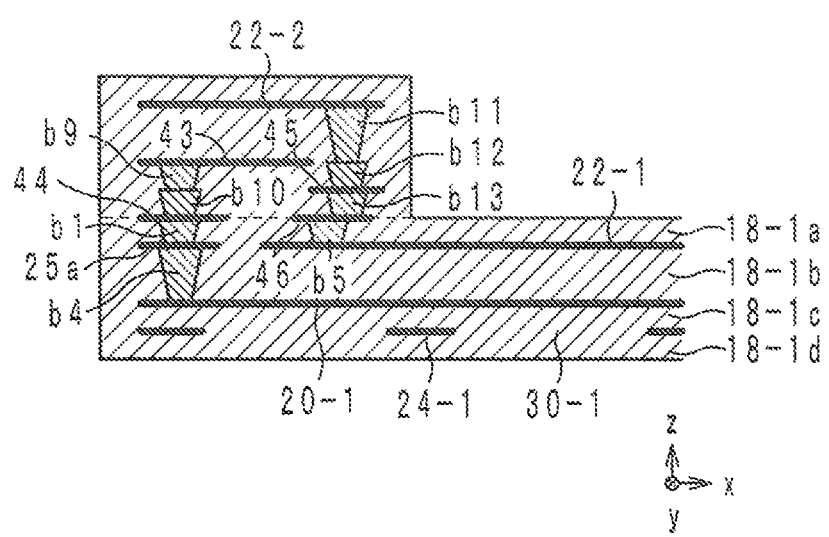
FIG. 7 is a cross-sectional structure view of the high-frequency signal line of FIG. 1 taken along line A-A.

A configuration of the high-frequency signal line according to a preferred embodiment of the present invention will be described below with reference to the drawings. FIG. 1 is an external perspective view of a high-frequency signal line 10 according to a preferred embodiment of the present invention. FIG. 2 is an exploded perspective view of the high-frequency signal line 10 of FIG. 1. FIG. 3 is an exploded view of a signal line portion 10-1 of the high-frequency signal line 10. FIG. 4 is an exploded perspective view of the signal line portion 10-1 of the high-frequency signal line 10. FIG. 5 is an exploded view of a signal line portion 10-2 of the high-frequency signal line 10. FIG. 6 is an exploded perspective view of the signal line portion 10-2 of the high-frequency signal line 10. FIG. 7 is a cross-sectional structure view of the high-frequency signal line 10 of FIG. 1 taken along line A-A. In the following sections, the direction of the lamination of the high-frequency signal line 10 is defined as z-axis direction. The longitudinal direction of the high-frequency signal line 10 is defined as x-axis direction, and the direction perpendicular to the x-axis direction and to the z-axis direction is defined as y-axis direction.

The high-frequency signal line 10 is a flat cable which preferably is used for, for example, connecting two high-frequency circuits inside an electronic device such as a cell phone. The high-frequency signal line 10 includes signal line portions 10-1 to 10-3 and connectors 100a, 100b as shown in FIG. 1 and FIG. 2.

The signal line portion 10-1 (second signal line) preferably has a linear shape extending in the x-axis direction. As shown in FIG. 3 and FIG. 4, the signal line portion 10-1 includes a dielectric element assembly 12-1 (second dielectric element assembly), a signal line 20-1 (second signal line), a reference ground conductor 22-1 (second ground conductor), an auxiliary ground conductor 24-1 (fourth ground conductor), connecting conductors 25a, 25b, and via-hole conductors b1 to b6, B1-1, B2-1, B3-1, B4-1.

The dielectric element assembly 12-1 (second dielectric element assembly) is a linear plate-shaped flexible element linearly extending in the x-axis direction so as to have two ends when viewed in plan in the z-axis direction, and including a top surface S1 (third principal surface) and a bottom surface S2 (fourth principal surface), as shown in FIG. 3 and FIG. 4. The dielectric element assembly 12-1 has a uniform or substantially uniform width when viewed in plan in the z-axis direction. The top surface S1 is a principal surface on the positive side in the z-axis direction. The bottom surface S2 is a principal surface on the negative side in the z-axis direction. The dielectric element assembly 12-1 is a laminate including dielectric sheets 18-1a to 18-1d laminated on each other in this order from the positive side to the negative side in the z-axis direction as shown in FIG. 3 and FIG. 4.

The dielectric sheets 18-1a to 18-1d extend in the x-axis direction and have the same or substantially the same shape as the dielectric element assembly 12 when viewed in plan in the z-axis direction as shown in FIG. 3 and FIG. 4. The dielectric sheets 18-1a to 18-1d are preferably made of a flexible thermoplastic resin such as polyimide or liquid crystal polymer, for example. In the following, the principal surface of each of the dielectric sheets 18-1a to 18-1d that is located on the positive side in the z-axis direction is referred to as top surface, and the principal surface of each of the dielectric sheets 18-1a to 18-1d that is located on the negative side in the z-axis direction is referred to as bottom surface.

The thickness T1 of the dielectric sheet 18-1b is greater than the thickness T2 of the dielectric sheet 18-1c as shown in FIG. 4. The thickness T1 preferably is about 50 μm to about 300 μm, for example, after the lamination of the dielectric sheets 18-1a to 18-1d. In the present preferred embodiment, the thickness T1 preferably is about 150 μm, for example. Moreover, the thickness T2 preferably is about 10 μm to about 100 μm, for example. In the present preferred embodiment, the thickness T2 preferably is about 50 μm, for example.

The signal line 20-1 is a conductor through which high-frequency signals are transmitted and which is provided in the dielectric element assembly 12-1 as shown in FIG. 3 and FIG. 4. In the present preferred embodiment, the signal line 20-1 preferably is a linear conductor located on the top surface of the dielectric sheet 18-1c and extending in the x-axis direction along the dielectric element assembly 12-1. An end of the signal line 20-1 on the negative side in the x-axis direction is located near an end of the signal line portion 10-1 on the negative side in the x-axis direction. The other end of the signal line 20-1 on the positive side in the x-axis direction is located near the other end of the signal line portion 10-1 on the positive side in the x-axis direction. The signal line 20-1 is preferably made of a metal material including silver or copper and having a low specific resistance. Here, forming the signal line 20-1 on the top surface of the dielectric sheet 18-1c refers to forming the signal line 20-1 preferably by patterning a metal foil that is formed preferably by plating on the top surface of the dielectric sheet 18-1c or forming the signal line 20-1 preferably by patterning a metal foil that is adhered onto the top surface of the dielectric sheet 18-1c. Further, the surface of the signal line 20-1 is smoothed, and therefore, the surface roughness of a surface of the signal line 20-1 which is in contact with the dielectric sheet 18-1c is greater than the surface roughness of the other surface of the signal line 20-1 which is not in contact with the dielectric sheet 18-1c.

The reference ground conductor 22-1 is a solid conductor layer provided on the positive side in the z-axis direction relative to the signal line 20-1 and extends along the signal line 20-1 as shown in FIG. 3 and FIG. 4. That is, the reference ground conductor 22-1 is provided on the top surface S1 side of the dielectric element assembly 12-1 relative to the signal line 20-1. More specifically, the reference ground conductor 22-1 is arranged on the bottom surface of the dielectric sheet 18-1a so as to extend in the x-axis direction. Thus, the reference ground conductor 22-1 is opposed to the signal line 20-1 via the dielectric sheet 18-1b. The reference ground conductor 22-1 does not have an opening at a position overlapping with the signal line 20-1. An end of the reference ground conductor 22-1 on the negative side in the x-axis direction is located near the end of the signal line portion 10-1 on the negative side in the x-axis direction. Note that, however, as shown in FIG. 3 and FIG. 4, the end of the reference ground conductor 22-1 on the negative side in the x-axis direction is positioned on the positive side in the x-axis direction relative to the end of the signal line 20-1 on the negative side in the x-axis direction. The other end of the reference ground conductor 22-1 on the positive side in the x-axis direction is located near the end of the signal line portion 10-1 on the positive side in the x-axis direction. Note that, however, as shown in FIG. 3 and FIG. 4, the end of the reference ground conductor 22-1 on the positive side in the x-axis direction is positioned on the negative side in the x-axis direction relative to the end of the signal line 20-1 on the positive side in the x-axis direction.

The reference ground conductor 22-1 is made of a metal material including silver or copper and having a low specific resistance. Here, forming the reference ground conductor 22-1 on the bottom surface of the dielectric sheet 18-1a refers to forming the reference ground conductor 22-1 preferably by patterning a metal foil that is formed preferably by plating on the bottom surface of the dielectric sheet 18-1a or forming the reference ground conductor 22-1 preferably by patterning a metal foil that is adhered onto the bottom surface of the dielectric sheet 18-1a. Further, the surface of the reference ground conductor 22-1 is smoothed, and therefore, the surface roughness of a surface of the reference ground conductor 22-1 which is in contact with the dielectric sheet 18-1a is greater than the surface roughness of the other surface of the reference ground conductor 22-1 which is not in contact with the dielectric sheet 18-1a.

The auxiliary ground conductor 24-1 is a conductor layer provided on the negative side in the z-axis direction relative to the signal line 20-1 and extends along the signal line 20-1 as shown in FIG. 3 and FIG. 4. That is, the auxiliary ground conductor 24-1 is provided on the bottom surface S2 side of the dielectric element assembly 12-1 relative to the signal line 20-1. More specifically, the auxiliary ground conductor 24-1 is arranged on the top surface of the dielectric sheet 18-1d so as to extend in the x-axis direction. Thus, the auxiliary ground conductor 24-1 is opposed to the signal line 20-1 via the dielectric sheet 18-1c. An end of the auxiliary ground conductor 24-1 on the negative side in the x-axis direction is located near the end of the signal line portion 10-1 on the negative side in the x-axis direction. The other end of the auxiliary ground conductor 24-1 on the positive side in the x-axis direction is located near the end of the signal line portion 10-1 on the positive side in the x-axis direction.

The auxiliary ground conductor 24-1 is made of a metal material including silver or copper and having a low specific resistance. Here, forming the auxiliary ground conductor 24-1 on the top surface of the dielectric sheet 18-1d refers to forming the auxiliary ground conductor 24-1 preferably by patterning a metal foil that is formed preferably by plating on the top surface of the dielectric sheet 18-1d or forming the auxiliary ground conductor 24-1 preferably by patterning a metal foil that is adhered onto the top surface of the dielectric sheet 18-1d. Further, the surface of the auxiliary ground conductor 24-1 is smoothed, and therefore, the surface roughness of a surface of the auxiliary ground conductor 24-1 which is in contact with the dielectric sheet 18-1d is greater than the surface roughness of the other surface of the auxiliary ground conductor 24-1 which is not in contact with the dielectric sheet 18-1d.

The auxiliary ground conductor 24-1 preferably includes a plurality of rectangular or substantially rectangular openings 30-1 arranged along the x-axis direction as shown in FIG. 3 and FIG. 4. Thus, the auxiliary ground conductor 24-1 preferably has a ladder-shaped configuration. A portion of the auxiliary ground conductor 24-1 lying between adjacent openings 30-1 is referred to as "bridge portion 60-1". The bridge portion 60-1 extends in the y-axis direction. The plurality of openings 30-1 and the plurality of bridge portions 60-1 alternately overlap with the signal line 20-1 when viewed in plan in the z-axis direction. In the present preferred embodiment, the signal line 20-1 extends in the x-axis direction so as to traverse the centers in the y-axis direction of the openings 30-1 and the bridge portions 60-1.

As described above, the reference ground conductor 22-1 does not have an opening, while the auxiliary ground conductor 24-1 includes the openings 30-1. Thus, the overlapping area of the reference ground conductor 22-1 and the signal line 20-1 is greater than the overlapping area of the auxiliary ground conductor 24-1 and the signal line 20-1.

The connecting conductor 25a is provided on the bottom surface of the dielectric sheet 18-1a, at a position on the negative side in the x-axis direction relative to the end of the reference ground conductor 22-1 on the negative side in the x-axis direction. Thus, the connecting conductor 25a overlaps with the end of the signal line 20-1 on the negative side in the x-axis direction when viewed in plan in the z-axis direction.

The connecting conductor 25b is provided on the bottom surface of the dielectric sheet 18-1a, at a position on the positive side in the x-axis direction relative to the end of the reference ground conductor 22-1 on the positive side in the x-axis direction. Thus, the connecting conductor 25b overlaps with the end of the signal line 20-1 on the positive side in the x-axis direction when viewed in plan in the z-axis direction.

The plurality of via-hole conductors B1-1 pierce through the dielectric sheet 18-1*b* in the z-axis direction at positions on the positive side in the y-axis direction relative to the signal line 20-1, and are arranged in a row in the x-axis direction with equal intervals, as shown in FIG. 3 and FIG. 4. The plurality of via-hole conductors B2-1 pierce through the dielectric sheet 18-1*c* in the z-axis direction at positions on the positive side in the y-axis direction relative to the signal line 20-1, and are arranged in a row in the x-axis direction with equal intervals, as shown in FIG. 2. The via-hole conductors B1-1, B2-1 are connected to each other to define a single via-hole conductor. Ends of the via-hole conductors B1-1 on the positive side in the z-axis direction are connected to the reference ground conductor 22-1. Ends of the via-hole conductors B2-1 on the negative side in the z-axis direction are connected to the auxiliary ground conductor 24-1, more specifically to the auxiliary ground conductor 24-1 at positions on the positive side in the y-axis direction relative to the bridge portion 60-1. The via-hole conductors B1-1, B2-1 may be formed preferably by providing an electrically-conductive paste including silver, tin, copper, or the like, into via holes formed in the dielectric sheets 18-1*b*, 18-1*c* and solidifying the paste.

The plurality of via-hole conductors B3-1 pierce through the dielectric sheet 18-1*b* in the z-axis direction at positions on the negative side in the y-axis direction relative to the signal line 20-1, and are arranged in a row in the x-axis direction with equal intervals, as shown in FIG. 3 and FIG. 4. The plurality of via-hole conductors B4-1 pierce through the dielectric sheet 18-1*c* in the z-axis direction at positions on the negative side in the y-axis direction relative to the signal line 20-1, and are arranged in a row in the x-axis direction with equal intervals, as shown in FIG. 2. The via-hole conductors B3-1, B4-1 are connected to each other to form a single via-hole conductor. Ends of the via-hole conductors B3-1 on the positive side in the z-axis direction are connected to the reference ground conductor 22-1. Ends of the via-hole conductors B4-1 on the negative side in the z-axis direction are connected to the auxiliary ground conductor 24-1, more specifically to the auxiliary ground conductor 24-1 at positions on the negative side in the y-axis direction relative to the bridge portion 60-1. The via-hole conductors B3-1, B4-1 may be formed preferably by providing an electrically-conductive paste including silver, tin, copper, or the like, into via holes formed in the dielectric sheets 18-1*b*, 18-1*c* and solidifying the paste.

The via-hole conductor b1 (first via-hole conductor) pierces through the dielectric sheet 18-1*a* in the z-axis direction as shown in FIG. 3 and FIG. 4. The via-hole conductor b2 pierces through the dielectric sheet 18-1*b* in the z-axis direction. An end of the via-hole conductor b1 on the positive side in the z-axis direction is exposed at a portion of the top surface S1 at the end of the dielectric element assembly 12-1 on the negative side in the x-axis direction. The other end of the via-hole conductor b1 on the negative side in the z-axis direction is connected to the connecting conductor 25*a*. An end of the via-hole conductor b2 on the positive side in the z-axis direction is connected to the connecting conductor 25*a*. The other end of the via-hole conductor b2 on the negative side in the z-axis direction is connected to the end of the signal line 20-1 on the negative side in the x-axis direction. Thus, the via-hole conductor b1 is electrically coupled to the signal line 20-1 via the via-hole conductor b2 and the connecting conductor 25*a*.

The via-hole conductor b3 (first via-hole conductor) pierces through the dielectric sheet 18-1*a* in the z-axis direction as shown in FIG. 3 and FIG. 4. The via-hole conductor b4 pierces through the dielectric sheet 18-1*b* in the z-axis direction. An end of the via-hole conductor b3 on the positive side in the z-axis direction is exposed at a portion of the top surface S1 at the end of the dielectric element assembly 12-1 on the positive side in the x-axis direction. The other end of the via-hole conductor b3 on the negative side in the z-axis direction is connected to the connecting conductor 25*b*. An end of the via-hole conductor b4 on the positive side in the z-axis direction is connected to the connecting conductor 25*b*. The other end of the via-hole conductor b4 on the negative side in the z-axis direction is connected to the end of the signal line 20-1 on the positive side in the x-axis direction. Thus, the via-hole conductor b3 is electrically coupled to the signal line 20-1 via the via-hole conductor b4 and the connecting conductor 25*b*.

The via-hole conductor b5 pierces through the dielectric sheet 18-1*a* in the z-axis direction, and is provided on the positive side in the x-axis direction relative to the via-hole conductor b1, as shown in FIG. 3 and FIG. 4. An end of the via-hole conductor b5 on the positive side in the z-axis direction is exposed at a portion of the top surface S1 at the end of the dielectric element assembly 12-1 on the negative side in the x-axis direction. The other end of the via-hole conductor b5 on the negative side in the z-axis direction is connected to the end of the reference ground conductor 22-1 on the negative side in the x-axis direction.

The via-hole conductor b6 pierces through the dielectric sheet 18-1*a* in the z-axis direction, and is provided on the negative side in the x-axis direction relative to the via-hole conductor b3, as shown in FIG. 3 and FIG. 4. An end of the via-hole conductor b6 on the positive side in the z-axis direction is exposed at a portion of the top surface S1 at the end of the dielectric element assembly 12-1 on the positive side in the x-axis direction. The other end of the via-hole conductor b6 on the negative side in the z-axis direction is connected to the end of the reference ground conductor 22-1 on the positive side in the x-axis direction. The via-hole conductors b1 to b6 may be formed preferably by providing an electrically-conductive paste including silver, tin, copper, or the like, into via holes formed in the dielectric sheets 18-1*a* to 18-1*c* and solidifying the paste.

The signal line 20-1, the reference ground conductor 22-1, the auxiliary ground conductor 24-1, and the connecting conductors 25*a*, 25*b* preferably equal or approximately equal thicknesses. For example, the signal line 20-1, the reference ground conductor 22-1, the auxiliary ground conductor 24-1, and the connecting conductors 25*a*, 25*b* preferably have thicknesses of about 10 μm to about 20 μm.

As described above, the signal line 20-1 is provided between the reference ground conductor 22-1 and the auxiliary ground conductor 24-1 which are provided at the opposite sides in the z-axis direction of the signal line 20-1. That is, the signal line 20-1, the reference ground conductor 22-1, and the auxiliary ground conductor 24-1 define a tri-plate stripline structure. The space (the distance in the z-axis direction) between the signal line 20-1 and the reference ground conductor 22-1 preferably is equal or approximately equal to the thickness T1 of the dielectric sheet 18-1*b* as shown in FIG. 4, and preferably is about 50 μm to about 300 μm, for example. In the present preferred embodiment, the space between the signal line 20-1 and the reference ground conductor 22-1 preferably is about 150 μm, for example. The space (the distance in the z-axis direction) between the signal line 20-1 and the auxiliary ground conductor 24-1 preferably is equal or approximately equal to the thickness T2 of the dielectric sheet 18-1c as shown in FIG. 4, and preferably is about 10 μm to about 100 μm, for example. In the present preferred embodiment, the space between the signal line 20-1 and the auxiliary ground conductor 24-1 preferably is about 50 μm, for example. Thus, the distance in the z-axis direction between the signal line 20-1 and the reference ground conductor 22-1 is greater than the distance in the z-axis direction between the signal line 20-1 and the auxiliary ground conductor 24-1.

The signal line portion 10-2 (first signal line) has a linear shape extending in the x-axis direction and includes a dielectric element assembly 12-2 (first dielectric element assembly), external terminals 16-1a to 16-1d, a signal line 20-2 (first signal line), a reference ground conductor 22-2 (first ground conductor), an auxiliary ground conductor 24-2 (third ground conductor), connecting conductors 43 to 46, and via-hole conductors b7 to b16, B1-2, B2-2, B3-2, B4-2 as shown in FIG. 5 and FIG. 6.

The dielectric element assembly 12-2 (first dielectric element assembly) is a linear plate-shaped flexible element linearly extending in the y-axis direction so as to have two ends when viewed in plan in the z-axis direction, and having a top surface S3 (first principal surface) and a bottom surface S4 (second principal surface), as shown in FIG. 5 and FIG. 6. The top surface S3 is a principal surface on the positive side in the z-axis direction. The bottom surface S4 is a principal surface on the negative side in the z-axis direction. The dielectric element assembly 12-2 is a laminate including dielectric sheets 18-2a to 18-2d laminated on each other in this order from the positive side to the negative side in the z-axis direction as shown in FIG. 5 and FIG. 6.

The dielectric element assembly 12-2 includes a line portion 12-2a and a connecting portion 12-2b as shown in FIG. 1 and FIG. 2. The line portion 12-2a extends in the y-axis direction as shown in FIG. 1. The connecting portion 12-2b is connected to an end of the line portion 12-2a on the negative side in the y-axis direction and preferably has a rectangular or substantially rectangular shape. The width in the x-axis direction of the connecting portion 12-2b is greater than the width in the x-axis direction of the line portion 12-2a.

The dielectric sheets 18-2a to 18-2d extend in the x-axis direction and preferably have the same shape as the dielectric element assembly 12-2 when viewed in plan in the z-axis direction as shown in FIG. 5 and FIG. 6. The dielectric sheets 18-2a to 18-2d are preferably made of a flexible thermoplastic resin such as polyimide or liquid crystal polymer, for example. In the following, the principal surface of each of the dielectric sheets 18-2a to 18-2d that is located on the positive side in the z-axis direction is referred to as top surface, and the principal surface of each of the dielectric sheets 18-2a to 18-2d that is located on the negative side in the z-axis direction is referred to as bottom surface.

The thickness T1 of the dielectric sheet 18-2b is greater than the thickness T2 of the dielectric sheet 18-2c as shown in FIG. 6. The thickness T1 preferably is about 50 μm to about 300 μm, for example, after the lamination of the dielectric sheets 18-2a to 18-2d. In the present preferred embodiment, the thickness T1 preferably is about 150 μm, for example. Moreover, the thickness T2 preferably is about 10 μm to about 100 μm, for example. In the present preferred embodiment, the thickness T2 preferably is about 50 μm, for example.

The dielectric sheet 18-2a includes a line portion 40a and a connecting portion 42a as shown in FIG. 5 and FIG. 6. The dielectric sheet 18-2b includes a line portion 40b and a connecting portion 42b. The dielectric sheet 18-2c includes a line portion 40c and a connecting portion 42c. The dielectric sheet 18-2d includes a line portion 40d and a connecting portion 42d. The line portions 40a to 40d define the line portion 12-2a. The connecting portions 42a to 42d define the connecting portion 12-2b.

The signal line 20-2 is a conductor through which high-frequency signals are transmitted and which is provided in the dielectric element assembly 12-2 as shown in FIG. 5 and FIG. 6. In the present preferred embodiment, the signal line 20-2 is a linear conductor provided on the top surface of the dielectric sheet 18-2c and extending in the y-axis direction along the signal line 20-2. An end of the signal line 20-2 on the negative side in the y-axis direction is located near an end of the signal line portion 10-2 on the negative side in the y-axis direction. The other end of the signal line 20-2 on the positive side in the y-axis direction is located near the other end of the signal line portion 10-2 on the positive side in the y-axis direction. The signal line 20-2 is preferably made of a metal material including silver or copper and having a low specific resistance. Here, forming the signal line 20-2 on the top surface of the dielectric sheet 18-2c refers to forming the signal line 20-2 preferably by patterning a metal foil that is formed preferably by plating on the top surface of the dielectric sheet 18-2c or forming the signal line 20-2 preferably by patterning a metal foil that is adhered onto the top surface of the dielectric sheet 18-2c. Further, the surface of the signal line 20-2 is smoothed, and therefore, the surface roughness of a surface of the signal line 20-2 which is in contact with the dielectric sheet 18-2c is greater than the surface roughness of the other surface of the signal line 20-2 which is not in contact with the dielectric sheet 18-2c.

The reference ground conductor 22-2 is a solid conductor layer provided on the positive side in the z-axis direction relative to the signal line 20-2 and extends along the signal line 20-2 as shown in FIG. 5 and FIG. 6. That is, the reference ground conductor 22-2 is provided on the top surface S3 side of the dielectric element assembly 12-2 relative to the signal line 20-2. More specifically, the reference ground conductor 22-2 is arranged on the bottom surface of the dielectric sheet 18-2a so as to extend in the y-axis direction. Thus, the reference ground conductor 22-2 is opposed to the signal line 20-2 via the dielectric sheet 18-2b. The reference ground conductor 22-2 does not have an opening at a position overlapping with the signal line 20-2.

The reference ground conductor 22-2 is preferably made of a metal material including silver or copper and having a low specific resistance. Here, forming the reference ground conductor 22-2 on the bottom surface of the dielectric sheet 18-2a refers to forming the reference ground conductor 22-2 preferably by patterning a metal foil that is formed preferably by plating on the bottom surface of the dielectric sheet 18-2a or forming the reference ground conductor 22-2 preferably by patterning a metal foil that is adhered onto the bottom surface of the dielectric sheet 18-2a. Further, the surface of the reference ground conductor 22-2 is smoothed, and therefore, the surface roughness of a surface of the reference ground conductor 22-2 which is in contact with the dielectric sheet 18-2a is greater than the surface roughness of the other surface of the reference ground conductor 22-2 which is not in contact with the dielectric sheet 18-2a.

The reference ground conductor 22-2 includes a line portion 22-2a and a terminal portion 22-2b as shown in FIG. 5 and FIG. 6. The line portion 22-2a is arranged on the bottom surface of the line portion 18-2a so as to extend in the y-axis direction. The terminal portion 22-2b is provided on the bottom surface of the line portion 18-2a and preferably has a rectangular or substantially rectangular rim configuration. The terminal portion 22-2b is connected to an end of the line portion 22-2a on the negative side in the y-axis direction.

The auxiliary ground conductor 24-2 is a conductor layer provided on the negative side in the z-axis direction relative to the signal line 20-2 and extends along the signal line 20-2 as shown in FIG. 5 and FIG. 6. That is, the auxiliary ground conductor 24-2 is provided on the bottom surface S4 side of the dielectric element assembly 12-2 relative to the signal line 20-2. More specifically, the auxiliary ground conductor 24-2 is arranged on the top surface of the dielectric sheet 18-2d so as to extend in the y-axis direction.

The auxiliary ground conductor 24-2 is preferably made of a metal material including silver or copper and having a low specific resistance. Here, forming the auxiliary ground conductor 24-2 on the top surface of the dielectric sheet 18-2d refers to forming the auxiliary ground conductor 24-2 preferably by patterning a metal foil that is formed preferably by plating on the top surface of the dielectric sheet 18-2d or forming the auxiliary ground conductor 24-2 preferably by patterning a metal foil that is adhered onto the top surface of the dielectric sheet 18-2d. Further, the surface of the auxiliary ground conductor 24-2 is smoothed, and therefore, the surface roughness of a surface of the auxiliary ground conductor 24-2 which is in contact with the dielectric sheet 18-2d is greater than the surface roughness of the other surface of the auxiliary ground conductor 24-2 which is not in contact with the dielectric sheet 18-2d.

The reference ground conductor 24-2 includes a line portion 24-2a and a terminal portion 24-2b as shown in FIG. 5 and FIG. 6. The line portion 24-2a is provided on the top surface of the line portion 18-2d so as to extend in the y-axis direction. The terminal portion 24-2b is provided on the top surface of the line portion 18-2d and preferably has a rectangular or substantially rectangular rim configuration. The terminal portion 24-2b is connected to an end of the line portion 24-2a on the negative side in the y-axis direction.

The line portion 24-2a preferably includes a plurality of rectangular or substantially rectangular openings 30-2 arranged along the y-axis direction as shown in FIG. 5 and FIG. 6. Thus, the line portion 24-2a preferably has a ladder-shaped configuration. A portion of the line portion 24-2a lying between adjacent openings 30-2 is referred to as "bridge portion 60-2". The bridge portion 60-2 extends in the x-axis direction. The plurality of openings 30-2 and the plurality of bridge portions 60-2 alternately overlap with the signal line 20-2 when viewed in plan in the z-axis direction. In the present preferred embodiment, the signal line 20-2 extends in the y-axis direction so as to traverse the centers in the x-axis direction of the openings 30-2 and the bridge portions 60-2.

As described above, the reference ground conductor 22-2 does not have an opening, while the auxiliary ground conductor 24-2 includes the openings 30-2. Thus, the overlapping area of the reference ground conductor 22-2 and the signal line 20-2 is greater than the overlapping area of the auxiliary ground conductor 24-2 and the signal line 20-2.

The connecting conductor 43 is preferably provided on a portion of the top surface of the dielectric sheet 18-2c at an end of the dielectric sheet 18-2c on the positive side in the y-axis direction. The connecting conductor 43 is connected to the signal line 20-2 and protrudes toward the negative side in the x-axis direction relative to the signal line 20-2. The connecting conductor 43 is preferably made of a metal material including silver or copper and having a low specific resistance. Here, forming the connecting conductor 43 on the top surface of the dielectric sheet 18-2c refers to forming the connecting conductor preferably by patterning a metal foil that is formed preferably by plating on the top surface of the dielectric sheet 18-2c or forming the connecting conductor 43 preferably by patterning a metal foil that is adhered onto the top surface of the dielectric sheet 18-2c. Further, the surface of the connecting conductor 43 is smoothed, and therefore, the surface roughness of a surface of the connecting conductor 43 which is in contact with the dielectric sheet 18-2c is greater than the surface roughness of the other surface of the connecting conductor 43 which is not in contact with the dielectric sheet 18-2c.

The connecting conductor 44 is preferably provided on a portion of the bottom surface of the dielectric sheet 18-2d at an end of the dielectric sheet 18-2d on the positive side in the y-axis direction. That is, the connecting conductor 44 is preferably provided on a portion of the bottom surface S4 at an end of the dielectric element assembly 12-2 on the positive side in the y-axis direction. The connecting conductor 44 preferably has a rectangular or substantially rectangular shape and overlaps with the connecting conductor 43 when viewed in plan in the z-axis direction. The connecting conductor 44 preferably is made of a metal material including silver or copper and having a low specific resistance. Here, forming the connecting conductor 44 on the bottom surface of the dielectric sheet 18-2d refers to forming the connecting conductor 44 preferably by patterning a metal foil that is formed preferably by plating on the bottom surface of the dielectric sheet 18-2d or forming the connecting conductor 44 preferably by patterning a metal foil that is adhered onto the bottom surface of the dielectric sheet 18-2d. Further, the surface of the connecting conductor 44 is smoothed, and therefore, the surface roughness of a surface of the connecting conductor 44 which is in contact with the dielectric sheet 18-2d is greater than the surface roughness of the other surface of the connecting conductor 44 which is not in contact with the dielectric sheet 18-2d.

The connecting conductor 45 is provided on a portion of the top surface of the dielectric sheet 18-2d at the end of the dielectric sheet 18-2d on the positive side in the y-axis direction. The connecting conductor 45 is connected to an end of the auxiliary ground conductor 24-2 on the positive side in the y-axis direction. Here, forming the connecting conductor 45 on the top surface of the dielectric sheet 18-2d refers to forming the connecting conductor 45 preferably by patterning a metal foil that is formed preferably by plating on the top surface of the dielectric sheet 18-2d or forming the connecting conductor 45 preferably by patterning a metal foil that is adhered onto the top surface of the dielectric sheet 18-2d. Further, the surface of the connecting conductor 45 is smoothed, and therefore, the surface roughness of a surface of the connecting conductor 45 which is in contact with the dielectric sheet 18-2d is greater than the surface roughness of the other surface of the connecting conductor 45 which is not in contact with the dielectric sheet 18-2d.

The connecting conductor 46 is provided on a portion of the bottom surface of the dielectric sheet 18-2d at an end of the dielectric sheet 18-2d on the positive side in the y-axis direction. That is, the connecting conductor 46 is provided on a portion of the bottom surface S4 at the end of the dielectric element assembly 12-2 on the positive side in the y-axis direction. The connecting conductor 46 is positioned on the positive side in the x-axis direction relative to the connecting conductor 44. The connecting conductor 46 preferably has a rectangular or substantially rectangular shape and overlaps with the connecting conductor 45 when viewed in plan in the z-axis direction. Here, forming the connecting conductor 46 on the bottom surface of the dielectric sheet 18-2d refers to forming the connecting conductor 46 preferably by patterning a metal foil that is formed preferably by plating on the bottom surface of the dielectric sheet 18-2d or forming the connecting conductor 46 preferably by patterning a metal foil that is adhered onto the bottom surface of the dielectric sheet 18-2d. Further, the surface of the connecting conductor 46 is smoothed, and therefore, the surface roughness of a surface of the connecting conductor 46 which is in contact with the dielectric sheet 18-2d is greater than the surface roughness of the other surface of the connecting conductor 46 which is not in contact with the dielectric sheet 18-2d.

The external terminal 16-1a preferably is a rectangular or substantially rectangular conductor which is provided at the center of the top surface S3 of the connecting portion 42a as shown in FIG. 5. When viewed in plan in the z-axis direction, the external terminal 16-1a overlaps with the end of the signal line 20-2 on the negative side in the y-axis direction. The external terminal 16-1b preferably is a rectangular or substantially conductor which is provided on the top surface of the connecting portion 42a, at a position on the negative side in the x-axis direction relative to the external terminal 16-1a as shown in FIG. 5. When viewed in plan in the z-axis direction, the external terminal 16-1b overlaps with the terminal portion 22-2b. The external terminal 16-1c preferably is a rectangular or substantially rectangular conductor which is provided on the top surface of the connecting portion 42a, at a position on the negative side in the y-axis direction relative to the external terminal 16-1a as shown in FIG. 5. When viewed in plan in the z-axis direction, the external terminal 16-1c overlaps with the terminal portion 22-2b. The external terminal 16-1d preferably is a rectangular or substantially rectangular conductor which is provided on the top surface of the connecting portion 42a, at a position on the positive side in the x-axis direction relative to the external terminal 16-1a as shown in FIG. 5. When viewed in plan in the z-axis direction, the external terminal 16-1d overlaps with the terminal portion 22-2b.

The external terminals 16-1a to 16-1d are preferably made of a metal material including silver or copper and having a low specific resistance. Further, the top surface of the external terminals 16-1a to 16-1d is plated with Ni/Au. Here, forming the external terminals 16-1a to 16-1d on the top surface of the dielectric sheet 18-2a refers to forming the external terminals 16-1a to 16-1d preferably by patterning a metal foil that is formed preferably by plating on the top surface of the dielectric sheet 18-2a or forming the external terminals 16-1a to 16-1d preferably by patterning a metal foil that is adhered onto the top surface of the dielectric sheet 18-2a. Further, the surface of the external terminals 16-1a to 16-1d is smoothed, and therefore, the surface roughness of a surface of the external terminals 16-1a to 16-1d which is in contact with the dielectric sheet 18-2a is greater than the surface roughness of the other surface of the external terminals 16-1a to 16-1d which is not in contact with the dielectric sheet 18-2a.

The plurality of via-hole conductors B1-2 pierce through the dielectric sheet 18-2b in the z-axis direction at positions on the negative side in the x-axis direction relative to the signal line 20-2, and are arranged in a row in the y-axis direction with equal or substantially equal intervals, as shown in FIG. 5 and FIG. 6. The plurality of via-hole conductors B2-2 pierce through the dielectric sheet 18-2c in the z-axis direction at positions on the negative side in the x-axis direction relative to the signal line 20-2, and are arranged in a row in the y-axis direction with equal or substantially equal intervals, as shown in FIG. 5. The via-hole conductors B1-2, B2-2 are connected to each other to define a single via-hole conductor. Ends of the via-hole conductors B1-2 on the positive side in the z-axis direction are connected to the reference ground conductor 22-2. Ends of the via-hole conductors B2-2 on the negative side in the z-axis direction are connected to the auxiliary ground conductor 24-2, more specifically to the auxiliary ground conductor 24-2 at positions on the negative side in the x-axis direction relative to the bridge portion 60-2. The via-hole conductors B1-2, B2-2 may be formed preferably by providing an electrically-conductive paste including silver, tin, copper, or the like, into via holes formed in the dielectric sheets 18-2b, 18-2c and solidifying the paste.

The plurality of via-hole conductors B3-2 pierce through the dielectric sheet 18-2b in the z-axis direction at positions on the positive side in the x-axis direction relative to the signal line 20-2, and are arranged in a row in the x-axis direction with equal or substantially equal intervals, as shown in FIG. 5 and FIG. 6. The plurality of via-hole conductors B4-2 pierce through the dielectric sheet 18-2c in the z-axis direction at positions on the positive side in the x-axis direction relative to the signal line 20-2, and are arranged in a row in the y-axis direction with equal or substantially equal intervals, as shown in FIG. 5. The via-hole conductors B3-2, B4-2 are connected to each other to define a single via-hole conductor. Ends of the via-hole conductors B3-2 on the positive side in the z-axis direction are connected to the reference ground conductor 22-2. Ends of the via-hole conductors B4-2 on the negative side in the z-axis direction are connected to the auxiliary ground conductor 24-2, more specifically to the auxiliary ground conductor 24-2 at positions on the positive side in the x-axis direction relative to the bridge portion 60-2. The via-hole conductors B3-2, B4-2 may be formed preferably by providing an electrically-conductive paste including silver, tin, copper, or the like, into via holes formed in the dielectric sheets 18-2b, 18-2c and solidifying the paste.

The via-hole conductor b7 pierces through the connecting portion 42a of the dielectric sheet 18-2a in the z-axis direction as shown in FIG. 5 and FIG. 6. The via-hole conductor b8 pierces through the connecting portion 42b of the dielectric sheet 18-2b in the z-axis direction as shown in FIG. 5 and FIG. 6. The via-hole conductors b7, b8 are connected to each other to define a single via-hole conductor. An end of the via-hole conductor b7 on the positive side in the z-axis direction is connected to the external terminal 16-1a. An end of the via-hole conductor b8 on the negative side in the z-axis direction is connected to the end of the signal line 20-2 on the negative side in the y-axis direction. Thus, the external terminal 16-1a is electrically coupled to the signal line 20-1 via the via-hole conductors b7, b8.

The via-hole conductor b9 pierces through the dielectric sheet 18-2c in the z-axis direction, at a position near the end of the dielectric sheet 18-2c on the positive side in the y-axis direction, as shown in FIG. 5 and FIG. 6. The via-hole conductor b10 pierces through the dielectric sheet 18-2d in the z-axis direction, at a position near the end of the dielectric sheet 18-2d on the positive side in the y-axis direction, as shown in FIG. 5 and FIG. 6. The via-hole conductors b9, b10 are connected to each other to define a single via-hole conductor. An end of the via-hole conductor b9 on the positive side in the z-axis direction is connected to the connecting conductor 43. An end of the via-hole conductor b10 on the negative side in the z-axis direction is connected to the connecting conductor 44. Thus, the connecting conductor 44 is electrically coupled to the signal line 20-2 via the via-hole conductors b9, b10 and the connecting conductor 43. The signal line 20-2 is connected between the external terminal 16-1a and the connecting conductor 44. The via-hole conductors b9, b10 may be formed preferably by providing an electrically-conductive paste including silver, tin, copper, or the like, into via holes formed in the dielectric sheets 18-2c, 18-2d and solidifying the paste.

The via-hole conductor b11 pierces through the dielectric sheet 18-2b in the z-axis direction, at a position near an end of the dielectric sheet 18-2b on the positive side in the y-axis direction, as shown in FIG. 5 and FIG. 6. The via-hole conductor b12 pierces through the dielectric sheet 18-2c in the z-axis direction, at a position near the end of the dielectric sheet 18-2c on the positive side in the y-axis direction, as shown in FIG. 5 and FIG. 6. The via-hole conductor b13 pierces through the dielectric sheet 18-2d in the z-axis direction, at a position near the end of the dielectric sheet 18-2d on the positive side in the y-axis direction, as shown in FIG. 5 and FIG. 6. The via-hole conductors b11 to b13 are connected to one another to define a single via-hole conductor. An end of the via-hole conductor b11 on the positive side in the z-axis direction is connected to an end of the reference ground conductor 22-1 on the positive side in the y-axis direction. An end of the via-hole conductor b12 on the negative side in the z-axis direction is connected to the connecting conductor 45. An end of the via-hole conductor b13 on the positive side in the z-axis direction is connected to the connecting conductor 45. The other end of the via-hole conductor b13 on the negative side in the z-axis direction is connected to the connecting conductor 46. Thus, the connecting conductor 46 is electrically coupled to the reference ground conductor 22-2 and the auxiliary ground conductor 24-2 via the via-hole conductors b11 to b13 and the connecting conductor 45. The via-hole conductors b11, b13 may be formed preferably by providing an electrically-conductive paste including silver, tin, copper, or the like, into via holes formed in the dielectric sheets 18-2b to 18-2d and solidifying the paste.

The via-hole conductor b14 pierces through the connecting portion 42a of the dielectric sheet 18-2a in the z-axis direction as shown in FIG. 5 and FIG. 6. An end of the via-hole conductor b14 on the positive side in the z-axis direction is connected to the external terminal 16-1b. The other end of the via-hole conductor b14 on the negative side in the z-axis direction is connected to the connecting portion 22-2b. Thus, the external terminal 16-1b is electrically coupled to the reference ground conductor 22-2 via the via-hole conductor b14.

The via-hole conductor b15 pierces through the connecting portion 42a of the dielectric sheet 18-2a in the z-axis direction as shown in FIG. 5 and FIG. 6. An end of the via-hole conductor b15 on the positive side in the z-axis direction is connected to the external terminal 16-1c. The other end of the via-hole conductor b15 on the negative side in the z-axis direction is connected to the connecting portion 22-2b. Thus, the external terminal 16-1c is electrically coupled to the reference ground conductor 22-2 via the via-hole conductor b15.

The via-hole conductor b16 pierces through the connecting portion 42a of the dielectric sheet 18-2a in the z-axis direction as shown in FIG. 5 and FIG. 6. An end of the via-hole conductor b16 on the positive side in the z-axis direction is connected to the external terminal 16-1d. The other end of the via-hole conductor b16 on the negative side in the z-axis direction is connected to the connecting portion 22-2b. Thus, the external terminal 16-1c is electrically coupled to the reference ground conductor 22-2 via the via-hole conductor b16. The via-hole conductors b9 to b16 may be formed preferably by providing an electrically-conductive paste including silver, tin, copper, or the like, into via holes formed in the dielectric sheets 18-2a to 18-2d and solidifying the paste.

The external terminals 16-1a to 16-1d, the signal line 20-2, the reference ground conductor 22-2, the auxiliary ground conductor 24-2, and the connecting conductors 43 to 46 preferably have equal or substantially equal thicknesses. For example, the external terminals 16-1a to 16-1d, the signal line 20-2, the reference ground conductor 22-2, the auxiliary ground conductor 24-2, and the connecting conductors 43 to 46 preferably have thicknesses of about 10 μm to about 20 μm.

As described above, the signal line 20-2 is provided between the reference ground conductor 22-2 and the auxiliary ground conductor 24-2 which are provided at the opposite sides in the z-axis direction of the signal line 20-2. That is, the signal line 20-2, the reference ground conductor 22-2, and the auxiliary ground conductor 24-2 define a tri-plate stripline structure. The space (the distance in the z-axis direction) between the signal line 20-2 and the reference ground conductor 22-2 preferably is equal or approximately equal to the thickness T1 of the dielectric sheet 18-2b as shown in FIG. 6, and preferably is about 50 μm to about 300 μm, for example. In the present preferred embodiment, the space between the signal line 20-2 and the reference ground conductor 22-2 preferably is about 150 μm, for example. The space (the distance in the z-axis direction) between the signal line 20-2 and the auxiliary ground conductor 24-2 preferably is equal or approximately equal to the thickness T2 of the dielectric sheet 18-2c as shown in FIG. 6, and preferably is about 10 μm to about 100 μm, for example. In the present preferred embodiment, the space between the signal line 20-2 and the auxiliary ground conductor 24-2 preferably is about 50 μm, for example. Thus, the distance in the z-axis direction between the signal line 20-2 and the reference ground conductor 22-2 is greater than the distance in the z-axis direction between the signal line 20-2 and the auxiliary ground conductor 24-2.

The signal line portions 10-1, 10-2 which have the above-described configuration are joined together to define a single high-frequency signal line 10 as shown in FIG. 2. More specifically, as shown in FIG. 2 and FIG. 7, a portion of the top surface S1 at the end of the dielectric element assembly 12-1 on the negative side in the x-axis direction and a portion of the bottom surface S4 at the end of the dielectric element assembly 12-2 on the positive side in the y-axis direction are joined together. In the present preferred embodiment, a portion of the top surface S1 at the end of the dielectric element assembly 12-1 on the negative side in the x-axis direction and a portion of the bottom surface S4 at the end of the dielectric element assembly 12-2 on the positive side in the y-axis direction are welded together. Thus, the signal line portion 10-1 and the signal line portion 10-2 are joined together, and the joint portion of the dielectric element assembly 12-1 and the dielectric element assembly 12-2 includes a corner (a bent portion which is bent in a planar direction of the high-frequency signal line 10).

Further, as shown in FIG. 7, the via-hole conductor b1 is connected to the connecting conductor 44. Thus, the signal line 20-1 and the signal line 20-2 are electrically coupled together. The via-hole conductor b5 is connected to the connecting conductor 46. Thus, the reference ground conductors 22-1, 22-2 and the auxiliary ground conductors 24-1, 24-2 are electrically coupled together.

The signal line portion 10-3 preferably has the same or substantially the same configuration as the signal line portion 10-2. More specifically, the signal line portion 10-3 has a configuration of line symmetry with respect to the signal line portion 10-2 about a line extending in the y-axis direction so as to traverse the center in the x-axis direction of the signal line portion 10-2. Therefore, the connecting conductor 43 protrudes from the signal line 20-2 toward the negative side in the x-axis direction. The connecting conductor 44 is arranged so as to overlap with the connecting conductor 43 when viewed in plan in the z-axis direction. Therefore, the connecting conductors 45, are provided on the negative side in the x-axis direction relative to the connecting conductor 44 when viewed in plan in the z-axis direction.

Next, joining of the signal line portion 10-1 and the signal line portion 10-3 is described. As shown in FIG. 2, a portion of the top surface S1 at the end of the dielectric element assembly 12-1 on the positive side in the x-axis direction and a portion of the bottom surface S6 at the end of the dielectric element assembly 12-3 on the positive side in the y-axis direction are joined together. In the present preferred embodiment, a portion of the top surface S1 at the end of the dielectric element assembly 12-1 on the positive side in the x-axis direction and a portion of the bottom surface S6 at the end of the dielectric element assembly 12-3 on the positive side in the y-axis direction are welded together. Thus, the signal line portion 10-1 and the signal line portion 10-3 are joined together, and the joint portion of the dielectric element assembly 12-1 and the dielectric element assembly 12-3 includes a corner (a bent portion which is bent in a planar direction of the high-frequency signal line 10).

Further, the via-hole conductor b3 is connected to the connecting conductor 44. Thus, the signal line 20-1 and the signal line 20-2 are electrically coupled together. The via-hole conductor b6 is connected to the connecting conductor 46. Thus, the reference ground conductors 22-1, 22-2 and the auxiliary ground conductors 24-1, 24-2 are electrically coupled together.

As described above, the signal line portions 10-1 to 10-3 are joined together such that the high-frequency signal line 10 has a " ⊐ "-shape as shown in FIG. 1.

In the high-frequency signal line 10 that has the above-described configuration, the characteristic impedances of the signal lines 20-1, 20-2 periodically vary between impedance Z1 and impedance Z2. More specifically, in the section A1 where the signal lines 20-1, 20-2 overlap with the openings 30-1, 30-2, relatively small capacitance is generated between the signal lines 20-1, 20-2 and the auxiliary ground conductors 24-1, 24-2. Therefore, the characteristic impedances of the signal lines 20-1, 20-2 in the section A1 are relatively high impedance Z1.

On the other hand, in the section A2 where the signal lines 20-1, 20-2 overlap with the bridge portions 60-1, 60-2, relatively large capacitance is generated between the signal lines 20-1, 20-2 and the auxiliary ground conductors 24-1, 24-2. Therefore, the characteristic impedances of the signal lines 20-1, 20-2 in the section A2 are relatively low impedance Z2. The section A1 and the section A2 are alternately arranged in the x-axis direction. Thus, the characteristic impedances of the signal lines 20-1, 20-2 periodically vary between impedance Z1 and impedance Z2. The impedance Z1 preferably is about 55Ω, for example, and the impedance Z2 preferably is about 45Ω, for example. The average characteristic impedance across the entire signal lines 20-1, 20-2 preferably is about 50Ω, for example.

Figure 8:
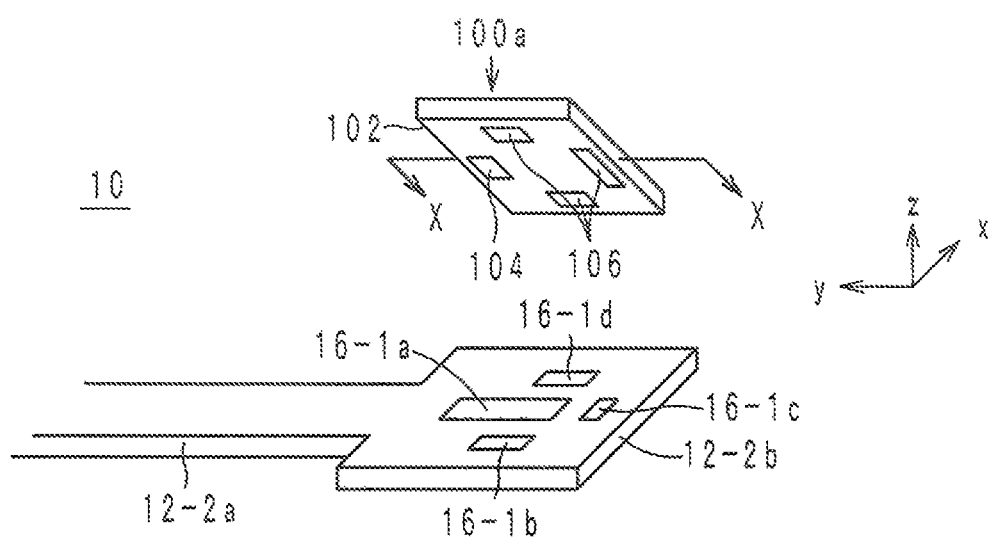
FIG. 8 is an external perspective view of a connector of the high-frequency signal line.
Figure 9:
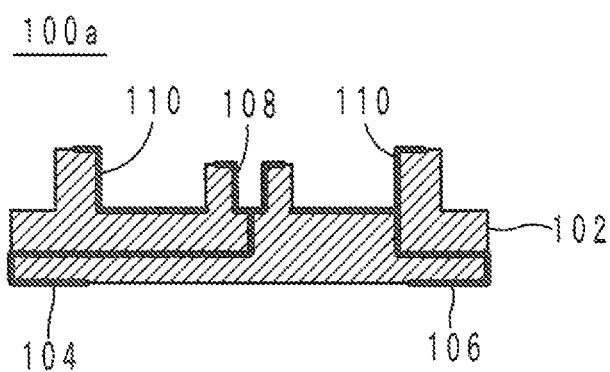
FIG. 9 is a cross-sectional structure view of the connector of the high-frequency signal line.

The connectors 100a, 100b are mounted on the top surfaces of the connecting portions 12-2b, 12-3b, respectively, as shown in FIG. 1. Since the connectors 100a, 100b have the same configuration, the configuration of the connector 100a is described below as an example. FIG. 8 is an external perspective view of the connector 100a of the high-frequency signal line 10. FIG. 9 is a cross-sectional structure view of the connector 100a of the high-frequency signal line 10.

The connector 100a includes a connector body 102, external terminals 104, 106, a center conductor 108, and an external conductor 110 as shown in FIG. 1, FIG. 8, and FIG. 9. The connector body 102 includes a rectangular or substantially rectangular plate member and a cylindrical member coupled thereon, and is made of an insulating material such as resins.

The external terminal 104 is provided at a position on a surface of the plate member of the connector body 102 on the negative side in the z-axis direction so as to face the external terminal 16-1a. The external terminal 106 is provided at a position on the surface of the plate member of the connector body 102 on the negative side in the z-axis direction so as to correspond to the external terminals 16-1b to 16-1d.

The center conductor 108 is provided at the center of the cylindrical member of the connector body 102 and is connected to the external terminal 104. The center conductor 108 is a signal terminal through which high-frequency signals are to be input/output. The external conductor 110 is provided on the inner circumferential surface of the cylindrical member of the connector body 102, and is connected to the external terminal 106. The external conductor 110 is a ground terminal to be kept at a ground potential.

The connector 100a thus configured is mounted on the top surface of the connecting portion 12-2b such that the external terminal 104 is connected to the external terminal 16-1a and the external terminal 106 is connected to the external terminals 16-1b to 16-1d as shown in FIG. 8 and FIG. 9. As a result, the signal lines 20-1, 20-2 are electrically coupled to the center conductor 108. The reference ground conductors 22-1, 22-2 and the auxiliary ground conductors 24-1, 24-2 are electrically coupled to the external conductor 110.

The high-frequency signal line 10 is used as described below. FIG. 10 is a perspective view of an electronic device 200 including the high-frequency signal line 10. In FIG. 10, the top-to-bottom direction is defined as Z-axis direction. The longitudinal direction of the electronic device 200 when viewed in plan in the Z-axis direction is defined as X-axis direction. The transverse direction of the electronic device 200 when viewed in plan in the Z-axis direction is defined as Y-axis direction.

The electronic device 200 includes the high-frequency signal line 10, circuit boards 202a, 202b, a battery pack (metallic body) 206, and a housing 210.

The circuit board 202a includes, for example, a transmission or reception circuit including an antenna. The circuit board 202b includes, for example, a power circuit. The battery pack 206 is, for example, a lithium-ion rechargeable battery, and the surface of the battery pack 206 is covered with a metal cover. The circuit board 202a, the battery pack 206, and the circuit board 202b are arranged in this order, from the negative side to the positive side in the X-axis direction.

Unshown receptacles are provided on the principal surfaces of the circuit boards 202a, 202b which are on the positive side in the Z-axis direction. The receptacles are connected to the connectors 100a, 100b (although not shown in FIG. 10). With this arrangement, high-frequency signals to be transmitted between the circuit boards 202a, 202b at a frequency of, for example, 2 GHz are applied to the center conductors 108 of the connectors 100a, 100b via the receptacles. Moreover, the external conductors 110 of the connectors 100a, 100b are kept at a ground potential via the circuit boards 202a, 202b and the receptacles. With this arrangement, the high-frequency signal line 10 defines a connection between the circuit boards 202a, 202b.

Here, the top surface S1 of the dielectric element assembly 12-1 is in contact with a lateral surface of the battery pack 206 on the negative side in the Y-axis direction. The dielectric element assembly 12 and the battery pack 206 are secured together by an adhesive agent, or the like. Therefore, the reference ground conductors 22-1, 22-2 in a solid form, which do not have an opening, are present between the signal lines 20-1, 20-2 and the battery pack 206.

Figure 11:
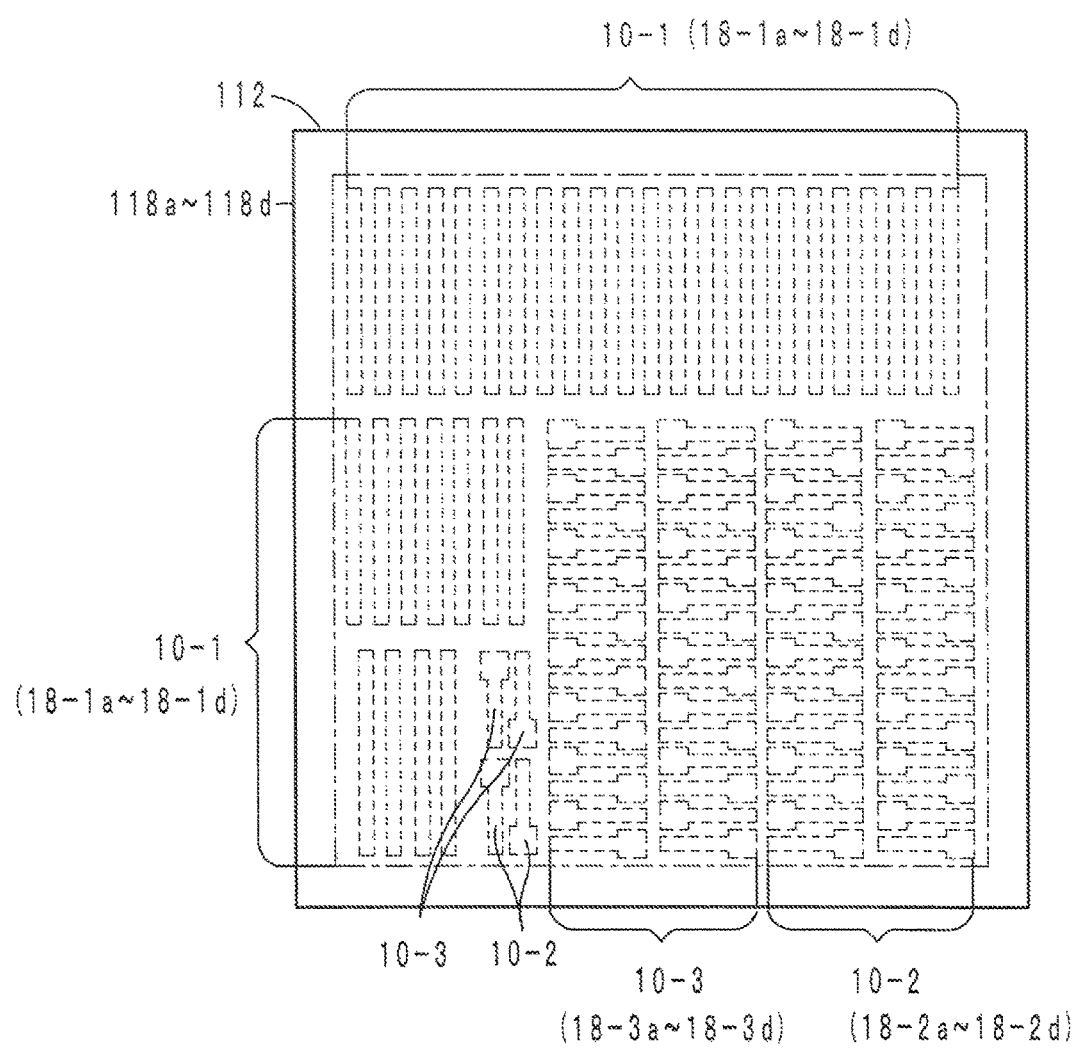
FIG. 11 is a plan view of a mother laminate.

Hereinafter, a non-limiting example of a manufacturing method of the high-frequency signal line 10 is described with reference to the drawings. FIG. 11 is a plan view of a mother dielectric element assembly 112. FIG. 12 through FIG. 16 are cross-sectional views of the high-frequency signal line 10 in the steps of compression bonding.

First, through the steps which will be described below, the signal line portions 10-1 to 10-3 are formed in a matrix arrangement over the mother dielectric element assembly 112 that is formed by laminating mother dielectric sheets 118a to 118d as shown in FIG. 11.

First, a mother dielectric sheet 118c is prepared which is made of a thermoplastic resin, with one of its principal surfaces being entirely covered with a copper foil (metal film). Specifically, a copper foil is adhered onto one of the principal surfaces of the mother dielectric sheet 118c. Further, the copper-foiled surface of the mother dielectric sheet 118c is, for example, galvanized for anti-corrosion purposes and is thus smoothened. The mother dielectric sheet 118c is made of a liquid crystal polymer. The thickness of the copper foil preferably is about 10 µm to about 20 µm.

Then, mother dielectric sheets 118a, 118d are prepared which are made of a thermoplastic resin, with both principal surfaces being entirely covered with a copper foil (metal film). Specifically, a copper foil is adhered onto both principal surfaces of the mother dielectric sheets 118a, 118d. Further, the copper-foiled surfaces of the mother dielectric sheets 118a, 118d are, for example, galvanized for anti-corrosion purposes and are thus smoothened. The mother dielectric sheets 118a, 118d are made of a liquid crystal polymer. The thickness of the copper foil preferably is about 10 µm to about 20 µm.

Then, the copper foil formed on the top surface of the mother dielectric sheet 118a is patterned, such that the external terminals 16-1a to 16-1d shown in FIG. 5 and the external terminals 16-1a to 16-1d of the signal line portion 10-3 are formed on the top surface of the mother dielectric sheet 118a. Further, the copper foil formed on the bottom surface of the mother dielectric sheet 118a is patterned, such that the reference ground conductors 22-1, 22-2 and the connecting conductors 25a, 25b shown in FIG. 3 and FIG. 5 and the reference ground conductor 22-2 and the connecting conductors 25a, 25b of the signal line portion 10-3 are formed on the bottom surface of the mother dielectric sheet 118a. In this step, as shown in FIG. 11, on the top surface of the mother dielectric sheet 118a, the external terminals 16-1a to 16-1d are formed at the positions where the dielectric sheet 18-2a is to be formed. Likewise, on the top surface of the mother dielectric sheet 118a, the external terminals 16-1a to 16-1d of the signal line portion 10-3 are formed at the positions where the dielectric sheet 18-3a is to be formed. Likewise, on the bottom surface of the mother dielectric sheet 118a, the reference ground conductor 22-1 and the connecting conductors 25a, 25b are formed at the positions where the dielectric sheet 18-1a is to be formed. Likewise, on the bottom surface of the mother dielectric sheet 118a, the reference ground conductor 22-2 is formed at the position where the dielectric sheet 18-2a is to be formed. Specifically, a resist which has the same shape as the external terminals 16-1a to 16-1d shown in FIG. 5 and the external terminals 16-1a to 16-1d of the signal line portion 10-3 is printed on the copper foil on the top surface of the mother dielectric sheet 118a. Further, a resist which has the same shape as the reference ground conductors 22-1, 22-2 shown in FIG. 5 and the connecting conductors 25a, 25b is printed on the copper foil on the bottom surface of the mother dielectric sheet 118a. Then, etching is performed on the copper foil such that portions of the copper foil which are not covered with the resist are removed. Thereafter, a resist solution is sprayed to remove the resist. In this way, the external terminals 16-1a to 16-1d shown in FIG. 5 and the external terminals 16-1a to 16-1d of the signal line portion 10-3 are photolithographically formed on the top surface of the mother dielectric sheet 118a, and the reference ground conductors 22-1, 22-2 shown in FIG. 3 and FIG. 5, and the reference ground conductor 22-2 of the signal line portion 10-3, and the connecting conductors 25a, 25b are photolithographically formed on the bottom surface of the mother dielectric sheet 118a.

Then, the signal lines 20-1, 20-2 shown in FIG. 3 and FIG. 5, the signal line 20-2 of the signal line portion 10-3, the connecting conductor 43, and the connecting conductor 20-2 of the signal line portion 10-3 (not shown) are formed on the top surface of the mother dielectric sheet 118c. Further, the auxiliary ground conductors 24-1, 24-2 shown in FIG. 3 and FIG. 5, the auxiliary ground conductor 24-2 of the signal line portion 10-3, the connecting conductor 45, and the connecting conductor 45 of the signal line portion 10-3 are formed on the top surface of the mother dielectric sheet 118d, while the connecting conductors 44, 46 and the connecting conductors 44, 46 of the signal line portion 10-3 (not shown) are formed on the bottom surface of the mother dielectric sheet 118d. Note that the formation process of the signal line 20-1 and the like is the same as that of the external terminals 16-1a to 16-1d, and therefore, the description thereof is herein omitted.

Then, portions of the mother dielectric sheets 118a to 118d at which the via-hole conductors b2, b4, b7 to b16, B1-1, B2-1, B3-1, B4-1, B1-2, B2-2, B3-2, B4-2 are to be formed are irradiated with a laser beam such that through holes are formed. Then, an electrically-conductive paste is provided into the through holes to form the via-hole conductors b2, b4, b7 to b16, B1-1, B2-1, B3-1, B4-1, B1-2, B2-2, B3-2, B4-2. Note that, in this step, the via-hole conductors b1, b3, b5, b6 are not formed.

Figure 12:
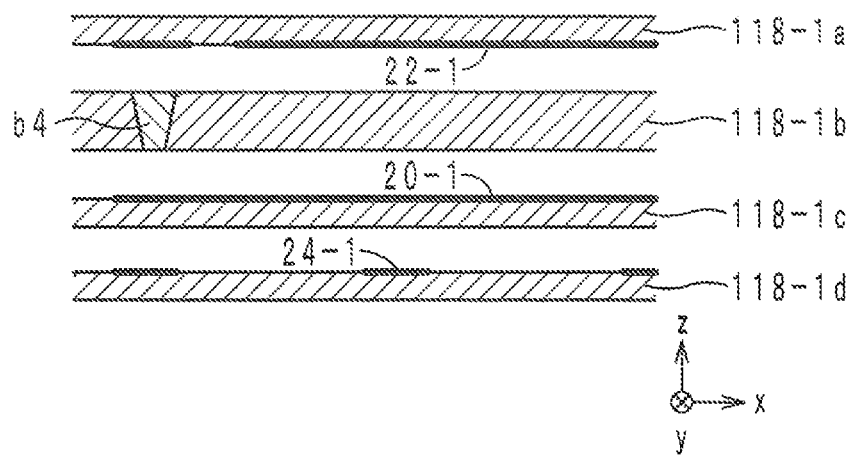
FIG. 12 is a cross-sectional view of the high-frequency signal line in a step of compression bonding.
Figure 13:
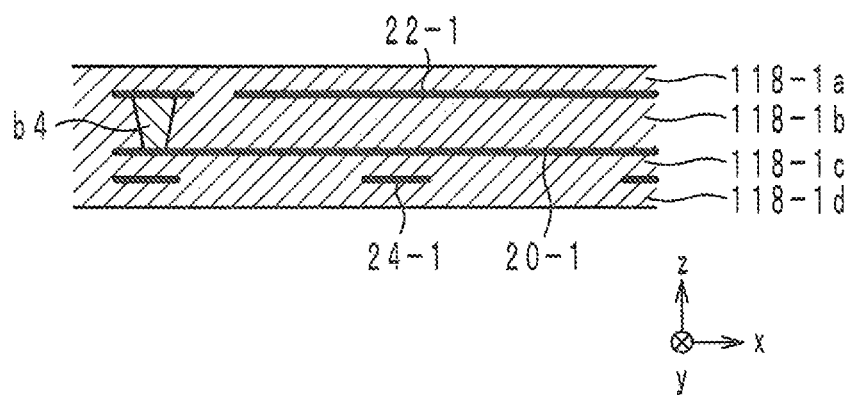
FIG. 13 is a cross-sectional view of the high-frequency signal line in a step of compression bonding.

Then, as shown in FIG. 12 and FIG. 13, the mother dielectric sheets 118a to 118d are laminated in this order from the positive side to the negative side in the z-axis direction, and the resultant structure is subjected to the compression bonding and heating processes. In this step, uncured via-hole conductors b2, b4, b7 to b16, B1-1, B2-1, B3-1, B4-1, B1-2, B2-2, B3-2, B4-2 are solidified so that the via-hole conductors b2, b4, b7 to b16, B1-1, B2-1, B3-1, B4-1, B1-2, B2-2, B3-2, B4-2 are formed. Further, the mother dielectric sheets 118a to 118d are softened and melted so that the mother dielectric sheets 118a to 118d are united together, such that the mother dielectric element assembly 112 is formed.

After formation of the mother dielectric element assembly 112, as shown in FIG. 14, portions of the mother dielectric element assembly 112 at which the via-hole conductors b1, b3, b5, b6 are to be formed are irradiated with a laser beam such that through holes are formed. Then, as shown in FIG. 15, an electrically-conductive paste is provided into the through holes to form uncured via-hole conductors b1, b3, b5, b6. Through the above steps, the process of forming the signal line portions 10-1 to 10-3 in a matrix arrangement over the mother dielectric element assembly 112 formed by laminating the mother dielectric sheets 118a to 118d is completed.

Then, the mother dielectric element assembly 112 is stamped (cut) out, such that a plurality of signal line portions 10-1 to 10-3 are obtained. Through the above steps, the process of forming the signal line portions 10-1 to 10-3 is completed.

Figure 16:
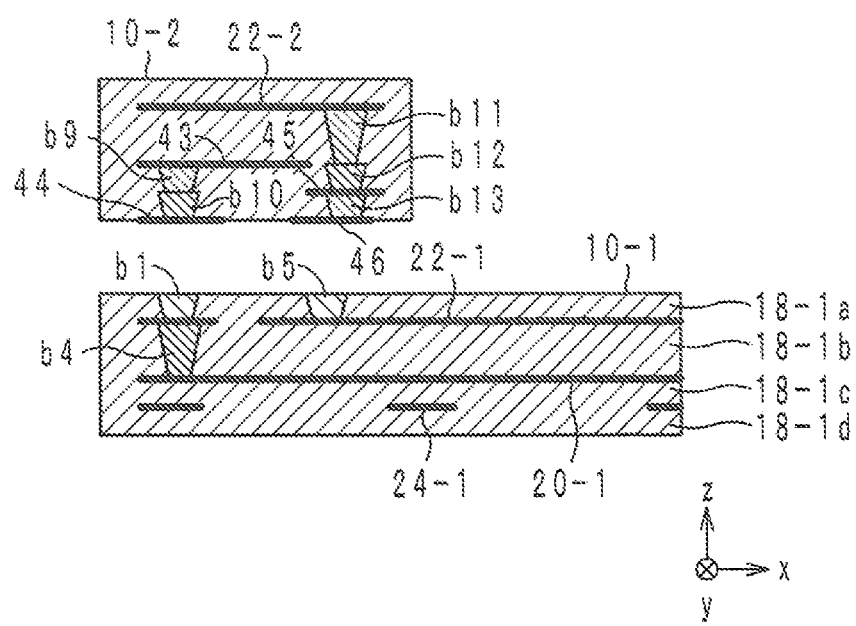
FIG. 16 is a cross-sectional view of the high-frequency signal line in a step of compression bonding.

Then, as shown in FIG. 16, the signal line portion 10-1 and the signal line portion 10-2 are joined together such that the joint portion of the signal line portion 10-1 and the signal line portion 10-2 includes a corner (a bent portion which is bent in a planar direction of the high-frequency signal line 10). Specifically, a portion of the top surface S1 at the end of the dielectric element assembly 12-1 on the negative side in the x-axis direction and a portion of the bottom surface S4 at the end of the dielectric element assembly 12-2 on the positive side in the y-axis direction are arranged so as to face each other, and these portions are subjected to the heating process and the compression process such that they are joined together. In this step, the via-hole conductor b1 and the connecting conductor 44 are connected together, and the via-hole conductor b5 and the connecting conductor 46 are connected together. Then, the heating process is performed to solidify uncured via-hole conductors b1, b5, such that the via-hole conductors b1, b5 are formed. And, an alloy is formed at the connecting portion of the via-hole conductor b1 and the connecting conductor 44, and an alloy is formed at the connecting portion of the via-hole conductor b5 and the connecting conductor 46. As a result, the signal line 20-1 and the signal line 20-2 are electrically coupled together, and the reference ground conductors 22-1, 22-2 and the auxiliary ground conductors 24-1, 24-2 are electrically coupled together. Further, a portion of the top surface S1 at the end of the dielectric element assembly 12-1 on the negative side in the x-axis direction and a portion of the bottom surface S4 at the end of the dielectric element assembly 12-2 on the positive side in the y-axis direction are softened and melted so that these portions are welded together. Note that the step of joining together the signal line portion 10-1 and the signal line portion 10-3 is the same as the step of joining together the signal line portion 10-1 and the signal line portion 10-2, and therefore, the description thereof is herein omitted.

Lastly, the connectors 100a, 100b are mounted onto the connecting portions 12-2b, 12-3b using a solder. As a result, the high-frequency signal line 10 shown in FIG. 1 is obtained.

Figure 17:
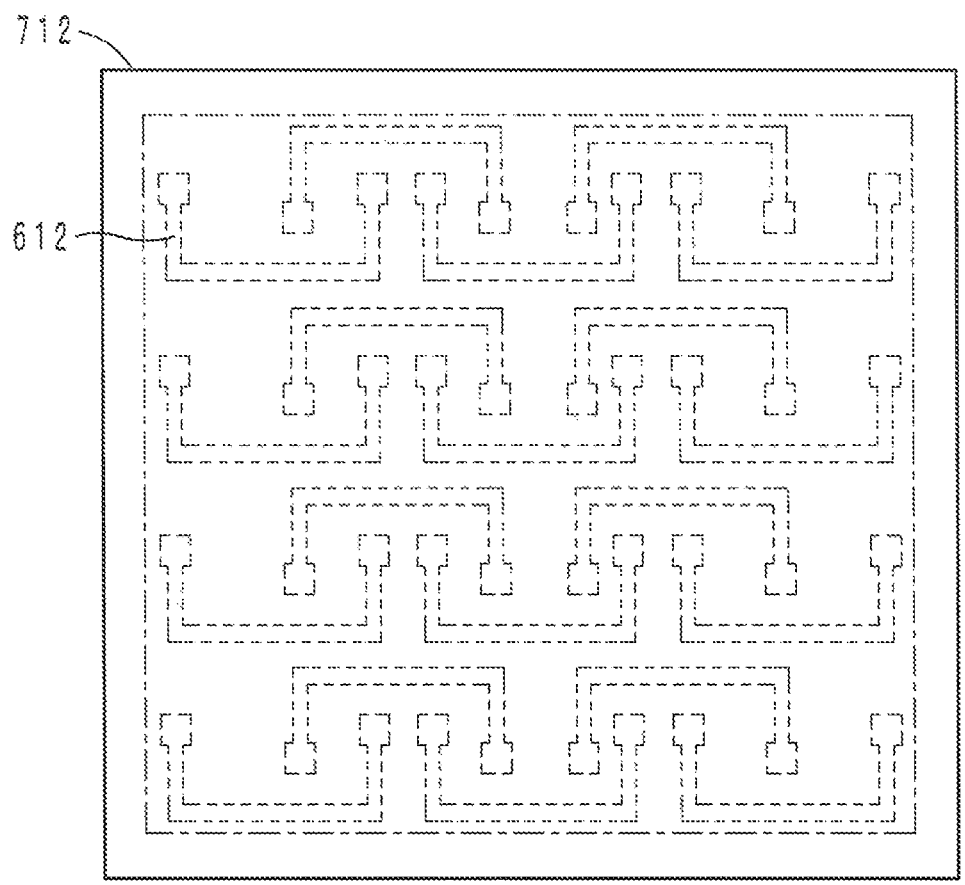
FIG. 17 is a plan view of a mother laminate in manufacture of a dielectric element assembly of a high-frequency signal line according to a comparative example.

According to the non-limiting example of a manufacturing method of the high-frequency signal line 10 that has the above-described configuration, the manufacturing cost of the high-frequency signal line 10 that has a bent configuration is significantly reduced. FIG. 17 is a plan view of a mother laminate 712 in manufacture of a dielectric element assembly 612 of a high-frequency signal line according to a comparative example.

The high-frequency signal line of the comparative example has a " ⊐ " -shape as shown in FIG. 17 and is not divided into the plurality of signal line portions 10-1 to 10-3 as in the high-frequency signal line 10. In manufacture of the high-frequency signal line of the comparative example which has such a configuration, there are large spaces between adjacent dielectric element assemblies 612 in the mother laminate 712 because the dielectric element assemblies 612 have corners. Accordingly, the number of high-frequency signal lines obtained from a single mother laminate 712 decreases, and the manufacturing cost of the high-frequency signal lines increases.

In view of such circumstances, the high-frequency signal line 10 is configured so as to be divisible into the signal line portions 10-1 to 10-3. The signal line portion 10-1 and the signal line portion 10-2 are joined together such that the joint portion of the signal line portion 10-1 and the signal line portion 10-2 includes a corner. Likewise, the signal line portion 10-1 and the signal line portion 10-3 are joined together such that the joint portion of the signal line portion 10-1 and the signal line portion 10-3 includes a corner. Thus, the corners preferably are formed in the high-frequency signal line after the stamping process is performed on the mother dielectric element assembly 112 to obtain the signal line portions 10-1 to 10-3. Therefore, as shown in FIG. 11, the signal line portions 10-1 to 10-3 are capable of being formed in a matrix arrangement over the mother dielectric element assembly 112 with the spaces between adjacent signal line portions 10-1 to 10-3 being reduced. In the present preferred embodiment, the signal line portions 10-1 to 10-3 preferably have a linear shape, and therefore, the spaces between adjacent signal line portions 10-1 to 10-3 are further reduced. Thus, in the high-frequency signal line 10 and the manufacturing method thereof, a larger number of high-frequency signal lines 10 is obtained from a single mother dielectric element assembly 112. As a result, according to the high-frequency signal line 10 and the manufacturing method thereof, the manufacturing cost of the high-frequency signal line 10 that has a bent configuration is significantly reduced.

In the high-frequency signal line 10 and the manufacturing method thereof, the via-hole conductor b1 and the connecting conductor 44 are connected together, and the via-hole conductor b5 and the connecting conductor 46 are connected together. In connecting these elements, uncured via-hole conductors b1, b5 which are kept in contact with the connecting conductors 44, 46, respectively, are subjected to the heating process and the compression process. In this way, the via-hole conductors b1, b5 are solidified so that alloy layers are formed at the connecting portions of the via-hole conductors b1, b5 and the connecting conductors 44, 46. Therefore, the via-hole conductors b1, b5 and the connecting conductors 44, 46 are more strongly connected.

In the high-frequency signal line 10 and the manufacturing method thereof, the signal line portion 10-1 and the signal line portions 10-2, 10-3 are welded together. Therefore, according to the high-frequency signal line 10 and the manufacturing method thereof, the signal line portion 10-1 and the signal line portions 10-2, 10-3 are more strongly joined.

In the high-frequency signal line 10 and the manufacturing method thereof, connection of the via-hole conductors b1, b5 and the connecting conductors 44, 46 and welding of the signal line portion 10-1 and the signal line portion 10-2 preferably are carried out in the same step. Therefore, in the high-frequency signal line 10 and the manufacturing method thereof, the manufacturing process is simplified.

According to the high-frequency signal line 10, a significant reduction in thickness is realized. More specifically, in the high-frequency signal line 10, in the section A1, the signal lines 20-1, 20-2 do not overlap with the auxiliary ground conductors 24-1, 24-2 when viewed in plan in the z-axis direction. Therefore, capacitance is unlikely to be generated between the signal lines 20-1, 20-2 and the auxiliary ground conductors 24-1, 24-2. Thus, even when the distance in the z-axis direction between the signal lines 20-1, 20-2 and the auxiliary ground conductors 24-1, 24-2 is reduced, the capacitance generated between the signal lines 20-1, 20-2 and the auxiliary ground conductors 24-1, 24-2 is not excessively large. Thus, the characteristic impedance of the signal lines 20-1, 20-2 is unlikely to deviate from a predetermined characteristic impedance (e.g., about 50Ω). As a result, the thickness is significantly reduced while the characteristic impedance of the high-frequency signal line 10 is maintained at a predetermined characteristic impedance.

According to the high-frequency signal line 10, when the high-frequency signal line 10 is adhered to a metallic body such as the battery pack 206, variation in the characteristic impedance of the signal lines 20-1, 20-2 is prevented. More specifically, the high-frequency signal line 10 is adhered to the battery pack 206 such that the reference ground conductors 22-1, 22-2 in a solid form are provided between the signal lines 20-1, 20-2 and the battery pack 206. With this arrangement, the signal lines 20-1, 20-2 and the battery pack 206 would not face each other via an opening, so that generation of capacitance between the signal lines 20-1, 20-2 and the battery pack 206 is prevented. As a result, even when the high-frequency signal line 10 is adhered to the battery pack 206, a decrease of the characteristic impedance of the signal lines 20-1, 20-2 is prevented.

Hereinafter, a non-limiting example of a manufacturing method of the high-frequency signal line 10 according to a modification of a preferred embodiment of the present invention is described with reference to the drawings. FIG. 18 through FIG. 20 are cross-sectional views of a high-frequency signal line 10a in the steps of compression bonding.

In the non-limiting example of a manufacturing method of the high-frequency signal line 10 according to the above-described preferred embodiment, as shown in FIG. 14, after the step of laminating the mother dielectric sheets 118a to 118d to form the dielectric element assembly 12-1, through holes are formed in the dielectric element assembly 12-1, and moreover, an electrically-conductive paste is provided into the through holes to form uncured via-hole conductors b1, b3, b5, b6. On the other hand, in the manufacturing method of the high-frequency signal line 10 according to the present modification, as shown in FIG. 18, uncured via-hole conductors b1, b3, b5, b6 are formed before the step of laminating the mother dielectric sheets 118a to 118d to form the mother dielectric element assembly 112 (i.e., the dielectric element assembly 12-1). That is, after through holes are formed in the mother dielectric sheet 118a, an electrically-conductive paste is provided into the through holes to form uncured via-hole conductors b1, b3, b5, b6.

Further, as shown in FIG. 19, the heating process and the compression process are performed on the mother dielectric sheet 118a in which uncured via-hole conductors b1, b3, b5, b6 have been formed and the mother dielectric sheets 118b to 118c, such that the mother dielectric element assembly 112 is formed. In the compression bonding step (the step of forming the dielectric element assembly 12-1), the heating process is performed at a temperature such that the uncured via-hole conductors b1, b3, b5, b6 (i.e., the electrically-conductive paste) would not solidify. Through the above steps, the step of forming the mother dielectric element assembly 112 (the dielectric element assembly 12-1) is completed.

Then, the mother dielectric element assembly 112 is stamped (cut) out, such that a plurality of signal line portions 10-1 to 10-3 are obtained. Through the above steps, the process of forming the signal line portions 10-1 to 10-3 is completed.

Then, as shown in FIG. 20, the signal line portion 10-1 and the signal line portion 10-2 are joined together such that the joint portion of the signal line portion 10-1 and the signal line portion 10-2 includes a corner. Specifically, a portion of the top surface S1 at the end of the dielectric element assembly 12-1 on the negative side in the x-axis direction and a portion of the bottom surface S4 at the end of the dielectric element assembly 12-2 on the positive side in the y-axis direction are arranged so as to face each other, and these portions are subjected to the heating process and the compression process such that they are joined together. In this step, the via-hole conductor b1 and the connecting conductor 44 are connected together, and the via-hole conductor b5 and the connecting conductor 46 are connected together. Then, the heating process is performed to solidify uncured via-hole conductors b1, b5, such that the via-hole conductors b1, b5 are formed. Moreover, an alloy is formed at the connecting portion of the via-hole conductor b1 and the connecting conductor 44, and an alloy is formed at the connecting portion of the via-hole conductor b5 and the connecting conductor 46. As a result, the signal line 20-1 and the signal line 20-2 are electrically coupled together, and the reference ground conductors 22-1, 22-2 and the auxiliary ground conductors 24-1, 24-2 are electrically coupled together. Further, a portion of the top surface S1 at the end of the dielectric element assembly 12-1 on the negative side in the x-axis direction and a portion of the bottom surface S4 at the end of the dielectric element assembly 12-2 on the positive side in the y-axis direction are softened and melted so that these portions are welded together. Note that the step of joining together the signal line portion 10-1 and the signal line portion 10-3 is the same as the step of joining together the signal line portion 10-1 and the signal line portion 10-2, and therefore, the description thereof is herein omitted.

According to the non-limiting example of a manufacturing method of the high-frequency signal line 10 according to a modification of a preferred embodiment of the present invention, uncured via-hole conductors b1, b3, b5, b6 are formed before the step of laminating the mother dielectric sheets 118a to 118d to form the mother dielectric element assembly 112 (i.e., the dielectric element assembly 12-1). Thus, uncured via-hole conductors b1, b3, b5, b6 are formed in the mother dielectric sheet 118a. Therefore, it is not necessary to form through holes in the dielectric element assembly 12-1 after the lamination and provide the electrically-conductive paste therein. Thus, according to the manufacturing method of the high-frequency signal line 10, the manufacturing process of the high-frequency signal line 10 is simplified.

Hereinafter, a high-frequency signal line according to the first modification of a preferred embodiment of the present invention is described with reference to the drawings. FIG. 21 is a plan view of a high-frequency signal line 10a according to the first modification when viewed in plan in the z-axis direction. Note that the connectors 100a, 100b are omitted from FIG. 21.

The high-frequency signal line 10a is different from the high-frequency signal line 10 in the shape of the high-frequency signal line 10a and the shape of the signal line portions 10-2, 10-3. More specifically, in the high-frequency signal line 10, the signal line portions 10-2, 10-3 extend from both ends of the signal line portion 10-1 toward the negative side in the y-axis direction. On the other hand, in the high-frequency signal line 10a, the signal line portion 10-2 extends from an end of the signal line portion 10-1 on the negative side in the x-axis direction toward the negative side in the y-axis direction while the signal line portion 10-3 extends from the other end of the signal line portion 10-1 on the positive side in the x-axis direction toward the positive side in the y-axis direction.

In the high-frequency signal line 10, in the signal line portions 10-2, 10-3, the width in the x-axis direction of the connecting portions 12-2b, 12-3b is greater than the width in the x-axis direction of the line portions 12-2a, 12-2b. On the other hand, in the high-frequency signal line 10a, the signal line portions 10-2, 10-3 preferably have a uniform or substantially uniform width in the x-axis direction. The signal line portion 10-2 and the signal line portion 10-3 have the same configuration. The other components of the high-frequency signal line 10a are the same as those of the high-frequency signal line 10, and therefore, the description thereof is herein omitted.

Next, a non-limiting example of a manufacturing method of the high-frequency signal line 10a is described. FIG. 22 is a plan view of a mother dielectric element assembly 112a. FIG. 23 is a plan view of a mother dielectric element assembly 112b, 112c.

As previously described, the signal line portions 10-1 to 10-3 preferably have a uniform or substantially uniform width. Therefore, as shown in FIG. 22, the signal line portions 10-1 can be formed in a matrix arrangement over the mother dielectric element assembly 112a without making any gaps. Likewise, as shown in FIG. 23, the signal line portions 10-2, 10-3 can be formed in a matrix arrangement over the mother dielectric element assembly 112b, 112c without making any gaps. With these arrangements, a larger number of signal line portions 10-1 to 10-3 is obtained from the mother dielectric element assemblies 112a to 112c. The manufacturing cost of the high-frequency signal line 10a is significantly reduced effectively.

Figure 24:
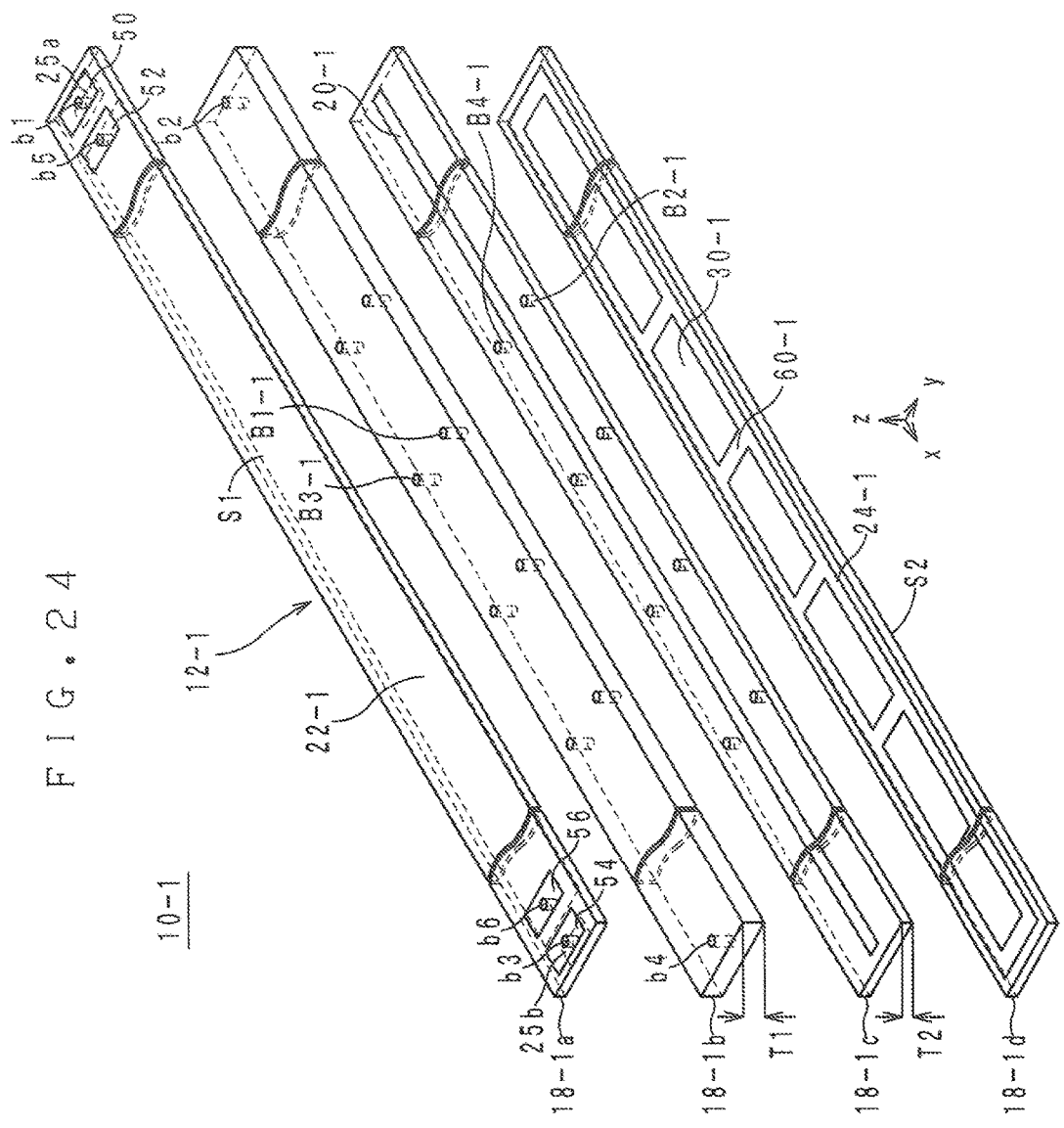
FIG. 24 is an exploded perspective view of a signal line portion of a high-frequency signal line.
Figure 25:
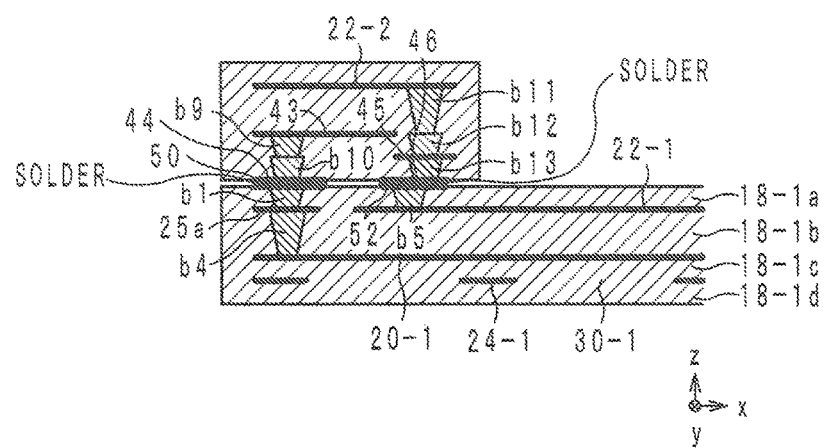
FIG. 25 is a cross-sectional structure view of the high-frequency signal line taken along line A-A.

Hereinafter, a high-frequency signal line according to a second modification of a preferred embodiment of the present invention is described with reference to the drawings. FIG. 24 is an exploded perspective view of a signal line portion 10-1 of a high-frequency signal line 10b. FIG. 25 is a cross-sectional structure view of the high-frequency signal line 10b taken along line A-A. FIG. 1 and FIG. 2 are referred to herein for the external perspective view and exploded perspective view of the high-frequency signal line 10b.

The high-frequency signal line 10b is different from the high-frequency signal line 10 in that connecting conductors 50, 52, 54, 56 are provided and in terms of the method of joining together the signal line portions 10-1 to 10-3.

The connecting conductor 50 preferably is a rectangular or substantially rectangular conductor which is provided on a portion of the top surface S1 at the end of the dielectric element assembly 12-1 on the negative side in the x-axis direction as shown in FIG. 24. The end of the via-hole conductor b1 on the positive side in the z-axis direction is connected to the connecting conductor 50. Thus, the connecting conductor 50 is electrically coupled to the signal line 20-1.

The connecting conductor 52 preferably is a rectangular or substantially rectangular conductor which is provided on a portion of the top surface S1 at the end of the dielectric element assembly 12-1 on the negative side in the x-axis direction as shown in FIG. 24. The connecting conductor 52 is provided on the positive side in the x-axis direction relative to the connecting conductor 50. The end of the via-hole conductor b5 on the positive side in the z-axis direction is connected to the connecting conductor 52. Thus, the connecting conductor 52 is electrically coupled to the reference ground conductor 22-1.

The connecting conductor 54 preferably is a rectangular or substantially rectangular conductor which is provided on a portion of the top surface S1 at the end of the dielectric element assembly 12-1 on the positive side in the x-axis direction as shown in FIG. 24. The end of the via-hole conductor b3 on the positive side in the z-axis direction is connected to the connecting conductor 54. Thus, the connecting conductor 54 is electrically coupled to the signal line 20-1.

The connecting conductor 56 preferably is a rectangular or substantially rectangular conductor which is provided on a portion of the top surface S1 at the end of the dielectric element assembly 12-1 on the positive side in the x-axis direction as shown in FIG. 24. The connecting conductor 56 is provided on the negative side in the x-axis direction relative to the connecting conductor 50. The end of the via-hole conductor b6 on the positive side in the z-axis direction is connected to the connecting conductor 56. Thus, the connecting conductor 56 is electrically coupled to the reference ground conductor 22-1.

Further, as shown in FIG. 25, the connecting conductor 50 is connected to the connecting conductor 44 by soldering. The connecting conductor 52 is connected to the connecting conductor 46 by soldering. Note that, in the high-frequency signal line 10b, the signal line portion 10-1 and the signal line portion 10-2 are not welded together. Note that FIG. 25 shows a small gap between the top surface S1 of the dielectric element assembly 12-1 and the bottom surface S4 of the dielectric element assembly 12-2 for easy understanding of provision of the solder although, in actuality, the top surface S1 of the dielectric element assembly 12-1 and the bottom surface S4 of the dielectric element assembly 12-2 are in contact with each other.

Note that the signal line portion 10-3 has a configuration of line symmetry with respect to the signal line portion 10-2 about a line extending in the y-axis direction so as to traverse the center in the x-axis direction of the signal line portion 10-2. The joining of the signal line portion 10-1 and the signal line portion 10-3 is the same as the joining of the signal line portion 10-1 and the signal line portion 10-2, and therefore, the description thereof is herein omitted.

In the high-frequency signal line 10b that has the above-described configuration, the signal line portions 10-1 to 10-3 are joined together by soldering. Therefore, in joining the signal line portions 10-1 to 10-3, compression bonding of these elements is not necessary.

Figure 26:
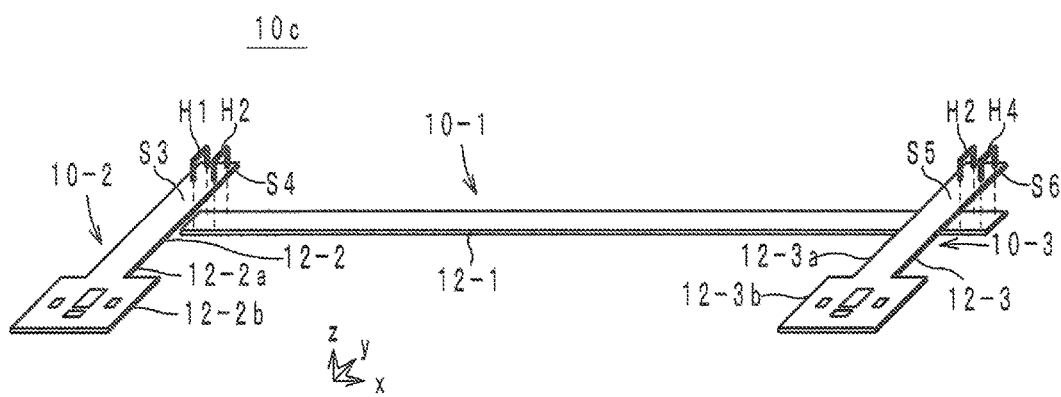
FIG. 26 is an exploded perspective view of signal line portions of a high-frequency signal line according to the third modification.
Figure 27:
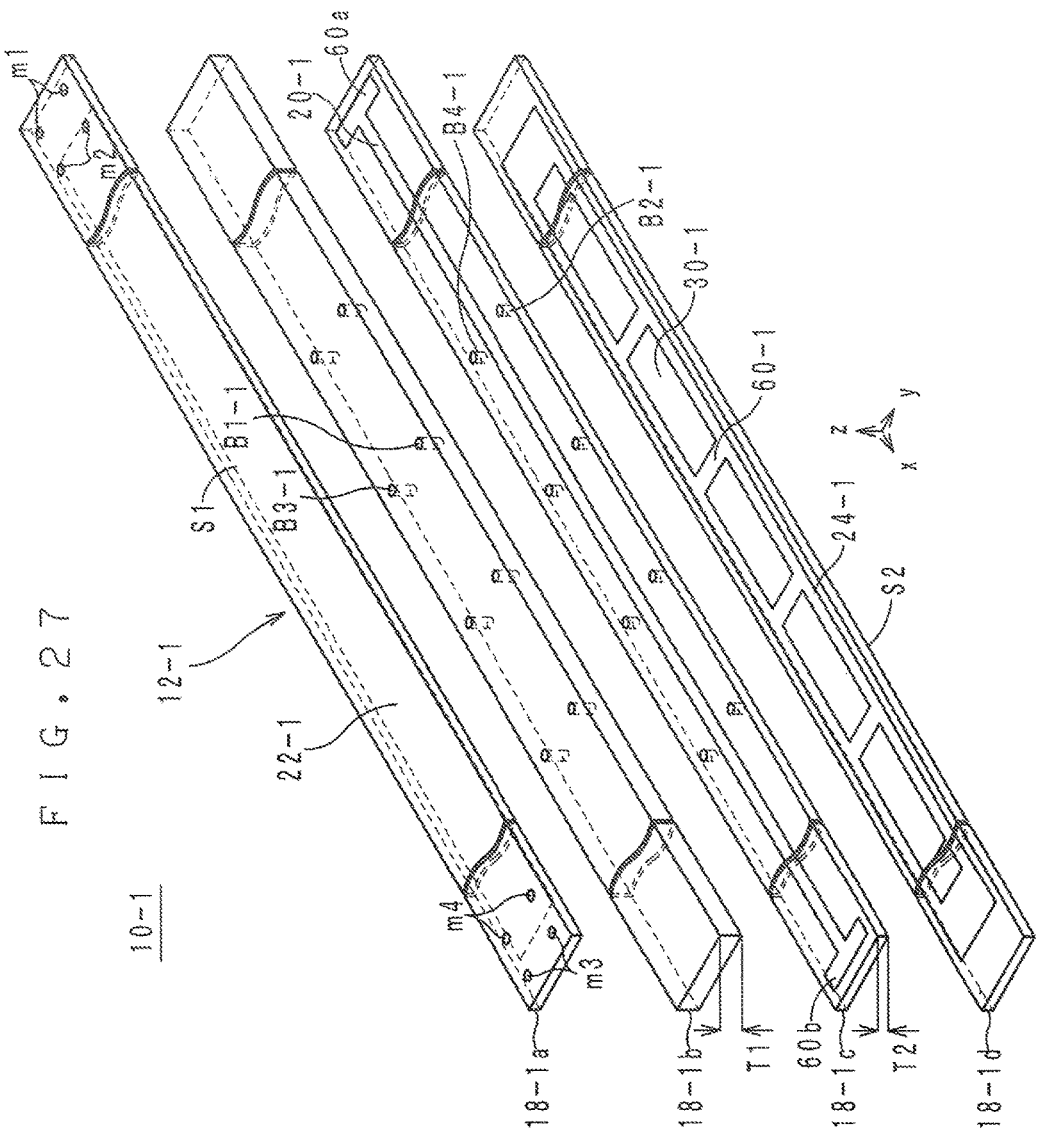
FIG. 27 is an exploded perspective view of a signal line portion of the high-frequency signal line.
Figure 28:
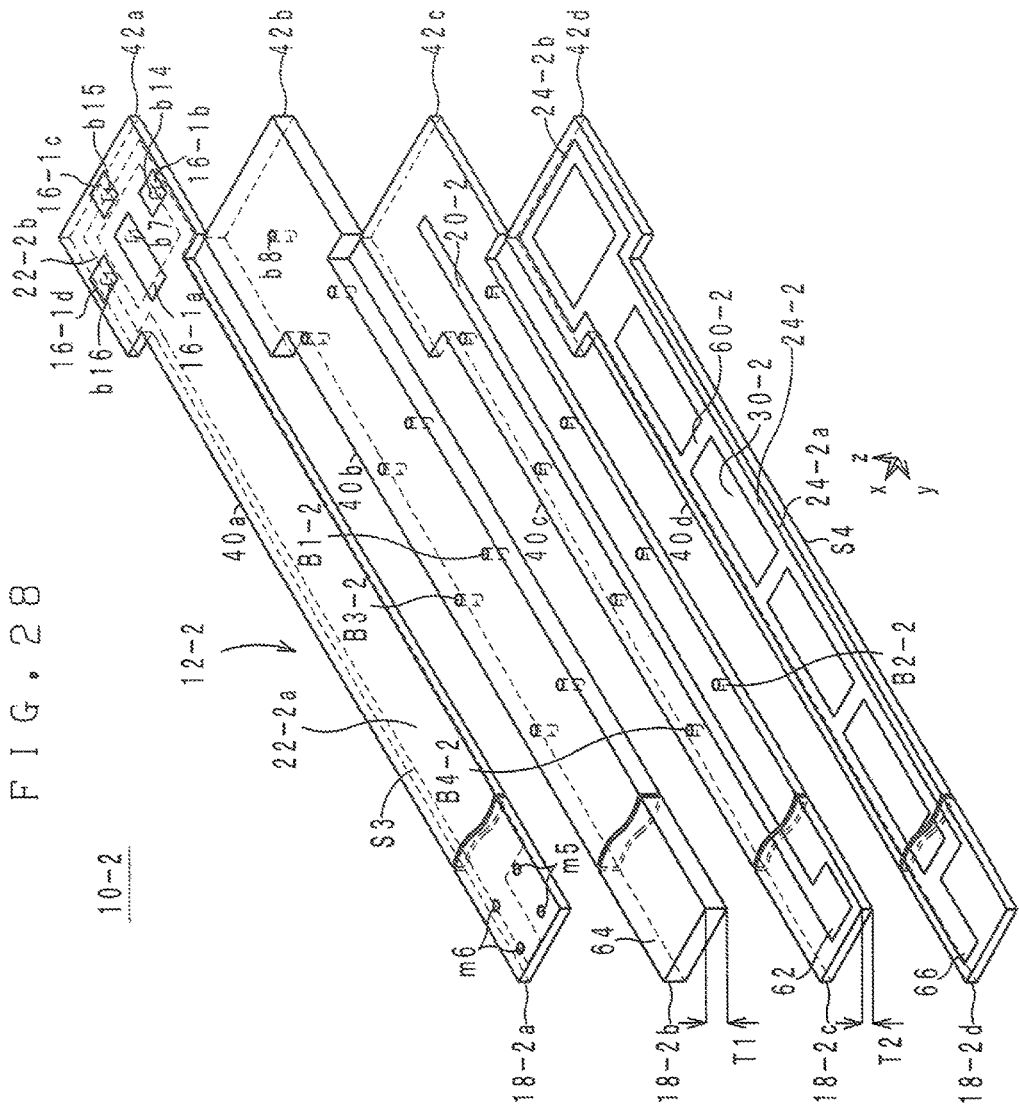
FIG. 28 is an exploded perspective view of another signal line portion of the high-frequency signal line.
Figure 29:
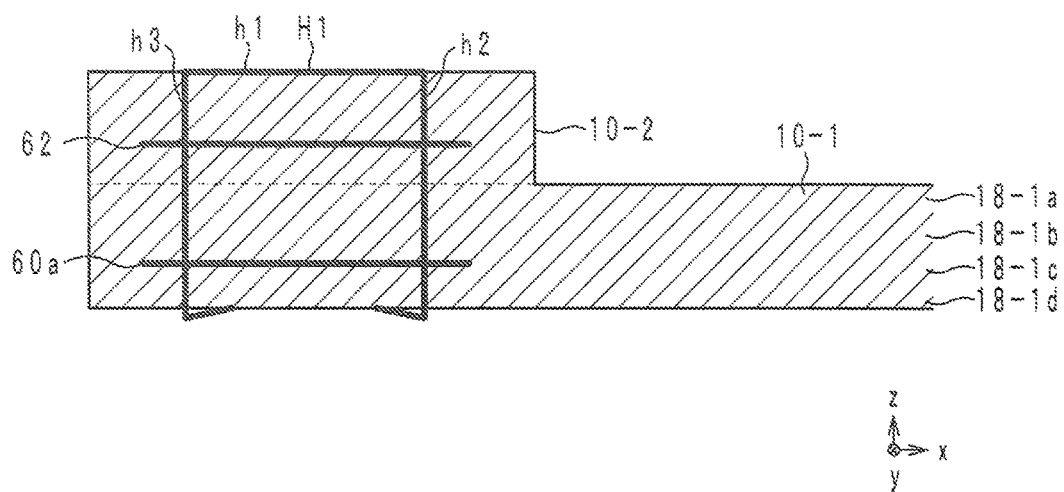
FIG. 29 is a cross-sectional structure view of a joint portion of a signal line portion and another signal line portion of the high-frequency signal line.

Hereinafter, a high-frequency signal line according to a third modification of a preferred embodiment of the present invention is described with reference to the drawings. FIG. 26 is an exploded perspective view of signal line portions 10-1 to 10-3 of a high-frequency signal line 10c according to the third modification. FIG. 27 is an exploded perspective view of the signal line portion 10-1 of the high-frequency signal line 10c. FIG. 28 is an exploded perspective view of the signal line portion 10-2 of the high-frequency signal line 10c. FIG. 29 is a cross-sectional structure view of a joint portion of the signal line portion 10-1 and the signal line portion 10-2 of the high-frequency signal line 10c. FIG. 1 is referred to herein for the external perspective view of the high-frequency signal line 10b.

The high-frequency signal line 10c is different from the high-frequency signal line 10 in that the signal line portion 10-1 and the signal line portion 10-2 are joined together by wire conductors H1, H2 as shown in FIG. 26.

The signal line portion 10-1 of the high-frequency signal line 10c includes connecting conductors 60a, 60b instead of the via-hole conductors b1 to b6 and the connecting conductors 25a, 25b as shown in FIG. 27. The connecting conductor 60a is provided on a portion of the top surface of the dielectric sheet 18-1c at the end of the dielectric sheet 18-1c on the negative side in the x-axis direction, and is connected to the end of the signal line 20-1 on the negative side in the x-axis direction. The connecting conductor 60a preferably has a rectangular or substantially rectangular shape elongated in the y-axis direction. The connecting conductor 60b is provided on a portion of the top surface of the dielectric sheet 18-1c at the end of the dielectric sheet 18-1c on the positive side in the x-axis direction, and is connected to the end of the signal line 20-1 on the positive side in the x-axis direction. The connecting conductor 60b preferably has a rectangular or substantially rectangular shape elongated in the y-axis direction. Each of the connecting conductors 60a, 60b does not overlap with the reference ground conductor 22-1 or the auxiliary ground conductor 24-1 when viewed in plan in the z-axis direction.

The signal line portion 10-1 preferably includes marks m1 to m4. Each of the marks m1 to m4 preferably includes two circle marks which are provided on the top surface of the dielectric sheet 18-1a. The marks m1 overlap with the connecting conductor 60a when viewed in plan in the z-axis direction and are arranged in the y-axis direction. The marks m2 overlap with the end of the reference ground conductor 22-1 on the negative side in the x-axis direction when viewed in plan in the z-axis direction and are arranged in the y-axis direction. The marks m3 overlap with the connecting conductor 60b when viewed in plan in the z-axis direction and are arranged in the y-axis direction. The marks m4 overlap with the end of the reference ground conductor 22-1 on the positive side in the x-axis direction when viewed in plan in the z-axis direction and are arranged in the y-axis direction.

The signal line portion 10-2 of the high-frequency signal line 10c includes connecting conductors 62, 64, 66 instead of the via-hole conductors b9 to b13 and the connecting conductors 43 to 46. The connecting conductor 62 is provided on a portion of the top surface of the dielectric sheet 18-2c at the end of the dielectric sheet 18-2c on the positive side in the y-axis direction, and is connected to the end of the signal line 20-2 on the positive side in the y-axis direction. The connecting conductor 62 preferably has a rectangular or substantially rectangular shape protruding from the end of the signal line 20-2 on the positive side in the y-axis direction toward the negative side in the x-axis direction. The connecting conductor 62 does not overlap with the reference ground conductor 22-2 or the auxiliary ground conductor 24-2 when viewed in plan in the z-axis direction.

The connecting conductor 64 is provided on a portion of the top surface of the dielectric sheet 18-2b at the end of the dielectric sheet 18-2b on the positive side in the y-axis direction. The connecting conductor 64 is connected to an end of the reference ground conductor 22-2 on the positive side in the y-axis direction.

The connecting conductor 66 is provided on a portion of the top surface of the dielectric sheet 18-2d at the end of the dielectric sheet 18-2d on the positive side in the y-axis direction. The connecting conductor 66 is connected to the end of the auxiliary ground conductor 24-2 on the positive side in the y-axis direction. The connecting conductors 64, 66 overlap with each other when viewed in plan in the z-axis direction. Note that, however, the connecting conductors 64, 66 do not overlap with the connecting conductor 62 when viewed in plan in the z-axis direction. The connecting conductors 64, 66 are positioned on the positive side in the x-axis direction relative to the connecting conductor 62.

The signal line portion 10-2 preferably includes marks m5, m6. Each of the marks m5, m6 preferably includes two circle marks which are provided on the top surface of the dielectric sheet 18-2a. The marks m5 overlap with the connecting conductor 62 when viewed in plan in the z-axis direction and are arranged in the y-axis direction. The marks m6 overlap with the connecting conductors 64, 66 when viewed in plan in the z-axis direction and are arranged in the y-axis direction.

The wire conductors H1, H2 are realized by, as shown in FIG. 26 and FIG. 29, bending " ⊐ "-shaped conductors as shown in FIG. 29, and have the same configuration as staples. More specifically, the wire conductors H1, H2 include an engagement portion h1 and penetrating portions h2, h3. The penetrating portions h2, h3 extend in the z-axis direction and penetrate through the dielectric element assemblies 12-1, 12-2. The engagement portion h1 extends in the x-axis direction and connects to ends of the penetrating portions h2, h3 on the positive side in the z-axis direction. The wire conductors H1, H2 are produced by bending a single wire.

The wire conductor H1 is attached to the signal line portions 10-1, 10-2 so as to penetrate through the marks m1, m5. That is, the marks m1, m5 indicate the attachment positions of the penetrating portions h2, h3 of the wire conductor H1. The penetrating portions h2, h3 of the wire conductor H1 stick into the dielectric element assemblies 12-1, 12-2 and penetrate through the connecting conductors 60a, 62. Thus, the signal line 20-1 and the signal line 20-2 are electrically coupled together. Leading ends of the penetrating portions h2, h3 of the wire conductor H1 on the negative side in the z-axis direction are bent at the bottom surface S2 of the dielectric element assembly 12-1. The engagement portion h1 is bent at the top surface S3 relative to the penetrating portions h1, h2. In this way, the dielectric element assembly 12-1 and the dielectric element assembly 12-2 are joined together such that they are not easily disengaged.

The wire conductor H2 is attached to the signal line portions 10-1, 10-2 so as to penetrate through the marks m2, m6. That is, the marks m2, m6 indicate the attachment positions of the penetrating portions h2, h3 of the wire conductor H2. The penetrating portions h2, h3 of the wire conductor H2 stick into the dielectric element assemblies 12-1, 12-2 and penetrate through the connecting conductors 64, 66, the reference ground conductor 22-1, and the auxiliary ground conductor 24-1. Thus, the reference ground conductors 22-1, 22-2 and the auxiliary ground conductors 24-1, 24-2 are electrically coupled together. Leading ends of the penetrating portions h2, h3 of the wire conductor H2 on the negative side in the z-axis direction are bent at the bottom surface S2 of the dielectric element assembly 12-1. The engagement portion h1 is bent at the top surface S3 relative to the penetrating portions h1, h2. In this way, the dielectric element assembly 12-1 and the dielectric element assembly 12-2 are joined together such that they are not easily disengaged.

Next, a non-limiting example of a manufacturing method of the high-frequency signal line 10d is described. The manufacturing method of the high-frequency signal line 10d is different from the manufacturing method of the high-frequency signal line 10 in the step of joining together the top surface S1 of the signal line portion 10-1 and the bottom surface S4 of the signal line portion 10-2. Thus, the step of joining together the top surface S1 of the signal line portion 10-1 and the bottom surface S4 of the signal line portion 10-2 is now described.

First, the wire conductor H1 is stuck into the dielectric element assembly 12-1 and the dielectric element assembly 12-2 using the marks m5 as alignment marks so as to penetrate through the connecting conductor 60a that is electrically coupled to the signal line 20-1 and through the connecting conductor 62 that is electrically coupled to the signal line 20-1. Then, the ends of the wire conductor H1 on the negative side in the z-axis direction are bent. In this step, the wire conductor H1 is stuck so as not to penetrate through the via-hole conductors provided in the signal line portions 10-1, 10-2.

Meanwhile, the wire conductor H2 is stuck into the dielectric element assembly 12-1 and the dielectric element assembly 12-2 using the marks m6 as alignment marks so as to penetrate through the connecting conductor 64 that is electrically coupled to the reference ground conductor 22-1, the auxiliary ground conductor 24-1, and the reference ground conductor 22-2 and through the connecting conductor 66 that is electrically coupled to the auxiliary ground conductor 24-2. Then, the ends of the wire conductor H2 on the negative side in the z-axis direction are bent. In this step, the wire conductor H2 is stuck so as not to penetrate through the via-hole conductors provided in the signal line portions 10-1, 10-2.

In the high-frequency signal line 10c that has the above-described configuration and the manufacturing method thereof, the wire conductors H1, H2 enable joining of the signal line portion 10-1 and the signal line portion 10-2 and electrical coupling of the signal line 20-1 and the signal line 20-2, and at the same time, enable electrical coupling of the reference ground conductors 22-1, 22-2 and the auxiliary ground conductors 24-1, 24-2. Thus, in the high-frequency signal line 10c, it is not necessary to form the via-hole conductors b1, b3, b5, b6 in the signal line portion 10-1, and compression bonding of the signal line portion 10-1 and the signal line portion 10-2 is not necessary. That is, in the high-frequency signal line 10c and the manufacturing method thereof, the manufacturing process is greatly simplified.

Figure 30:
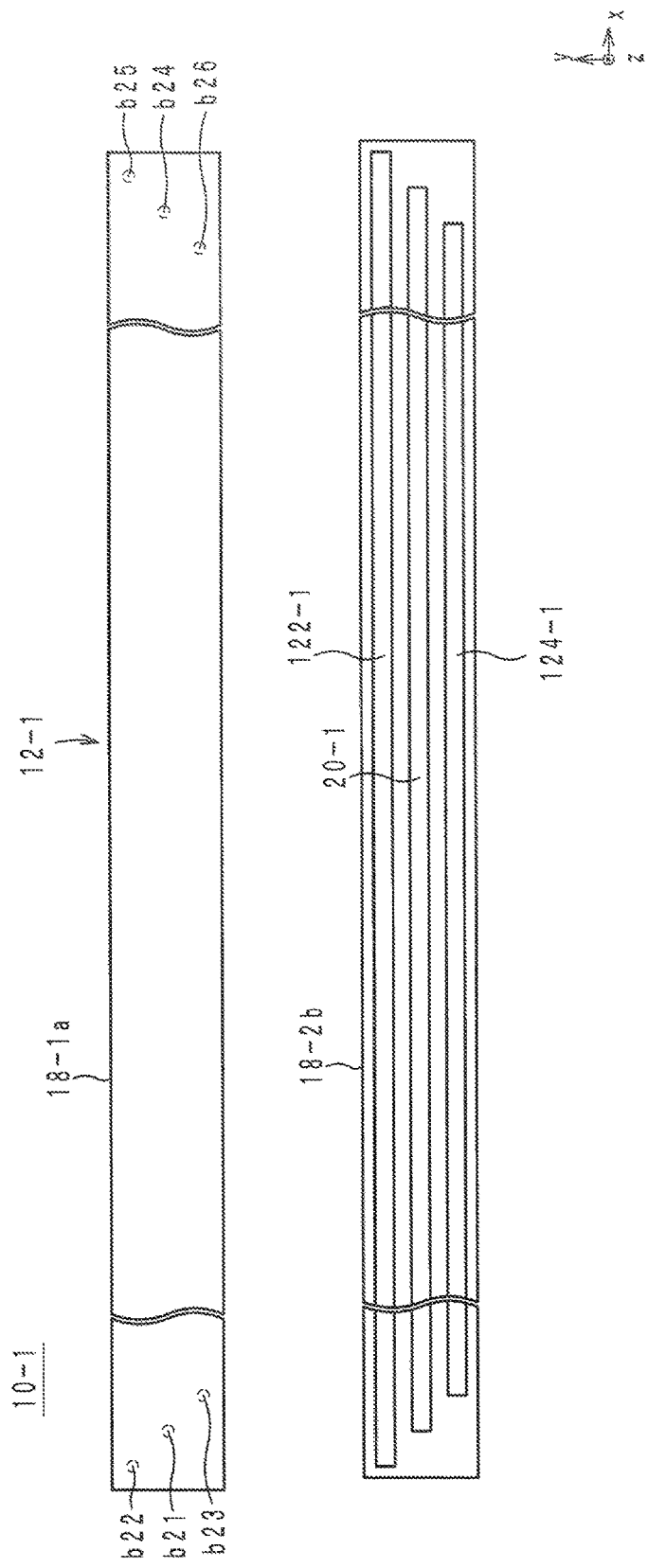
FIG. 30 is an exploded view of a signal line portion of a high-frequency signal line.
Figure 31:
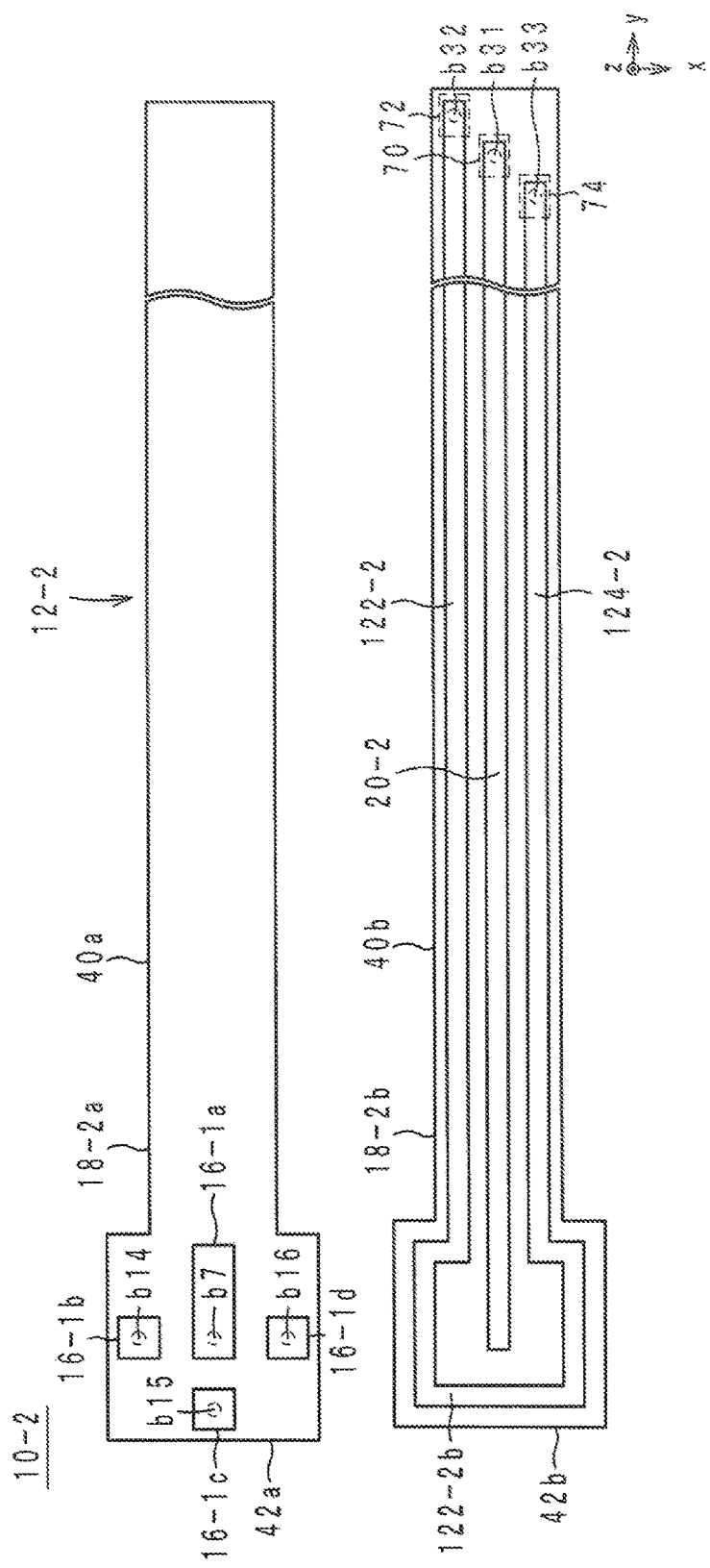
FIG. 31 is an exploded view of a signal line portion of the high-frequency signal line.

Hereinafter, a high-frequency signal line according to a fourth modification of a preferred embodiment of the present invention is described with reference to the drawings. FIG. 30 is an exploded view of a signal line portion 10-1. FIG. 31 is an exploded view of a signal line portion 10-2 of the high-frequency signal line 10d. FIG. 1 is referred to herein for the external perspective view of the signal line 10d.

The signal line 10d is different from the high-frequency signal line 10 in that the signal line 10d has a coplanar configuration. More specifically, the signal line portion 10-1 of the signal line 10d has ground conductors 122-1, 124-1 instead of the auxiliary ground conductor 24-1 and the reference ground conductor 22-1 as shown in FIG. 30. The signal line 20-1 and the ground conductors 122-1, 124-1 are provided on the top surface of the dielectric sheet 18-1b so as to extend in the x-axis direction. The signal line 20-1 is provided between the ground conductors 122-1, 124-1 which are provided at the opposite sides in the y-axis direction of the signal line 20-1. The ground conductor 122-1 is provided on the positive side in the y-axis direction relative to the signal line 20-1. The ground conductor 124-1 is provided on the negative side in the y-axis direction relative to the signal line 20-1.

An end of the ground conductor 122-1 on the negative side in the x-axis direction is positioned on the negative side in the x-axis direction relative to the end of the signal line 20-1 on the negative side in the x-axis direction. The end of the signal line 20-1 on the negative side in the x-axis direction is positioned on the negative side in the x-axis direction relative to an end of the ground conductor 124-1 on the negative side in the x-axis direction.

An end of the ground conductor 122-1 on the positive side in the x-axis direction is positioned on the positive side in the x-axis direction relative to the end of the signal line 20-1 on the positive side in the x-axis direction. The end of the signal line 20-1 on the positive side in the x-axis direction is positioned on the positive side in the x-axis direction relative to an end of the ground conductor 124-1 on the positive side in the x-axis direction.

The dielectric sheet 18-1a includes via-hole conductors b21 to b26. Ends of the via-hole conductors b21 to b23 on the positive side in the z-axis direction are exposed at a portion of the top surface S1 at the end of the dielectric element assembly 12-1 on the negative side in the x-axis direction. The other ends of the via-hole conductors b21 to b23 on the negative side in the z-axis direction are respectively connected to the ends of the signal line 20-1 and the ground conductors 122-1, 124-1 on the negative side in the x-axis direction. Ends of the via-hole conductors b24 to b26 on the positive side in the z-axis direction are exposed at a portion of the top surface S1 at the end of the dielectric element assembly 12-1 on the positive side in the x-axis direction. The other ends of the via-hole conductors b24 to b26 on the negative side in the z-axis direction are respectively connected to the ends of the signal line 20-1 and the ground conductors 122-1, 124-1 on the positive side in the x-axis direction.

In the signal line portion 10-2 of the high-frequency signal line 10d, a signal line 20-2 and ground conductors 122-2, 124-2 are provided on the top surface of the dielectric sheet 18-2b so as to extend in the y-axis direction as shown in FIG. 31. The signal line 20-2 is provided between the ground conductors 122-2, 124-2 which are provided at the opposite sides in the x-axis direction of the signal line 20-2.

An end of the ground conductor 122-2 on the positive side in the y-axis direction is positioned on the positive side in the y-axis direction relative to the end of the signal line 20-2 on the positive side in the y-axis direction. The end of the signal line 20-2 on the positive side in the y-axis direction is positioned on the positive side in the y-axis direction relative to an end of the ground conductor 124-2 on the positive side in the y-axis direction.

The bottom surface of the dielectric sheet 18-2b is provided with connecting conductors 70, 72, 74. The connecting conductor 70 overlaps with the end of the signal line 20-2 on the positive side in the y-axis direction when viewed in plan in the z-axis direction. The connecting conductor 72 overlaps with the end of the ground conductor 122-2 on the positive side in the y-axis direction when viewed in plan in the z-axis direction. The connecting conductor 74 overlaps with the end of the ground conductor 124-2 on the positive side in the y-axis direction when viewed in plan in the z-axis direction.

The dielectric sheet 18-2b includes via-hole conductors b31 to b33. The via-hole conductor b31 connects the end of the signal line 20-2 on the positive side in the y-axis direction to the connecting conductor 70. The via-hole conductor b32 connects the end of the ground conductor 122-2 on the positive side in the y-axis direction to the connecting conductor 72. The via-hole conductor b33 connects the end of the ground conductor 124-2 on the positive side in the y-axis direction to the connecting conductor 74.

The signal line portion 10-1 and the signal line portion 10-2 of the high-frequency signal line 10d are welded together in the same way as the signal line portion 10-1 and the signal line portion 10-2 of the high-frequency signal line 10a. The via-hole conductors b21 to b23 are respectively connected to the connecting conductors 70, 72, 74. In this way, the signal line portion 10-1 and the signal line portion 10-2 are joined together. Note that the signal line portion 10-3 has a configuration of line symmetry with respect to the signal line portion 10-2 about a line extending in the y-axis direction so as to traverse the center in the x-axis direction of the signal line portion 10-2.

Figure 32:
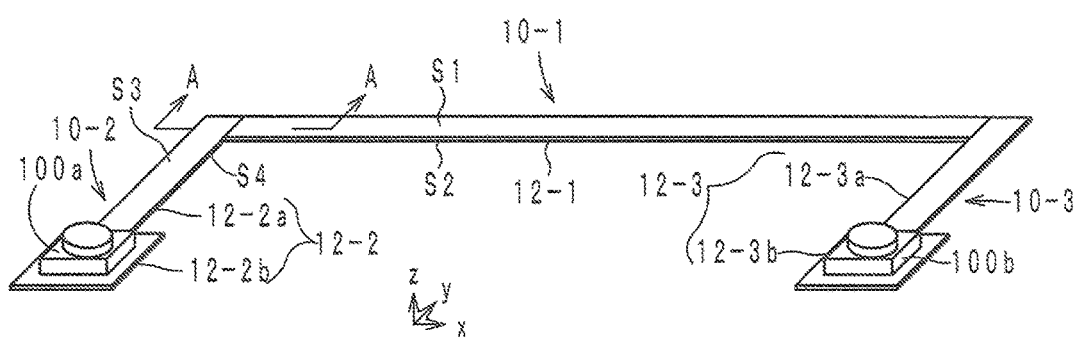
FIG. 32 is an external perspective view of a high-frequency signal line according to a fifth modification of a preferred embodiment of the present invention.
Figure 35B:
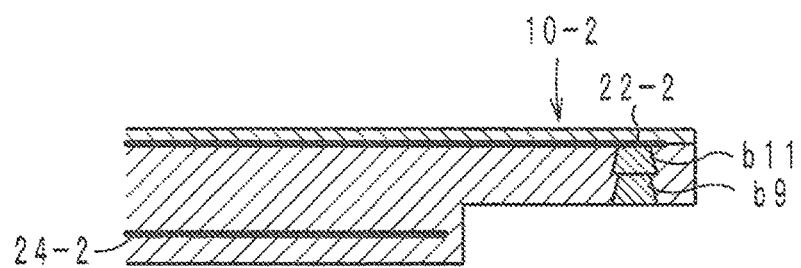
FIG. 35B is a cross-sectional structure view of the signal line portion of the high-frequency signal line.
Figure 36:
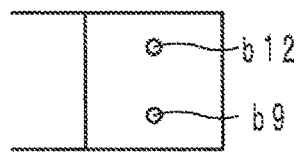
FIG. 36 is a plan view of an end of the signal line portion on the negative side in the y-axis direction.

Hereinafter, a high-frequency signal line according to a fifth modification of a preferred embodiment of the present invention is described with reference to the drawings. FIG. 32 is an external perspective view of a high-frequency signal line 10e according to the fifth modification. FIG. 33A is an exploded view of a signal line portion 10-1 of the high-frequency signal line 10e. FIG. 33B is a cross-sectional structure view of the signal line portion 10-1 of the high-frequency signal line 10e. FIG. 34 is a plan view of an end of the signal line portion 10-1 on the negative side in the x-axis direction. FIG. 35A is an exploded view of a signal line portion 10-2 of the high-frequency signal line 10e. FIG. 35B is a cross-sectional structure view of the signal line portion 10-2 of the high-frequency signal line 10e. FIG. 36 is a plan view of an end of the signal line portion 10-2 on the negative side in the y-axis direction. FIG. 37 is a cross-sectional structure view of the high-frequency signal line 10e of FIG. 32 taken along line A-A.

The high-frequency signal line 10e includes signal line portions 10-1 to 10-3 as shown in FIG. 32.

The signal line portion 10-1 is formed preferably by laminating a resist layer 17-1 and dielectric sheets 18-1a to 18-1d as shown in FIG. 33A. The resist layer 17-1 is a resin layer. The top surface of the dielectric sheet 18-1b is provided with a reference ground conductor 22-1. The top surface of the dielectric sheet 18-1c is provided with a signal line 20-1 and connecting conductors 80a, 80b. The top surface of the dielectric sheet 18-1d is provided with an auxiliary ground conductor 24-1. The signal line 20-1, the reference ground conductor 22-1, and the auxiliary ground conductor 24-1 of the high-frequency signal line 10e have the same configuration as the signal line 20-1, the reference ground conductor 22-1, and the auxiliary ground conductor 24-1 of the high-frequency signal line 10, and therefore, the description thereof is herein omitted. The connecting conductor 80a preferably is a rectangular or substantially rectangular conductor and is provided on the negative side in the x-axis direction relative to the signal line 20-1. The connecting conductor 80b preferably is a rectangular or substantially rectangular conductor and is provided on the positive side in the x-axis direction relative to the signal line 20-1.

The via-hole conductors B1-1, B3-1 pierce through the dielectric sheet 18-1b in the z-axis direction. The via-hole conductors B2-1, B4-1 pierce through the dielectric sheet 18-1c in the z-axis direction. The via-hole conductors B1-1, B2-1 are connected to each other, such that the reference ground conductor 22-1 and the auxiliary ground conductor 24-1 are connected to each other. The via-hole conductors B3-1, B4-1 are connected to each other, such that the reference ground conductor 22-1 and the auxiliary ground conductor 24-1 are connected to each other.

The via-hole conductors b40, b41 pierce through the dielectric sheet 18-1c in the z-axis direction. The via-hole conductor b40 connects the connecting conductor 80a to the auxiliary ground conductor 24-1. The via-hole conductor b41 connects the connecting conductor 80b to the auxiliary ground conductor 24-1.

In the signal line portion 10-1, the length in the x-axis direction of the dielectric sheets 18-1a, 18-1b is smaller than the length in the x-axis direction of the dielectric sheets 18-1c, 18-1d. Thus, as shown in FIG. 33B, the top surface of parts of the signal line portion 10-1 near the opposite ends in the x-axis direction of the signal line portion 10-1 has a step so that the thickness of the parts of the signal line portion 10-1 near the opposite ends in the x-axis direction of the signal line portion 10-1 is smaller than the thickness of the remaining a portion the signal line portion 10-1. Further, near the opposite ends of the signal line portion 10-1, the opposite ends of the signal line 20-1 and the connecting conductors 80a, 80b are exposed as shown in FIG. 34.

The signal line portion 10-2 is formed preferably by laminating a resist layer 17-2 and dielectric sheets 18-2a to 18-2d as shown in FIG. 35A. The top surface of the dielectric sheet 18-2a is provided with a reference ground conductor 22-2 and a connecting conductor 81. The top surface of the dielectric sheet 18-2b is provided with a signal line 20-2. The top surface of the dielectric sheet 18-2c is provided with an auxiliary ground conductor 24-2. The signal line 20-2, the reference ground conductor 22-2, and the auxiliary ground conductor 24-2 of the high-frequency signal line 10e have the same configuration as the signal line 20-2, the reference ground conductor 22-2, and the auxiliary ground conductor 24-2 of the high-frequency signal line 10, and therefore, the description thereof is herein omitted. The connecting conductor 81 preferably is a rectangular or substantially rectangular conductor and is surrounded by the terminal portion 22-2b of the reference ground conductor 22-1.

The via-hole conductors B1-2, B3-2 pierce through the dielectric sheet 18-2a in the z-axis direction. The via-hole conductors B2-2, B4-2 pierce through the dielectric sheet 18-2b in the z-axis direction. The via-hole conductors B1-2, B2-2 are connected to each other, such that the reference ground conductor 22-2 and the auxiliary ground conductor 24-2 are connected to each other. The via-hole conductors B3-2, B4-2 are connected to each other, such that the reference ground conductor 22-2 and the auxiliary ground conductor 24-2 are connected to each other.

The via-hole conductor b8 pierces through the dielectric sheet 18-2a in the z-axis direction so as to connect the end of the signal line 20-2 on the negative side in the y-axis direction to the connecting conductor 81.

The resist layer 17-2 is a resin layer for protection of the reference ground conductor 22-2. The resist layer 17-2 includes openings Ha to Hd. The connecting conductor 81 is exposed to the outside through the opening Ha. The terminal portion 22-2b is exposed to the outside through the openings Hb to Hd and therefore functions as an external terminal.

In the signal line portion 10-2, the length in the x-axis direction of the dielectric sheets 18-2c, 18-2d is smaller than the length in the y-axis direction of the resist layer 17-2 and the dielectric sheets 18-2a, 18-2b. Thus, as shown in FIG. 35B, the bottom surface of a portion the signal line portion 10-2 near the end of the signal line portion 10-2 on the positive side in the y-axis direction has a step so that the thickness of a portion the signal line portion 10-2 near the end of the signal line portion 10-2 on the positive side in the y-axis direction is smaller than the thickness of the remaining a portion the signal line portion 10-2. Further, near the end of the signal line portion 10-2 on the positive side in the y-axis direction, the via-hole conductors b9, b12 are exposed as shown in FIG. 36.

The signal line portions 10-1, 10-2, 10-3 that have the above-described configuration are joined together to provide a single high-frequency signal line 10e as shown in FIG. 32. More specifically, as shown in FIG. 32, a portion of the top surface S1 at the end of the dielectric element assembly 12-1 on the negative side in the x-axis direction and a portion of the bottom surface S4 at the end of the dielectric element assembly 12-2 on the positive side in the y-axis direction are joined together. In the present preferred embodiment, a portion of the top surface S1 at the end of the dielectric element assembly 12-1 on the negative side in the x-axis direction and a portion of the bottom surface S4 at the end of the dielectric element assembly 12-2 on the positive side in the y-axis direction are welded together. In this step, as shown in FIG. 37, the smaller thickness portion of the signal line portion 10-1 and the smaller thickness portion of the signal line portion 10-2 are placed one on the other. Thus, the signal line portion 10-1 and the signal line portion 10-2 are joined together, and the joint portion of the dielectric element assembly 12-1 and the dielectric element assembly 12-2 includes a corner (a bent portion which is bent in a planar direction of the high-frequency signal line 10e).

Further, as shown in FIG. 37, the end of the signal line 20-1 on the negative side in the x-axis direction is connected to the via-hole conductor b12. Thus, the signal line 20-1 and the signal line 20-2 are electrically coupled together. The connecting conductor 80a is connected to the via-hole conductor b9. Thus, the reference ground conductors 22-1, 22-2 and the auxiliary ground conductors 24-1, 24-2 are electrically coupled together.

Note that the signal line portion 10-3 has a configuration of line symmetry with respect to the signal line portion 10-2 about a line extending in the y-axis direction so as to traverse the center in the x-axis direction of the signal line portion 10-2, and therefore, the description thereof is herein omitted.

In the high-frequency signal line 10e that has the above-described configuration, the smaller thickness portion of the signal line portion 10-1 and the smaller thickness portion of the signal line portion 10-2 are placed one on the other. Therefore, the signal line portion 10-1 fits in the step of the signal line portion 10-2, and the signal line portion 10-2 fits in the step of the signal line portion 10-1. Thus, the signal line portion 10-1 and the signal line portion 10-2 are properly aligned. As a result, in the high-frequency signal line 10e, occurrence of disconnection which is attributed to dislocation of the signal line portion 10-1 and the signal line portion 10-2 is prevented. Further, alignment in the joining step is easy, and therefore, the step of joining together the signal line portions 10-1, 10-2, 10-3 is also easy.

In the high-frequency signal line 10e, the thickness of the joint portion of the signal line portion 10-1 and the signal line portion 10-2 is significantly reduced. Particularly when the signal line portions 10-1, 10-2, 10-3 are joined together to form the high-frequency signal line 10e, it is preferred that the high-frequency signal line 10e is configured to have no steps in the top and bottom surfaces.

Figure 39:
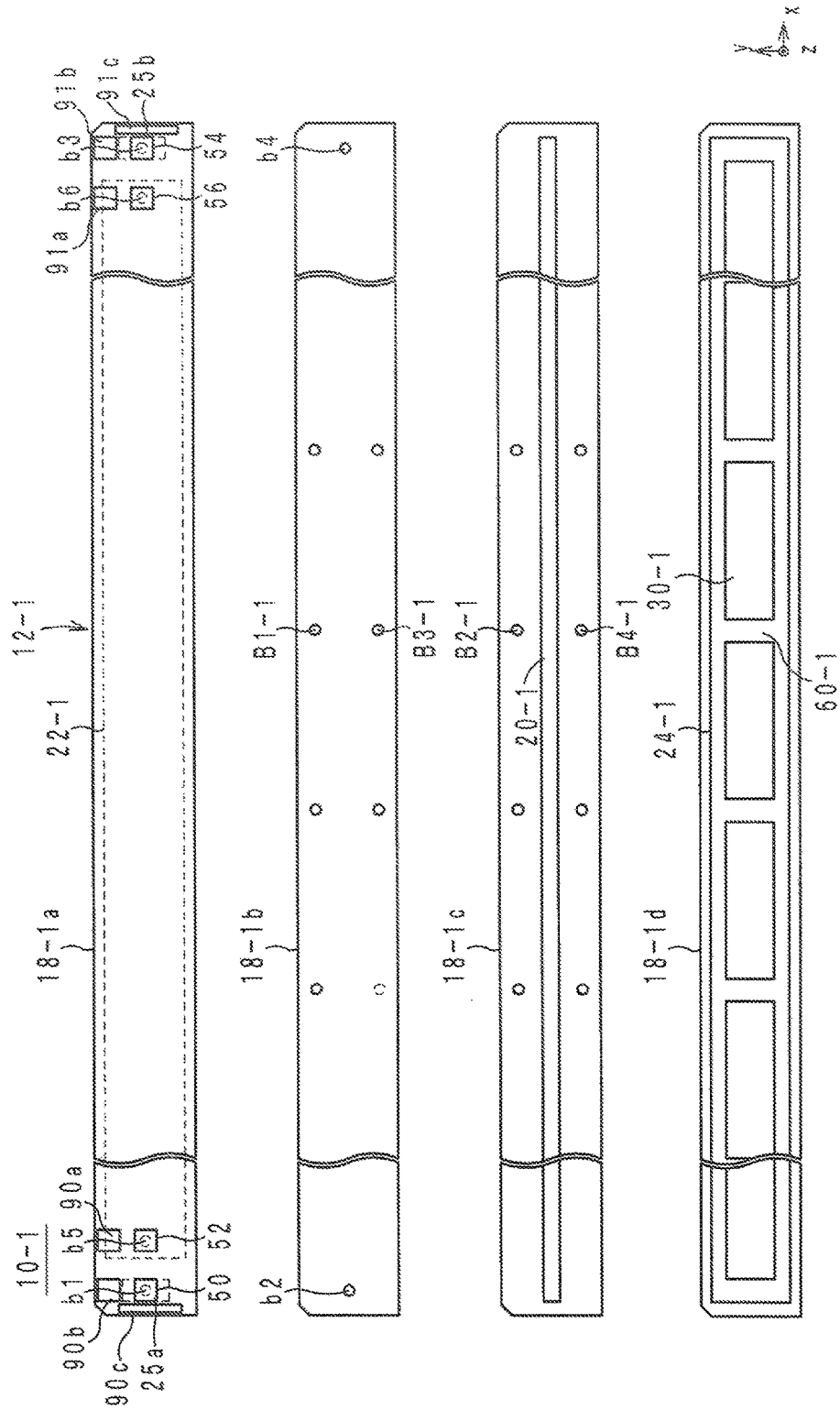
FIG. 39 is an exploded view of a signal line portion of the high-frequency signal line.
Figure 40:
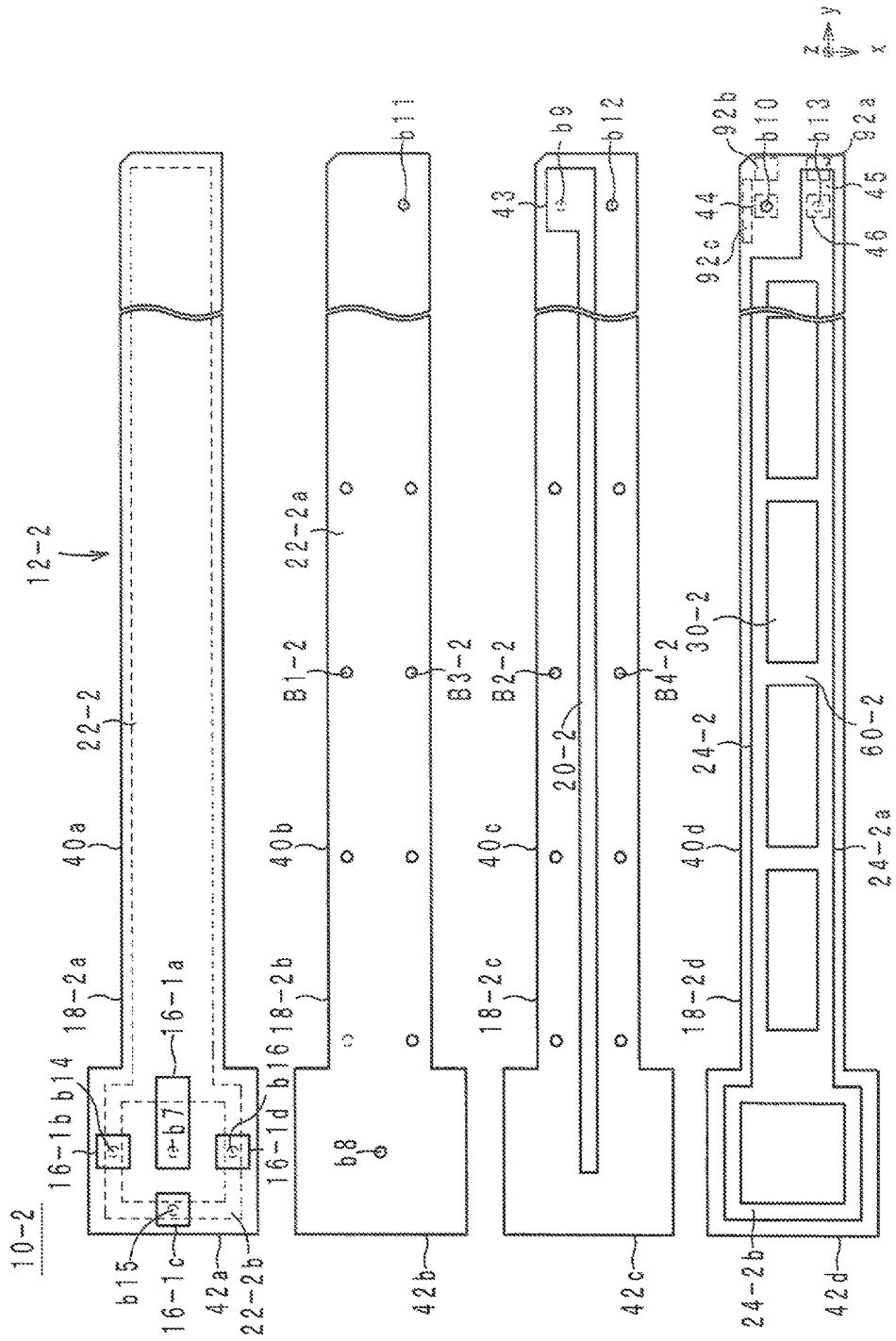
FIG. 40 is an exploded view of a signal line portion of the high-frequency signal line.

Hereinafter, a high-frequency signal line according to a sixth modification of a preferred embodiment of the present invention is described with reference to the drawings. FIG. 38 is a perspective view of an electronic device 200 including a high-frequency signal line 10f. FIG. 39 is an exploded view of a signal line portion 10-1 of the high-frequency signal line 10f. FIG. 40 is an exploded view of a signal line portion 10-2 of the high-frequency signal line 10f.

As shown in FIG. 38, the high-frequency signal line 10f may sometimes be bent near the joint portion of the signal line portion 10-1 and the signal line portion 10-2 and the joint portion of the signal line portion 10-1 and the signal line portion 10-3. In this case, in the high-frequency signal line 10b, force effects on these joint portions, and therefore, there is a probability that disconnection occurs between the signal line portion 10-1 and the signal line portion 10-2 and between the signal line portion 10-1 and the signal line portion 10-3.

In view of such circumstances, the signal line portion 10-1 of the high-frequency signal line 10f includes dummy conductors 90a to 90c, 91a to 91c in addition to the components of the signal line portion 10-1 of the high-frequency signal line 10b. The signal line portion 10-2 of the high-frequency signal line 10f includes dummy conductors 92a to 92c in addition to the components of the signal line portion 10-1 of the high-frequency signal line 10b.

The dummy conductors 90a to 90c preferably have a rectangular or substantially rectangular shape and are provided on a portion of the top surface of the dielectric sheet 18-1a near the end of the dielectric sheet 18-1a on the negative side in the x-axis direction. More specifically, the dummy conductors 90a, 90b are provided on the top surface of the dielectric sheet 18-1a so as to be arranged along the long side of the dielectric sheet 18-1a on the positive side in the y-axis direction. The dummy conductor 90c is provided on a portion of the top surface of the dielectric sheet 18-1a near the short side of the dielectric sheet 18-1a on the negative side in the x-axis direction. That is, the dummy conductors 90a to 90c are provided on the negative side in the x-axis direction and on the positive side in the y-axis direction relative to the via-hole conductors b1, b5, i.e., in two directions from the via-hole conductors b1, b5.

The dummy conductors 91a to 91c preferably have a rectangular or substantially rectangular shape and are provided on a portion of the top surface of the dielectric sheet 18-1a near the end of the dielectric sheet 18-1a on the positive side in the x-axis direction. More specifically, the dummy conductors 91a, 91b are provided on the top surface of the dielectric sheet 18-1a so as to be arranged along the long side of the dielectric sheet 18-1a on the positive side in the y-axis direction. The dummy conductor 91c is provided on a portion of the top surface of the dielectric sheet 18-1a near the short side of the dielectric sheet 18-1a on the positive side in the x-axis direction. That is, the dummy conductors 91a to 91c are provided on the positive side in the x-axis direction and on the positive side in the y-axis direction relative to the via-hole conductors b3, b6, i.e., in two directions from the via-hole conductors b3, b6.

The dummy conductors 92a to 92c preferably have a rectangular or substantially rectangular shape and are provided on a portion of the bottom surface of the dielectric sheet 18-2d near the end of the dielectric sheet 18-2d on the positive side in the y-axis direction. More specifically, the dummy conductors 92a, 92b are provided on the bottom surface of the dielectric sheet 18-2*d* so as to be arranged along the short side of the dielectric sheet 18-2*d* on the positive side in the y-axis direction. The dummy conductor 92*c* is provided on a portion of the bottom surface of the dielectric sheet 18-2*d* near the short side of the dielectric sheet 18-2*d* on the negative side in the x-axis direction. That is, the dummy conductors 92*a* to 92*c* are provided on the negative side in the x-axis direction and on the positive side in the y-axis direction relative to the connecting conductors 44, 46, i.e., in two directions from the connecting conductors 44, 46.

Corners of the signal line portions 10-1, 10-2 which are on the negative side in the x-axis direction and which are on the positive side in the y-axis direction are rounded. These rounded corners facilitate alignment of the signal line portion 10-1 and the signal line portion 10-2.

When the signal line portion 10-1 and the signal line portion 10-2 that have the above-described configuration are joined together, the dummy conductor 90*a* and the dummy conductor 92*a* are connected together via a solder, the dummy conductor 90*b* and the dummy conductor 92*b* are connected together via a solder, and the dummy conductor 90*c* and the dummy conductor 92*c* are connected together via a solder. Note that the signal line portion 10-3 has a configuration of line symmetry with respect to the signal line portion 10-2 about a line extending in the y-axis direction so as to traverse the center in the x-axis direction of the signal line portion 10-2, and therefore, the description thereof is herein omitted. The other components of the high-frequency signal line 10*f* are the same as those of the high-frequency signal line 10*b*, and therefore, the description thereof is herein omitted.

According to the high-frequency signal line 10*f* that has the above-described configuration, the dummy conductors 90*a* to 90*c* and the dummy conductors 92*a* to 92*c* are connected together via a solder. Therefore, the signal line portion 10-1 and the signal line portion 10-2 are strongly secured together. As a result, the signal line portion 10-1 and the signal line portion 10-2 are prevented from being easily disconnected.

In the high-frequency signal line 10*f*, an antenna may be provided near the high-frequency signal line 10*f* as shown in FIG. 38, and even in this case, the characteristics of the antenna are unlikely to vary. More specifically, a possible way of strongly securing the signal line portion 10-1 and the signal line portion 10-2 is to increase the size of the connecting conductors 44, 46, for example. However, the connecting conductors 44, 46 are respectively connected to the signal line 20-2 and the reference ground conductors 22-2, 24-2. Thus, the characteristic impedance of the high-frequency signal line 10*f* can deviate from a predetermined characteristic impedance, or variation can occur in the characteristics of the antenna.

In view of such circumstances, in the high-frequency signal line 10*f*, the dummy conductors 90*a* to 90*c*, 91*a* to 91*c* are connected by soldering. The dummy conductors 90*a* to 90*c*, 91*a* to 91*c* are floating conductors that are not connected to any other conductor. Therefore, even when the dummy conductors 90*a* to 90*c*, 91*a* to 91*c* are provided, the characteristic impedance of the high-frequency signal line 10*f* is unlikely to deviate from a predetermined characteristic impedance, and variation is unlikely to occur in the characteristics of the antenna.

Figure 41:
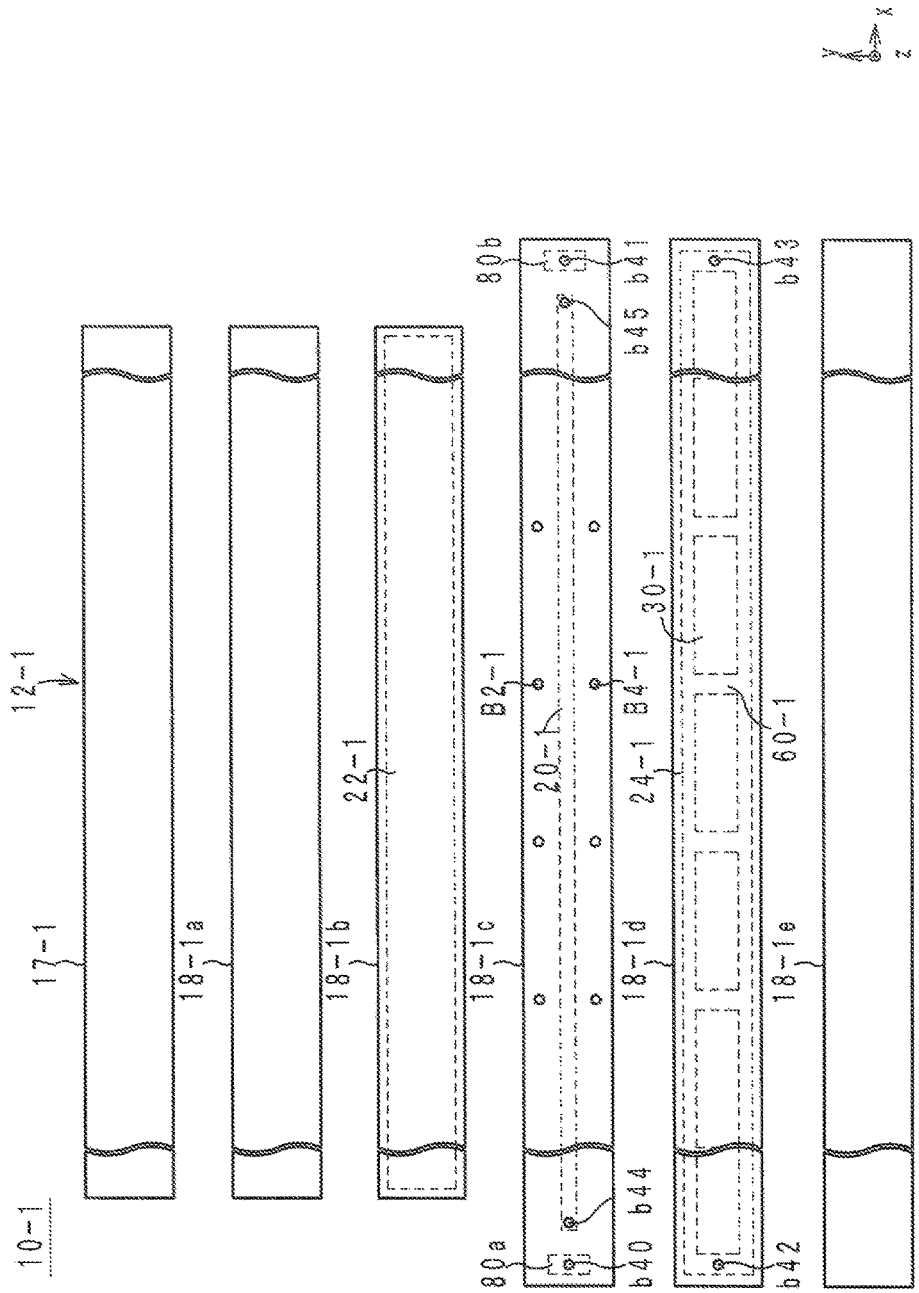
FIG. 41 is an exploded view of a signal line portion of a high-frequency signal line.
Figure 44:
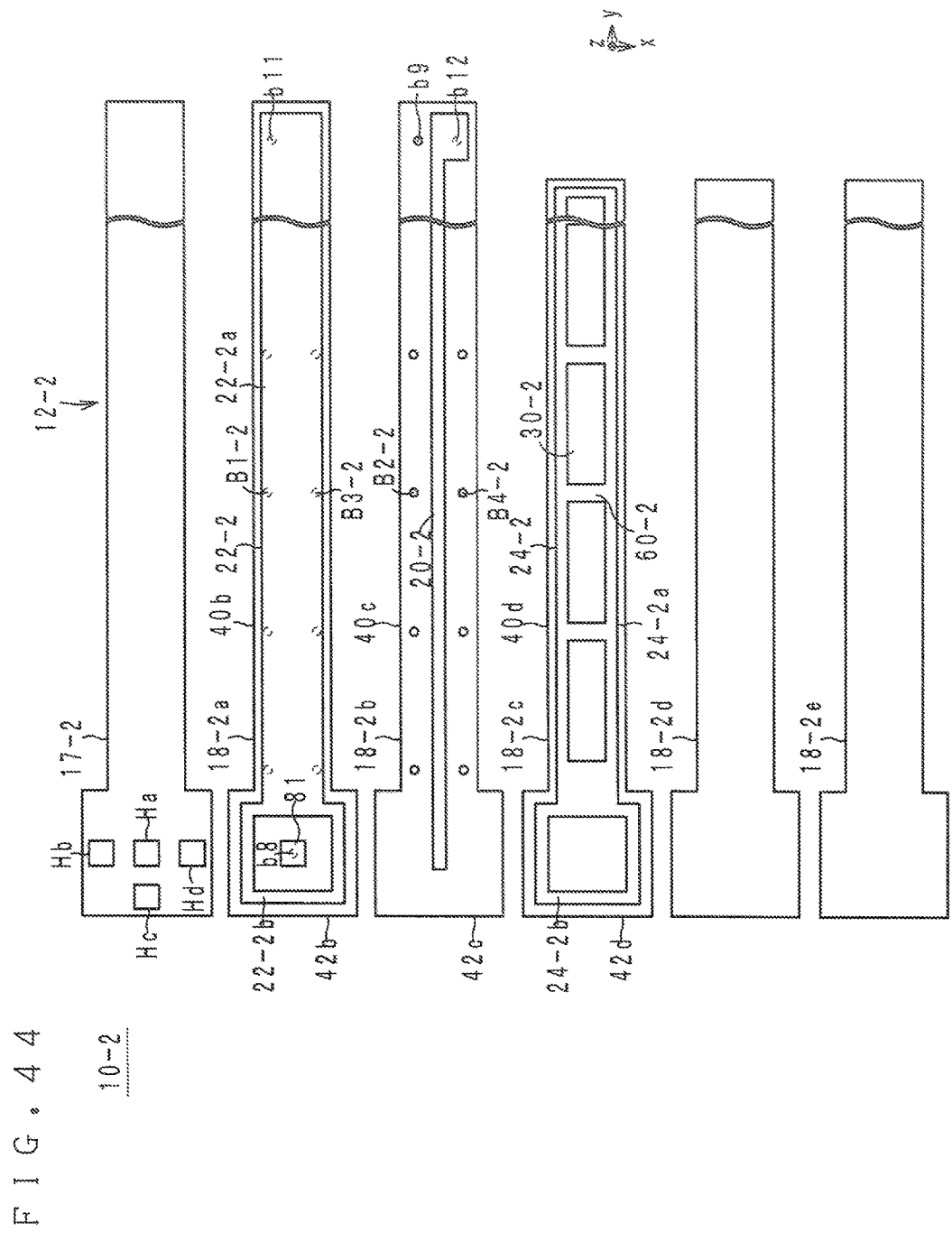
FIG. 44 is an exploded view of a signal line portion of the high-frequency signal line.
Figure 45:
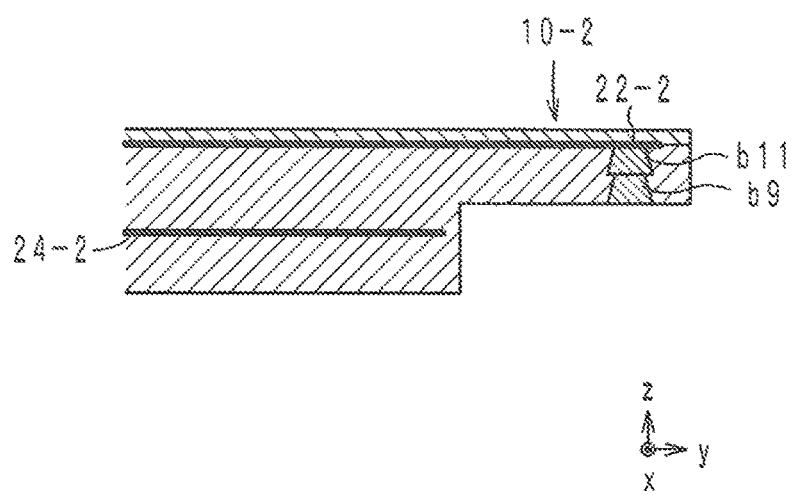
FIG. 45 is a cross-sectional structure view of the signal line portion of the high-frequency signal line.
Figure 46:
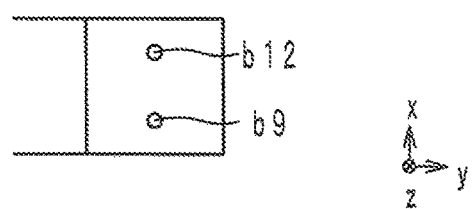
FIG. 46 is a plan view of an end of the signal line portion on the negative side in the y-axis direction.
Figure 47:
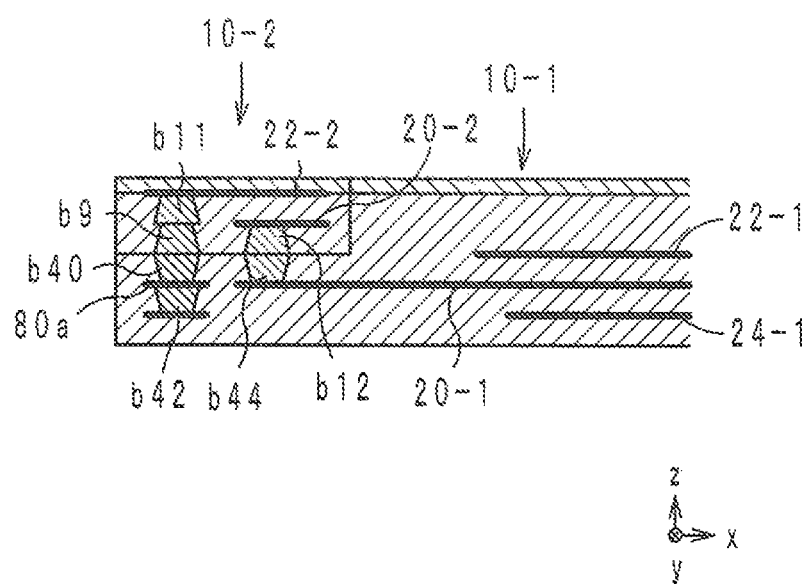
FIG. 47 is a cross-sectional structure view of the high-frequency signal line of FIG. 32 taken along line A-A.

Hereinafter, a high-frequency signal line according to a seventh modification of a preferred embodiment of the present invention is described with reference to the drawings. FIG. 41 is an exploded view of a signal line portion 10-1 of a high-frequency signal line 10*g*. FIG. 42 is a cross-sectional structure view of the signal line portion 10-1 of the high-frequency signal line 10*g*. FIG. 43 is a plan view of an end of the signal line portion 10-1 on the negative side in the x-axis direction. FIG. 44 is an exploded view of a signal line portion 10-2 of the high-frequency signal line 10*g*. FIG. 45 is a cross-sectional structure view of the signal line portion 10-2 of the high-frequency signal line 10*g*. FIG. 46 is a plan view of an end of the signal line portion 10-2 on the negative side in the y-axis direction. FIG. 47 is a cross-sectional structure view of the high-frequency signal line 10*g* of FIG. 32 taken along line A-A. FIG. 32 is referred to herein for the external perspective view of the high-frequency signal line 10*g*.

The high-frequency signal line 10*g* includes signal line portions 10-1 to 10-3 as shown in FIG. 32.

The signal line portion 10-1 is formed preferably by laminating a resist layer 17-1 and dielectric sheets 18-1*a* to 18-1*e* as shown in FIG. 41. The resist layer 17-1 is a resin layer. The top surface of the dielectric sheet 18-1*b* is provided with a reference ground conductor 22-1. The bottom surface of the dielectric sheet 18-1*c* is provided with a signal line 20-1 and connecting conductors 80*a*, 80*b*. The bottom surface of the dielectric sheet 18-1*d* is provided with an auxiliary ground conductor 24-1. The signal line 20-1, the reference ground conductor 22-1, and the auxiliary ground conductor 24-1 of the high-frequency signal line 10*g* have the same configuration as the signal line 20-1, the reference ground conductor 22-1, and the auxiliary ground conductor 24-1 of the high-frequency signal line 10, and therefore, the description thereof is herein omitted. The connecting conductor 80*a* preferably is a rectangular or substantially rectangular conductor and is provided on the negative side in the x-axis direction relative to the signal line 20-1. The connecting conductor 80*b* preferably is a rectangular or substantially rectangular conductor and is provided on the positive side in the x-axis direction relative to the signal line 20-1.

The via-hole conductors B2-1, B4-1 pierce through the dielectric sheet 18-1*c* in the z-axis direction and connect the reference ground conductor 22-1 to the auxiliary ground conductor 24-1.

The via-hole conductors b40, b41 pierce through the dielectric sheet 18-1*c* in the z-axis direction. An end of the via-hole conductor b40 on the negative side in the z-axis direction is connected to the connecting conductor 80*a*. An end of the via-hole conductor b41 on the negative side in the z-axis direction is connected to the connecting conductor 80*b*.

The via-hole conductors b42, b43 pierce through the dielectric sheet 18-1*d* in the z-axis direction. The via-hole conductor b42 connects the connecting conductor 80*a* to the auxiliary ground conductor 24-1. The via-hole conductor b43 connects the connecting conductor 80*b* to the auxiliary ground conductor 24-1.

The via-hole conductors b44, b45 pierce through the dielectric sheet 18-1*c* in the z-axis direction. An end of the via-hole conductor b44 on the negative side in the z-axis direction is connected to the end of the signal line 20-1 on the negative side in the x-axis direction. An end of the via-hole conductor b45 on the negative side in the z-axis direction is connected to the other end of the signal line 20-1 on the positive side in the x-axis direction.

In the signal line portion 10-1, the length in the x-axis direction of the dielectric sheets 18-1*a*, 18-1*b* is smaller than the length in the x-axis direction of the dielectric sheets 18-1*c* to 18-1*e*. Thus, as shown in FIG. 42, portions of the signal line portion 10-1 near the opposite ends in the x-axis direction of the signal line portion 10-1 have steps so that the thickness of the portions of the signal line portion 10-1 near the opposite ends in the x-axis direction of the signal line portion 10-1 is smaller than the thickness of the remaining a portion the signal line portion 10-1. Further, the via-hole conductors b40, b44 are exposed at portions of the top surface of the signal line portion 10-1 near the opposite ends of the signal line portion 10-1 as shown in FIG. 43.

The signal line portion 10-2 is formed preferably by laminating a resist layer 17-2 and dielectric sheets 18-2a to 18-2e as shown in FIG. 44. The top surface of the dielectric sheet 18-2a is provided with a reference ground conductor 22-2 and a connecting conductor 81. The top surface of the dielectric sheet 18-2b is provided with a signal line 20-2. The top surface of the dielectric sheet 18-2c is provided with an auxiliary ground conductor 24-2. The signal line 20-2, the reference ground conductor 22-2, and the auxiliary ground conductor 24-2 of the high-frequency signal line 10g have the same configuration as the signal line 20-2, the reference ground conductor 22-2, and the auxiliary ground conductor 24-2 of the high-frequency signal line 10, and therefore, the description thereof is herein omitted. The connecting conductor 81 preferably is a rectangular or substantially rectangular conductor and is surrounded by the terminal portion 22-2b of the reference ground conductor 22-1.

The via-hole conductors B1-2, B3-2 pierce through the dielectric sheet 18-2a in the z-axis direction. The via-hole conductors B2-2, B4-2 pierce through the dielectric sheet 18-2b in the z-axis direction. The via-hole conductors B1-2, B2-2 are connected to each other, such that the reference ground conductor 22-2 and the auxiliary ground conductor 24-2 are connected to each other. The via-hole conductors B3-2, B4-2 are connected to each other, such that the reference ground conductor 22-2 and the auxiliary ground conductor 24-2 are connected to each other.

The via-hole conductor b8 pierces through the dielectric sheet 18-2a in the z-axis direction so as to connect an end of the signal line 20-1 on the negative side in the y-axis direction to the connecting conductor 81.

The resist layer 17-2 is a resin layer for protection of the reference ground conductor 22-2. The resist layer 17-2 has openings Ha to Hd. The connecting conductor 81 is exposed to the outside through the opening Ha. The terminal portion 22-2b is exposed to the outside through the openings Hb to Hd and therefore functions as an external terminal.

In the signal line portion 10-2, the length in the x-axis direction of the dielectric sheets 18-2c, 18-2d is smaller than the length in the y-axis direction of the resist layer 17-2 and the dielectric sheets 18-2a, 18-2b. Thus, as shown in FIG. 45, a portion the signal line portion 10-2 near the end of the signal line portion 10-2 on the positive side in the y-axis direction has a step so that the thickness of the portion of the signal line portion 10-2 near the end of the signal line portion 10-2 on the positive side in the y-axis direction is smaller than the thickness of the remaining portion of the signal line portion 10-2. Further, the via-hole conductors b9, b12 are exposed at a portion of the bottom surface of the signal line portion 10-2 near the end of the signal line portion 10-2 on the positive side in the y-axis direction as shown in FIG. 46.

The signal line portions 10-1, 10-2 that have the above-described configuration are joined together to define a single high-frequency signal line 10g as shown in FIG. 32. More specifically, as shown in FIG. 32, a portion of the top surface S1 at the end of the dielectric element assembly 12-1 on the negative side in the x-axis direction and a portion of the bottom surface S4 at the end of the dielectric element assembly 12-2 on the positive side in the y-axis direction are joined together. In the present preferred embodiment, a portion of the top surface S1 at the end of the dielectric element assembly 12-1 on the negative side in the x-axis direction and a portion of the bottom surface S4 at the end of the dielectric element assembly 12-2 on the positive side in the y-axis direction are welded together. In this step, as shown in FIG. 47, the smaller thickness portion of the signal line portion 10-1 and the smaller thickness portion of the signal line portion 10-2 are placed one on the other. Thus, the signal line portion 10-1 and the signal line portion 10-2 are joined together, and the joint portion of the dielectric element assembly 12-1 and the dielectric element assembly 12-2 includes a corner (a bent portion which is bent in a planar direction of the high-frequency signal line 10g).

Further, as shown in FIG. 47, the via-hole conductor b12 and the via-hole conductor b44 are connected to each other. Thus, the signal line 20-1 and the signal line 20-2 are electrically coupled together. Meanwhile, the via-hole conductor b9 and the via-hole conductor b40 are connected to each other. Thus, the reference ground conductors 22-1, 22-2 and the auxiliary ground conductors 24-1, 24-2 are electrically coupled together.

Note that the signal line portion 10-3 has the same configuration as the signal line portion 10-2, and therefore, the description thereof is herein omitted.

In the high-frequency signal line 10g that has the above-described configuration, occurrence of disconnection which is attributed to dislocation of the signal line portion 10-1 and the signal line portion 10-2 is prevented as in the high-frequency signal line 10e.

In the high-frequency signal line 10g, the thickness of the joint portion of the signal line portion 10-1 and the signal line portion 10-2 is significantly reduced as in the high-frequency signal line 10e.

In the high-frequency signal line 10g, the signal line portion 10-1 and the signal line portion 10-2 are joined more strongly than in the high-frequency signal line 10e. More specifically, as shown in FIG. 37, in the high-frequency signal line 10e, the via-hole conductor b9 and the connecting conductor 80a are connected together, and the via-hole conductor b12 and the signal line 20-1 are connected together. In this case, a portion of the connecting conductor 80a spreading out of the via-hole conductor b9 and a portion the signal line 20-1 spreading out of the via-hole conductor b12 are in contact with the bottom surface of the dielectric sheet 18-2c of the signal line portion 10-2. Therefore, in these portions, the dielectric sheets are not welded together.

On the other hand, in the high-frequency signal line 10g, the via-hole conductor b9 and the via-hole conductor b40 are connected together, and the via-hole conductor b12 and the via-hole conductor b44 are connected together. Therefore, the connecting surface of the signal line portion 10-1 and the signal line portion 10-2 does not include a conductor, such as the signal line 20-1. Thus, in portions of the high-frequency signal line 10g exclusive of the via-hole conductors b9, b12, b40, b44, the dielectric sheets are welded together. As a result, in the high-frequency signal line 10g, the signal line portion 10-1 and the signal line portion 10-2 are joined more strongly than in the high-frequency signal line 10e.

Figure 48:
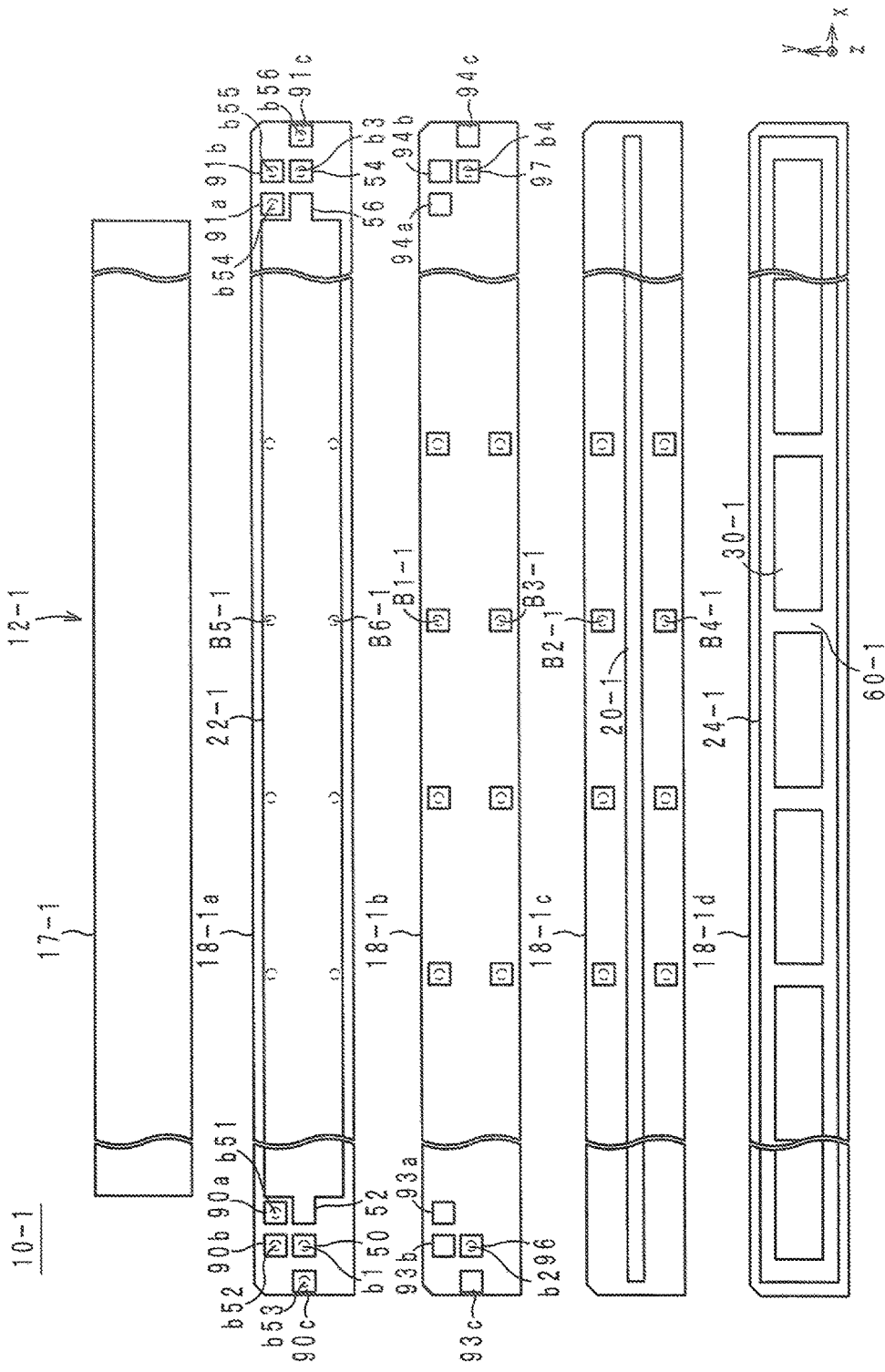
FIG. 48 is an exploded view of a signal line portion of a high-frequency signal line.
Figure 49:
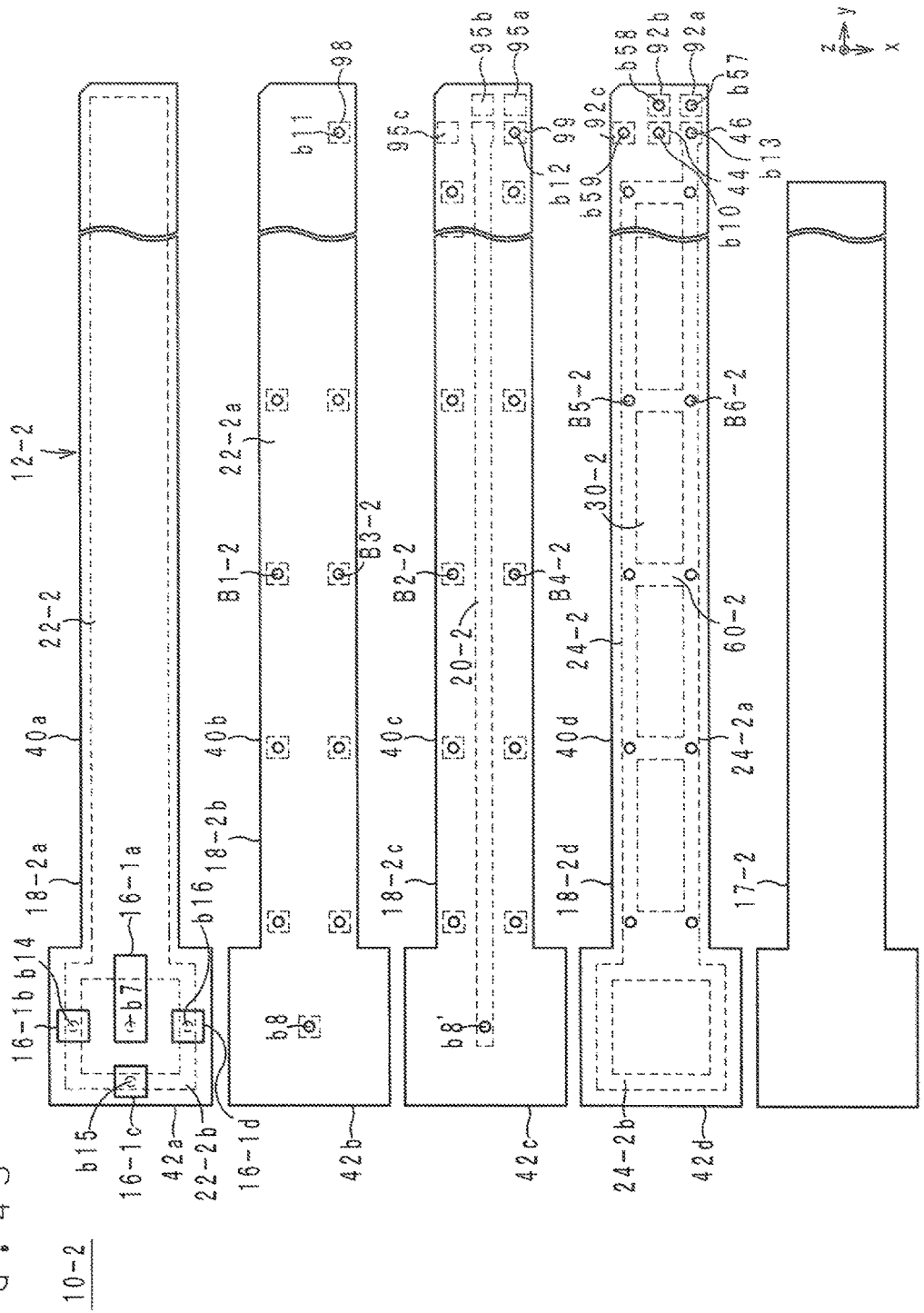
FIG. 49 is an exploded view of a signal line portion of the high-frequency signal line.

Hereinafter, a high-frequency signal line according to an eighth modification of a preferred embodiment of the present invention is described with reference to the drawings. FIG. 48 is an exploded view of a signal line portion 10-1 of a high-frequency signal line 10h. FIG. 49 is an exploded view of a signal line portion 10-2 of the high-frequency signal line 10h. FIG. 1 is referred to herein for the external perspective view of the high-frequency signal line 10h.

In the high-frequency signal line 10h, the dielectric element assemblies 12-1 to 12-3 are joined more strongly than in the high-frequency signal line 10f. The following description of the high-frequency signal line 10h is mainly focused on the differences from the high-frequency signal line 10f. Note that description of components of the high-frequency signal line 10h which are the same as those of the high-frequency signal line 10f is herein omitted.

In the signal line portion 10-1 of the high-frequency signal line 10h, the reference ground conductor 22-1, the connecting conductors 50, 52, 54, 56, and the dummy conductors 90a to 90c, 91a to 91c are provided on the top surface of the dielectric sheet 18-1a. The signal line 20-1 is provided on the top surface of the dielectric sheet 18-1c. The auxiliary ground conductor 24-1 is provided on the top surface of the dielectric sheet 18-1d.

The configurations of the reference ground conductor 22-1, the signal line 20-1, and the auxiliary ground conductor 24-1 are the same as those of the reference ground conductor 22-1, the signal line 20-1, and the auxiliary ground conductor 24-1 of the high-frequency signal line 10f.

The connecting conductor 50 preferably is a rectangular or substantially rectangular conductor which is provided on a portion of the top surface of the dielectric sheet 18-1a at the end of the dielectric sheet 18-1a on the negative side in the x-axis direction. The connecting conductor 52 preferably is a rectangular or substantially rectangular conductor which is provided on a portion of the top surface of the dielectric sheet 18-1a at the end of the dielectric sheet 18-1a on the negative side in the x-axis direction, at a position on the positive side in the x-axis direction relative to the connecting conductor 50.

The connecting conductor 54 preferably is a rectangular or substantially rectangular conductor which is provided on a portion of the top surface of the dielectric sheet 18-1a at the end of the dielectric sheet 18-1a on the positive side in the x-axis direction. The connecting conductor 56 preferably is a rectangular or substantially rectangular conductor which is provided on a portion of the top surface of the dielectric sheet 18-1a at the end of the dielectric sheet 18-1a on the positive side in the x-axis direction, at a position on the negative side in the x-axis direction relative to the connecting conductor 54. The connecting conductors 52, 56 are connected to the reference ground conductor 22-1 at the top surface of the dielectric sheet 18-1a.

The dummy conductors 90a to 90c preferably have a rectangular or substantially rectangular shape and are provided on a portion of the top surface of the dielectric sheet 18-1a near the end of the dielectric sheet 18-1a on the negative side in the x-axis direction. More specifically, the dummy conductors 90a, 90b are provided on the top surface of the dielectric sheet 18-1a so as to be arranged along the long side of the dielectric sheet 18-1a on the positive side in the y-axis direction. The dummy conductor 90c is provided on a portion of the top surface of the dielectric sheet 18-1a near the short side of the dielectric sheet 18-1a on the negative side in the x-axis direction.

The dummy conductors 91a to 91c preferably have a rectangular or substantially rectangular shape and are provided on a portion of the top surface of the dielectric sheet 18-1a near the end of the dielectric sheet 18-1a on the positive side in the x-axis direction. More specifically, the dummy conductors 91a, 91b are provided on the top surface of the dielectric sheet 18-1a so as to be arranged along the long side of the dielectric sheet 18-1a on the positive side in the y-axis direction. The dummy conductor 91c is provided on a portion of the top surface of the dielectric sheet 18-1a near the short side of the dielectric sheet 18-1a on the positive side in the x-axis direction.

The signal line portion 10-1 of the high-frequency signal line 10h includes dummy conductors 93a to 93c, 94a to 94c, connecting conductors 96, 97, and via-hole conductors b51 to b56 in addition to the components of the signal line portion 10-1 of the high-frequency signal line 10f.

The dummy conductors 93a to 93c preferably have a rectangular or substantially rectangular shape and are provided in the dielectric element assembly 12-1. The dummy conductors 93a to 93c are provided on a portion of the top surface of the dielectric sheet 18-1b near the end of the dielectric sheet 18-1b on the negative side in the x-axis direction. More specifically, the dummy conductors 93a, 93b are provided on the top surface of the dielectric sheet 18-1b so as to be arranged along the long side of the dielectric sheet 18-1b on the positive side in the y-axis direction. Thus, the dummy conductors 93a, 93b overlap with the dummy conductors 90a, 90b when viewed in plan in the z-axis direction. The dummy conductor 93c is provided on a portion of the top surface of the dielectric sheet 18-1b near the short side of the dielectric sheet 18-1b on the negative side in the x-axis direction. Thus, the dummy conductor 93c overlaps with the dummy conductor 90c when viewed in plan in the z-axis direction.

The dummy conductors 94a to 94c preferably have a rectangular or substantially rectangular shape and are provided in the dielectric element assembly 12-1. The dummy conductors 94a to 94c are provided on a portion of the top surface of the dielectric sheet 18-1b near the end of the dielectric sheet 18-1b on the positive side in the x-axis direction. More specifically, the dummy conductors 94a, 94b are provided on the top surface of the dielectric sheet 18-1b so as to be arranged along the long side of the dielectric sheet 18-1b on the positive side in the y-axis direction. Thus, the dummy conductors 94a, 94b overlap with the dummy conductors 91a, 91b when viewed in plan in the z-axis direction. The dummy conductor 94c is provided on a portion of the top surface of the dielectric sheet 18-1b near the short side of the dielectric sheet 18-1b on the positive side in the x-axis direction. Thus, the dummy conductor 94c overlaps with the dummy conductor 91c when viewed in plan in the z-axis direction.

The connecting conductor 96 preferably has a rectangular or substantially rectangular shape and is provided on a portion of the top surface of the dielectric sheet 18-1b near the end of the dielectric sheet 18-1b on the negative side in the x-axis direction. Thus, the connecting conductor 96 overlaps with the connecting conductor 50 when viewed in plan in the z-axis direction.

The connecting conductor 97 preferably has a rectangular or substantially rectangular shape and is provided on a portion of the top surface of the dielectric sheet 18-1b near the end of the dielectric sheet 18-1b on the positive side in the x-axis direction. Thus, the connecting conductor 97 overlaps with the connecting conductor 54 when viewed in plan in the z-axis direction.

The via-hole conductors b51 to b56 pierce through the dielectric sheet 18-1a in the z-axis direction. The via-hole conductor b51 connects the dummy conductor 90a to the dummy conductor 93a. The via-hole conductor b52 connects the dummy conductor 90b to the dummy conductor 93b. The via-hole conductor b53 connects the dummy conductor 90c to the dummy conductor 93c. The via-hole conductor b54 connects the dummy conductor 91a to the dummy conductor 94a. The via-hole conductor b55 connects the dummy conductor 91b to the dummy conductor 94b. The via-hole conductor b56 connects the dummy conductor 91c to the dummy conductor 94c.

In the signal line portion 10-1, the resist layer 17-1 is provided on the top surface of the dielectric sheet 18-1a so as to cover the reference ground conductor 22-1. Note that, however, the connecting conductors 50, 52, 54, 56 and the dummy conductors 90a to 90c, 91a to 91c are not covered with the resist layer 17-1.

In the signal line portion 10-2 of the high-frequency signal line 10h, the external terminals 16-1a to 16-1d are provided on the top surface of the dielectric sheet 18-2a, and the reference ground conductor 22-2 is provided on the bottom surface of the dielectric sheet 18-2a. The signal line 20-2 is provided on the bottom surface of the dielectric sheet 18-2c. The auxiliary ground conductor 24-2, the connecting conductors 44, 46, the dummy conductors 92a to 92c are provided on the bottom surface of the dielectric sheet 18-2d.

The configurations of the reference ground conductor 22-2, the signal line 20-2, and the auxiliary ground conductor 24-2 are the same as those of the reference ground conductor 22-2, the signal line 20-2, and the auxiliary ground conductor 24-2 of the high-frequency signal line 10f.

The connecting conductor 44 preferably is a rectangular or substantially rectangular conductor which is provided on a portion of the bottom surface of the dielectric sheet 18-2d at the end of the dielectric sheet 18-2d on the positive side in the y-axis direction. The connecting conductor 46 preferably is a rectangular or substantially rectangular conductor which is provided on a portion of the bottom surface of the dielectric sheet 18-2d at the end of the dielectric sheet 18-2d on the positive side in the y-axis direction, at a position on the positive side in the x-axis direction relative to the connecting conductor 44. The connecting conductor 46 is connected to the auxiliary ground conductor 24-2 at the bottom surface of the dielectric sheet 18-2d.

The dummy conductors 92a to 92c preferably have a rectangular or substantially rectangular shape and are provided on a portion of the bottom surface of the dielectric sheet 18-2d near the end of the dielectric sheet 18-2d on the positive side in the y-axis direction. More specifically, the dummy conductors 92a, 92b are provided on the bottom surface of the dielectric sheet 18-2d so as to be arranged along the short side of the dielectric sheet 18-2d on the positive side in the y-axis direction. The dummy conductor 92c is provided on a portion of the bottom surface of the dielectric sheet 18-2d near the long side of the dielectric sheet 18-2d on the negative side in the x-axis direction.

The signal line portion 10-2 of the high-frequency signal line 10h includes dummy conductors 95a to 95c, connecting conductors 98, 99, and via-hole conductors b57 to b59, b8' in addition to the components of the signal line portion 10-1 of the high-frequency signal line 10f.

The dummy conductors 95a to 95c preferably have a rectangular or substantially rectangular shape and are provided in the dielectric element assembly 12-2. The dummy conductors 95a to 95c are provided on a portion of the bottom surface of the dielectric sheet 18-2c near the end of the dielectric sheet 18-2c on the positive side in the y-axis direction. More specifically, the dummy conductors 95a, 95b are provided on the bottom surface of the dielectric sheet 18-2c so as to be arranged along the short side of the dielectric sheet 18-2c on the positive side in the y-axis direction. Thus, the dummy conductors 95a, 95b overlap with the dummy conductors 92a, 92b when viewed in plan in the z-axis direction. The dummy conductor 95c is provided on a portion of the top surface of the dielectric sheet 18-2c near the long side of the dielectric sheet 18-2c on the negative side in the x-axis direction. Thus, the dummy conductor 95c overlaps with the dummy conductor 92c when viewed in plan in the z-axis direction.

The connecting conductor 98 preferably has a rectangular or substantially rectangular shape and is provided on a portion of the bottom surface of the dielectric sheet 18-2b near the end of the dielectric sheet 18-2b on the positive side in the y-axis direction. The connecting conductor 99 preferably has a rectangular or substantially rectangular shape and is provided on a portion of the bottom surface of the dielectric sheet 18-2c near the end of the dielectric sheet 18-2c on the positive side in the y-axis direction. Thus, the connecting conductors 98, 99 overlap with the connecting conductor 46 when viewed in plan in the z-axis direction.

The via-hole conductors b57 to b59 pierce through the dielectric sheet 18-2d in the z-axis direction. The via-hole conductor b57 connects the dummy conductor 92a to the dummy conductor 95a. The via-hole conductor b58 connects the dummy conductor 92b to the dummy conductor 95b. The via-hole conductor b59 connects the dummy conductor 92c to the dummy conductor 95c.

The via-hole conductor b8' pierces through the dielectric sheet 18-2c in the z-axis direction. The via-hole conductors b7, b8, b8' define a single via-hole conductor and connect the external terminal 16-1a to the end of the signal line 20-2 on the negative side in the y-axis direction.

In the signal line portion 10-2, the resist layer 17-2 is provided on the bottom surface of the dielectric sheet 18-2d so as to cover the auxiliary ground conductor 24-2. Note that, however, the connecting conductors 44, 46 and the dummy conductors 92a to 92c are not covered with the resist layer 17-2.

When the signal line portion 10-1 and the signal line portion 10-2 that have the above-described configuration are joined together, the dummy conductor 90a and the dummy conductor 92a are connected together via a solder, the dummy conductor 90b and the dummy conductor 92b are connected together via a solder, and the dummy conductor 90c and the dummy conductor 92c are connected together via a solder. Note that the signal line portion 10-3 has a configuration of line symmetry with respect to the signal line portion 10-2 about a line extending in the y-axis direction so as to traverse the center in the x-axis direction of the signal line portion 10-2, and therefore, the description thereof is herein omitted. The other components of the high-frequency signal line 10h are the same as those of the high-frequency signal line 10f, and therefore, the description thereof is herein omitted.

According to the high-frequency signal line 10h that has the above-described configuration, the signal line portion 10-1 and the signal line portion 10-2 are prevented from being easily disconnected as in the high-frequency signal line 10f.

In the high-frequency signal line 10h, even when the dummy conductors 90a to 90c, 91a to 91c, 92a to 92c are provided, the characteristic impedance of the high-frequency signal line 10h is unlikely to deviate from a predetermined characteristic impedance as in the high-frequency signal line 10f. When the high-frequency signal line 10h is connected to an antenna, variation is unlikely to occur in the characteristics of the antenna.

In the high-frequency signal line 10h, the dummy conductors 90a to 90c and the dummy conductors 93a to 93c are respectively connected to each other by the via-hole conductors b51 to b53. The dummy conductors 91a to 91c and the dummy conductors 94a to 94c are respectively connected to each other by the via-hole conductors b54 to b56. The dummy conductors 92a to 92c and the dummy conductors 95a to 95c are respectively connected to each other by the via-hole conductors b54 to b56. Therefore, peeling off of the dummy conductors 90a to 90c, 91a to 91c, 92a to 92c from the dielectric element assemblies 12-1, 12-2, 12-3 of the signal line portions 10-1, 10-2, 10-3 is reliably prevented. Thus, the dielectric element assemblies 12-1, 12-2, 12-3 are joined together more strongly.

Other Preferred Embodiments

The high-frequency signal line and manufacturing method thereof according to the present invention are not limited to various preferred embodiments of the present invention including the high-frequency signal lines 10, 10a to 10h and manufacturing methods thereof, but can be varied within the scope of the spirit of the present invention.

Note that the elements, features and characteristics of any of the high-frequency signal lines 10, 10a to 10h may be combined.

In the high-frequency signal lines 10, 10a to 10h, the connectors 100a, 100b may not be mounted. In this case, the ends of the high-frequency signal lines 10, 10a to 10h are connected to the circuit board preferably by soldering. Note that only one end of the high-frequency signal lines 10, 10a to 10h may be provided with the connector 100a mounted thereon.

The connectors 100a, 100b are mounted on the top surface of the high-frequency signal line 10, 10a to 10h but may be mounted on the bottom surface of the high-frequency signal line 10, 10a to 10h. Alternatively, the connector 100a may be mounted on the top surface of the high-frequency signal line 10, 10a to 10h while the connector 100b is mounted on the bottom surface of the high-frequency signal line 10, 10a to 10h.

In the high-frequency signal lines 10, 10a to 10c, 10e, 10f, 10g, 10h, either of the reference ground conductors 22-1, 22-2 or the auxiliary ground conductors 24-1, 24-2 may not be provided. In the high-frequency signal line 10d, either of the ground conductors 122-1, 122-2 or the ground conductors 124-1, 124-2 may not be provided.

Note that, in the manufacturing method of the high-frequency signal line 10, the signal line portions 10-1 to 10-3 are preferably formed in a matrix arrangement over the mother dielectric element assembly 112. However, the signal line portion 10-1, the signal line portion 10-2, and the signal line portion 10-3 may be separately formed in a matrix arrangement over different mother dielectric element assemblies 112.

Note that the dielectric element assemblies 12-1 to 12-3 preferably have a linear shape, although some or all of them may have a bent shape.

Note that the high-frequency signal lines 10, 10a to 10h may preferably be used as a high-frequency signal line in an RF circuit board, such as an antenna front end module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line comprising:
a first dielectric element assembly including a linear shape, a first end and a second end, and a plate-shaped configuration with a first principal surface and a second principal surface;
a linear first signal line provided in or on the first dielectric element assembly and extending along the first dielectric element assembly;
a first ground conductor provided in or on the first dielectric element assembly and extending along the first signal line;
a second dielectric element assembly including a linear shape, a third end and a fourth end, and a plate-shaped configuration with a third principal surface and a fourth principal surface;
a linear second signal line provided in or on the second dielectric element assembly and extending along the second dielectric element assembly; and
a second ground conductor provided in or on the second dielectric element assembly and extending along the second signal line; wherein
a portion of the second principal surface at the first end of the first dielectric element assembly and a portion of the third principal surface at the third end of the second dielectric element assembly are joined together such that a joint portion of the first dielectric element assembly and the second dielectric element assembly includes a corner;
the corner is a bent portion that is bent in a planar direction of the high-frequency signal line;
the first signal line and the second signal line are electrically coupled together;
the first ground conductor and the second ground conductor are electrically coupled together;
the first signal line is provided in the first dielectric element assembly;
the second signal line is provided in the second dielectric element assembly;
the high-frequency signal line includes:
a first connecting conductor provided on a portion of the second principal surface at the first end of the first dielectric element assembly and electrically coupled to the first signal line; and
a second connecting conductor provided on a portion of the third principal surface at the third end of the second dielectric element assembly and electrically coupled to the second signal line;
the first connecting conductor and the second connecting conductor are soldered together;
a portion of the first signal line at the first end of the first dielectric element assembly is located on one side of the first dielectric element assembly with respect to a width direction of the first dielectric element assembly; and
a portion of the first ground conductor at the first end of the first dielectric element assembly is located on the other side of the first dielectric element with respect to the first signal line in the width direction of the first dielectric element assembly and is not located on the one side of the first dielectric element assembly with respect to the first signal line in the width direction of the first dielectric element assembly.

2. The high-frequency signal line according to claim 1, further comprising:
a first dummy conductor provided on a portion of the second principal surface at the first end of the first dielectric element assembly; and a second dummy conductor provided on a portion of the third principal surface at the third end of the second dielectric element assembly; wherein
the first dummy conductor and the second dummy conductor are soldered together.

3. The high-frequency signal line according to claim 2, further comprising:
a third dummy conductor provided in the first dielectric element assembly; and
a fifth via-hole conductor connecting the first dummy conductor to the third dummy conductor.

4. The high-frequency signal line according to claim 2, further comprising:
a fourth dummy conductor provided in the second dielectric element assembly; and
a sixth via-hole conductor connecting the second dummy conductor to the fourth dummy conductor.

5. The high-frequency signal line according to claim 1, wherein the first ground conductor is provided on a first principal surface side relative to the first signal line;
the second ground conductor is provided on a third principal surface side relative to the second signal line;
the high-frequency signal line includes:
a third ground conductor provided on the second principal surface side relative to the first signal line in the first dielectric element assembly and extending along the first signal line; and
a fourth ground conductor provided on the fourth principal surface side relative to the second signal line in the second dielectric element assembly and extending along the second signal line; and
the first through fourth ground conductors are electrically coupled together.

6. The high-frequency signal line according to claim 1, wherein the first dielectric element assembly and/or the second dielectric element assembly has a linear shape.

7. The high-frequency signal line according to claim 1, wherein the first dielectric element assembly and the second dielectric element assembly have flexibility.

8. A method for manufacturing a high-frequency signal line, the method comprising the steps of:
forming a first signal line portion including a first dielectric element assembly including a linear shape, a first end and a second end, and a plate-shaped configuration with a first principal surface and a second principal surface, a linear first signal line provided in or on the first dielectric element assembly and extending along the first dielectric element assembly, and a first ground conductor provided in or on the first dielectric element assembly and extending along the first signal line;
forming a second signal line portion including a second dielectric element assembly including a linear shape, a third end and a fourth end, and having a plate-shaped configuration with a third principal surface and a fourth principal surface, a linear second signal line provided in or on the second dielectric element assembly and extending along the second dielectric element assembly, and a second ground conductor provided in or on the second dielectric element assembly and extending along the second signal line; and
joining together a portion of the second principal surface at the first end of the first dielectric element assembly and a portion of the third principal surface at the third end of the second dielectric element assembly such that the first signal line and the second signal line are electrically coupled together and the first ground conductor and the second ground conductor are electrically coupled together and such that a joint portion of the first signal line portion and the second signal line portion includes a corner; wherein
the corner is a bent portion that is bent in a planar direction of the high-frequency signal line;
a portion of the first signal line at the first end of the first dielectric element assembly is located on one side of the first dielectric element assembly with respect to a width direction of the first dielectric element assembly; and
a portion of the first ground conductor at the first end of the first dielectric element assembly is located on the other side of the first dielectric element with respect to the first signal line in the width direction of the first dielectric element assembly and is not located on the one side of the first dielectric element assembly with respect to the first signal line in the width direction of the first dielectric element assembly.

9. The method according to claim 8, wherein the step of forming the first signal line portion includes:
forming the first signal line on a third dielectric layer:
forming the first ground conductor on a fourth dielectric layer; and
laminating a plurality of first dielectric layers including the third dielectric layer and the fourth dielectric layer, thus forming the first dielectric element assembly; and
the step of forming the second signal line portion includes:
forming the second signal line on a fifth dielectric layer;
forming the second ground conductor on a sixth dielectric layer; and
laminating a plurality of second dielectric layers including the fifth dielectric layer and the sixth dielectric layer, thus forming the second dielectric element assembly.

10. The method according to claim 9, wherein
the first signal line portion further includes a first connecting conductor provided on a portion of the second principal surface at the first end of the first dielectric element assembly and electrically coupled to the first signal line;
the second signal line portion further includes a second connecting conductor provided on a portion of the third principal surface at the third end of the second dielectric element assembly and electrically coupled to the second signal line;
the step of forming the first signal line portion further includes forming the first connecting conductor on a seventh dielectric layer which forms the second principal surface;
the step of forming the first dielectric element assembly includes laminating the plurality of first dielectric layers including the third dielectric layer, the fourth dielectric layer, and the seventh dielectric layer;
the step of forming the second signal line portion further includes forming the second connecting conductor on an eighth dielectric layer which forms the third principal surface;
the step of forming the second dielectric element assembly includes laminating the plurality of second dielectric layers including the fifth dielectric layer, the sixth dielectric layer, and the eighth dielectric layer; and
the step of joining together the second principal surface and the third principal surface includes joining together the second principal surface and the third principal surface by soldering.

11. The method according to claim 8, wherein the step of joining together the second principal surface and the third principal surface includes:
- sticking a first wire conductor into the first dielectric element assembly and the second dielectric element assembly so as to penetrate through a conductor electrically coupled to the first signal line and a conductor electrically coupled to the second signal line; and
- sticking a second wire conductor into the first dielectric element assembly and the second dielectric element assembly so as to penetrate through a conductor electrically coupled to the first ground conductor and a conductor electrically coupled to the second ground conductor.

12. The method according to claim 11, wherein the step of joining together the second principal surface and the third principal surface includes sticking the first wire conductor and the second wire conductor into the first dielectric element assembly and the second dielectric element assembly so as not to penetrate through a second via-hole conductor provided in the first dielectric element assembly and the second dielectric element assembly.

13. The method according to claim 8, wherein the first dielectric element assembly and/or the second dielectric element assembly have a linear shape.

14. The method according to claim 8, wherein the first dielectric element assembly and the second dielectric element assembly have flexibility.

* * * * *